US012796541B2

(12) United States Patent
Kim

(10) Patent No.: US 12,796,541 B2
(45) Date of Patent: Nov. 10, 2026

(54) DISPLAY DEVICE AND MANUFACTURING METHOD THEREFOR

(71) Applicant: SAMSUNG DISPLAY CO., LTD., Yongin-si (KR)

(72) Inventor: Duk Sung Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 653 days.

(21) Appl. No.: 18/004,664

(22) PCT Filed: Jun. 17, 2021

(86) PCT No.: PCT/KR2021/007624
§ 371 (c)(1),
(2) Date: Jan. 6, 2023

(87) PCT Pub. No.: WO2022/010127
PCT Pub. Date: Jan. 13, 2022

(65) Prior Publication Data

US 2023/0268330 A1 Aug. 24, 2023

(30) Foreign Application Priority Data

Jul. 9, 2020 (KR) ........................ 10-2020-0084888

(51) Int. Cl.
*H10W 90/00* (2026.01)
*G09G 3/32* (2016.01)
(Continued)

(52) U.S. Cl.
CPC .............. *H10W 90/00* (2026.01); *G09G 3/32* (2013.01); *H10D 86/0212* (2025.01);
(Continued)

(58) Field of Classification Search
CPC .. H10D 86/60; H10D 86/423; H10D 30/6755; H10D 86/441; H10D 30/6757
See application file for complete search history.

(56) References Cited

U.S. PATENT DOCUMENTS 10,373,985 B2 * 8/2019 Kim ....................... H10D 86/60
10,504,450 B2 12/2019 Chen
(Continued)

FOREIGN PATENT DOCUMENTS

CN 103323975 A 9/2013
CN 106935608 A 7/2017
(Continued)

OTHER PUBLICATIONS

International Search Report of PCT/KR2021/007624, Sep. 24, 2021, 5 pages.
(Continued)

*Primary Examiner* — Tony Tran
(74) *Attorney, Agent, or Firm* — Womble Bond Dickinson (US) LLP

(57) ABSTRACT

A display device may include a substrate including a pixel area including a first area and a second area; and a pixel in the pixel area. The pixel may include: a pixel circuit part in the first area, the pixel circuit part including a bottom metal layer on the substrate, at least one transistor on the bottom metal layer, and an interlayer insulating layer provided on the transistor; and a display element part in the second area, the display element part including a plurality of light emitting elements to emit light, an insulating pattern on the plurality of light emitting elements, and a bank adjacent to the plurality of light emitting elements. The interlayer insulating layer and the insulating pattern may include the same material.

14 Claims, 36 Drawing Sheets

(51) Int. Cl.

| | |
|---|---|
| ***H10D 86/01*** | (2025.01) |
| ***H10D 86/40*** | (2025.01) |
| ***H10D 86/60*** | (2025.01) |
| ***H10H 20/857*** | (2025.01) |
| *H10H 20/01* | (2025.01) |

(52) U.S. Cl.
CPC ........... *H10D 86/411* (2025.01); *H10D 86/60* (2025.01); *H10H 20/857* (2025.01); *G09G 2300/0426* (2013.01); *G09G 2300/0439* (2013.01); *H10H 20/0364* (2025.01)

(56) References Cited

U.S. PATENT DOCUMENTS

| | | | |
|---|---|---|---|
| 10,672,830 B2 | 6/2020 | Fu et al. | |
| 11,037,914 B2 | 6/2021 | Kim | |
| 11,251,223 B2 | 2/2022 | Long | |
| 11,984,434 B2 * | 5/2024 | Kim | H01L 25/167 |
| 2014/0291666 A1 | 10/2014 | Tsang | |
| 2021/0280753 A1 | 9/2021 | Kim et al. | |
| 2021/0343784 A1 | 11/2021 | Kwag et al. | |
| 2022/0059739 A1 | 2/2022 | Li et al. | |
| 2022/0115470 A1 | 4/2022 | Kim et al. | |

FOREIGN PATENT DOCUMENTS

| | | | |
|---|---|---|---|
| CN | 108987426 | A | 12/2018 |
| CN | 110277421 | A | 9/2019 |
| KR | 10-2017-0078394 | A | 7/2017 |
| KR | 10-2019-0065735 | A | 6/2019 |
| KR | 10-2020-0005692 | A | 1/2020 |
| KR | 10-2020-0005711 | A | 1/2020 |
| KR | 10-2020-0034896 | A | 4/2020 |
| KR | 10-2020-0042057 | A | 4/2020 |
| KR | 10-2020-0042997 | A | 4/2020 |
| KR | 10-2020-0077671 | A | 7/2020 |

OTHER PUBLICATIONS

Written Opinion of PCT/KR2021/007624, Sep. 24, 2021, 7 pages.
Chinese Office Action for Patent Application No. 202180049792.X, dated Mar. 14, 2026, 7 pages.

* cited by examiner

DISPLAY DEVICE AND MANUFACTURING METHOD THEREFOR

CROSS-REFERENCE TO RELATED APPLICATIONS

This application is a U.S. National Phase Patent Application of International Patent Application Number PCT/KR2021/007624, filed on Jun. 17, 2021, which claims priority to Korean Patent Application Number 10-2020-0084888, filed on Jul. 9, 2020, the entire contents of all of which are incorporated by reference herein.

BACKGROUND

1. Field

The present disclosure relates to a display device and a manufacturing method thereof.

2. Description of Related Art

As an interest in an information display largely increases and a demand for using a portable information medium increases, a demand and commercialization for a display device has been progressed in priority.

SUMMARY

The present disclosure has been made in an effort to provide a display device that is formed by a simple manufacturing process by reducing the number of masks while improving light output efficiency by reducing or minimizing misalignment of light emitting elements, and a manufacturing method thereof.

A display device according to one or more embodiments of the present disclosure may include a substrate including a pixel area including a first area and a second area; and a pixel in the pixel area. The pixel may include: a pixel circuit part in the first area, the pixel circuit part including a bottom metal layer on the substrate, at least one transistor on the bottom metal layer, and an interlayer insulating layer on the transistor; and a display element part in the second area, and the display element part including a plurality of light emitting elements emitting light, an insulating pattern on the plurality of light emitting elements, and a bank adjacent to the plurality of light emitting elements.

In one or more embodiments of the present disclosure, the interlayer insulating layer and the insulating pattern may include a same material.

In one or more embodiments of the present disclosure, each of the pixel circuit part and the display element part includes a multilayer structure including at least one conductive layer and at least one insulating layer. At least one layer of the pixel circuit part and at least one layer of the display element part may be at a same layer, and may include a same material.

In one or more embodiments of the present disclosure, the insulating layer in the pixel circuit part may include a buffer layer, a gate insulating layer, the interlayer insulating layer, and a first insulating layer that are sequentially arranged on the substrate. In addition, the insulating layer in the display element part may include the buffer layer provided on the substrate, the insulating pattern on the buffer layer, and the first insulating layer on the insulating pattern.

In one or more embodiments of the present disclosure, the conductive layer in the pixel circuit part may include the bottom metal layer between the substrate and the buffer layer, a first conductive layer between the gate insulating layer and the interlayer insulating layer, and a second conductive layer between the interlayer insulating layer and the first insulating layer. The conductive layer in the display element part may include a first electrode and a second electrode that are between the substrate and the buffer layer and are spaced from each other, and a first contact electrode and a second contact electrode spaced from each other on the insulating pattern.

In one or more embodiments of the present disclosure, the light emitting elements may be positioned on the buffer layer between the first electrode and the second electrode. The bottom metal layer and the first and second electrodes may be provided at a same layer, and may include a same material.

In one or more embodiments of the present disclosure, the second area may include an emission area from which the light is emitted. The bank may not overlap the emission area, the bang being between the buffer layer and the first insulating layer. When viewed in a plan view, the bank may be around the plurality of light emitting elements.

In one or more embodiments of the present disclosure, the buffer layer of the display element part may expose a portion of each of the first and second electrodes.

In one or more embodiments of the present disclosure, the first contact electrode may be on the buffer layer and connected to the first electrode and each of the plurality of light emitting elements. In addition, the second contact electrode may be on the buffer layer and connected to the second electrode and each of the plurality of light emitting elements. Here, the first insulating layer may be on the first and second contact electrodes to cover the first and second contact electrodes.

In one or more embodiments of the present disclosure, the substrate may include a display area in which the pixel area is located and a non-display area at least one side of the display area. The non-display area may include the buffer layer, the gate insulating layer, the interlayer insulating layer, a wire part on the interlayer insulating layer, and a pad part connected to the wire part. The pad part may include: a first pad electrode on the interlayer insulating layer; and a second pad electrode on the first pad electrode and in contact with the first pad electrode.

In one or more embodiments of the present disclosure, the second pad electrode may include a same material as the first and second contact electrodes.

In one or more embodiments of the present disclosure, the display device may further include a light blocking layer on the first insulating layer in each of the first and second areas. The light blocking layer may include a black matrix, and may not be located in the emission area of the second area.

In one or more embodiments of the present disclosure, the display device may further include: a second insulating layer on the first insulating layer on the first and second contact electrodes and on the light blocking layer; and a light converting pattern layer in the emission area of the second area and on the second insulating layer.

In one or more embodiments of the present disclosure, the display device may further include a planarization layer on the light converting pattern layer.

In one or more embodiments of the present disclosure, the transistor may include: an active pattern on the buffer layer on the bottom metal layer; a gate electrode on the gate insulating layer on the active pattern and overlapping the active pattern; and a first terminal and a second terminal contacting respective ends of the active pattern. Here, the first conductive layer may include the gate electrode.

In one or more embodiments of the present disclosure, a display device may be manufactured by forming a pixel that includes a pixel area including a first area and a second area on a substrate.

In one or more embodiments of the present disclosure, the forming of the pixel may include: forming a first conductive layer on the substrate in the first and second areas; forming a buffer layer on the first conductive layer, forming a semiconductor layer on the buffer layer of the first area; forming a gate insulating layer on the buffer layer in the first area including the semiconductor layer, forming a second conductive layer on the gate insulating layer; forming a bank on the buffer layer in the second area; aligning light emitting elements on the buffer layer in a section of the second area that does not overlap the bank; forming an interlayer insulating layer on the gate insulating layer in the first area, and forming an insulating pattern on one surface of each of the light emitting elements; forming a third conductive layer on the interlayer insulating layer; and forming a fourth conductive layer on the insulating pattern.

According to one or more embodiments of the present disclosure, a slim display device having a reduced thickness by disposing a pixel circuit part and a display element part on one surface of the same substrate and a manufacturing method therefor may be provided.

In addition, according to one or more embodiments of the present disclosure, by forming components included in a pixel circuit part and components included in a display element part in the same process, a manufacturing process of a display device may be simplified.

Effects, aspects, and features of embodiments of the present disclosure are not limited by what is illustrated in the above, and more various effects, aspects, and features are included in the present disclosure.

MODE FOR INVENTION

Figure 1:
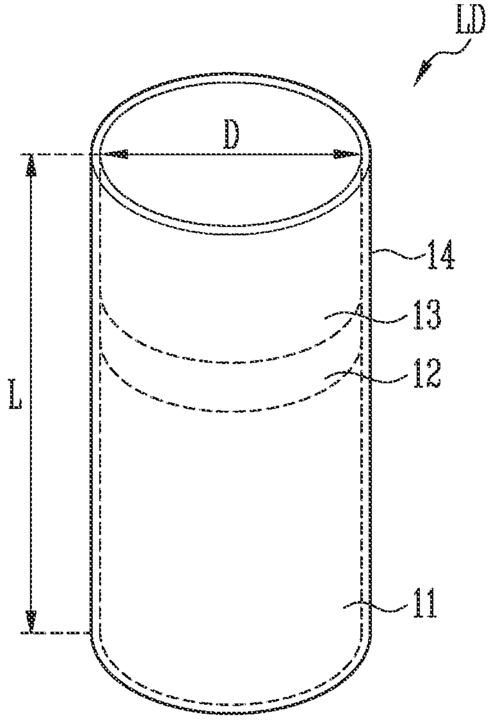
FIG. 1 illustrates a schematic perspective view of a light emitting element according to one or more embodiments of the present disclosure.

Because the present disclosure may be variously modified and have various forms, embodiments will be illustrated and described in detail in the following. This, however, by no means restricts the present disclosure specific embodiments, and it is to be understood as embracing all included in the spirit and scope of the present disclosure changes, equivalents, and substitutes.

Like reference numerals are used for like constituent elements in describing each drawing. In the accompanying drawings, the dimensions of the structure are exaggerated and shown for clarity of the present disclosure. Terms such as first, second, and the like will be used only to describe various constituent elements, and are not to be interpreted as limiting these constituent elements. The terms are only used to differentiate one constituent element from other constituent elements. For example, a first constituent element could be termed a second constituent element, and similarly, a second constituent element could be termed as a first constituent element, without departing from the scope of the present invention. Singular forms are intended to include plural forms unless the context clearly indicates otherwise.

In the present application, it should be understood that the term “include”, “comprise”, “have”, or “configure” indicates that a feature, a number, a step, an operation, a constituent element, a part, or a combination thereof described in the specification is present, but does not exclude a possibility of presence or addition of one or more other features, numbers, steps, operations, constituent elements, parts, or combinations thereof, in advance. It will be understood that when an element such as a layer, film, region, area, or substrate is referred to as being “on” another element, it can be directly on the other element or intervening elements may also be present. In addition, in the present specification, when an element of a layer, film, region, area, plate, or the like is referred to as being “on” another element, the direction is not limited to an upper direction but includes a lateral or lower direction. In contrast, when an element of a layer, film, region, area, plate, or the like is referred to as being “below” another element, it may be directly below the other element, or intervening elements may be present.

It is to be understood that, in the present application, when it is described for one constituent element (for example, a first constituent element) to be (functionally or communicatively) “coupled or connected with/to” another constituent element (for example, a second constituent element), the one constituent element may be directly coupled or connected with/to the another constituent element, or may be coupled or connected with/to through the other constituent element (for example, a third constituent element). In contrast, it is to be understood that when it is described for one constituent element (for example, a first constituent element) to be “directly coupled or connected with/to” another constituent element (for example, a second constituent element), there is no other constituent element (for example, a third constituent element) between the one constituent element and the another constituent element.

Hereinafter, with reference to accompanying drawings, embodiments of the present disclosure and others that can assist those skilled in the art to understand the contents of the present disclosure will be described in more detail. In the description below, singular forms are to include plural forms unless the context clearly indicates only the singular.

Figure 2:
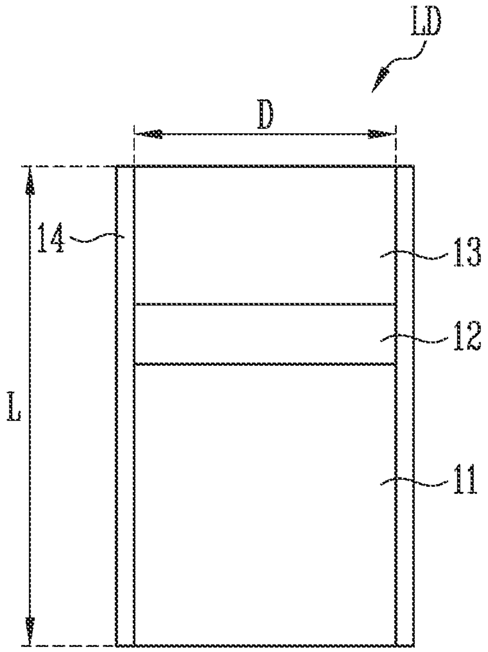
FIG. 2 illustrates a cross-sectional view of the light emitting element of FIG. 1.
Figure 3:
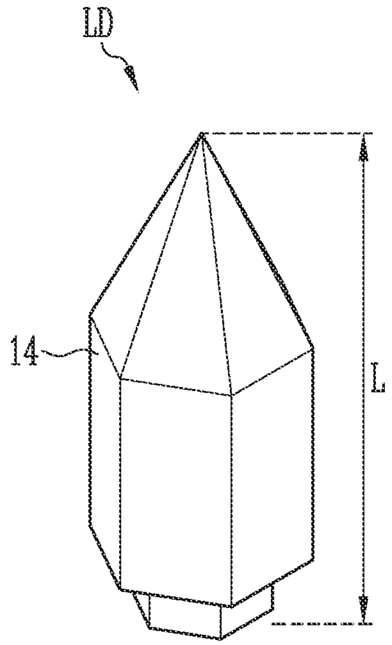
FIG. 3 illustrates a schematic perspective view of a light emitting element according to one or more embodiments of the present disclosure.
Figure 4:
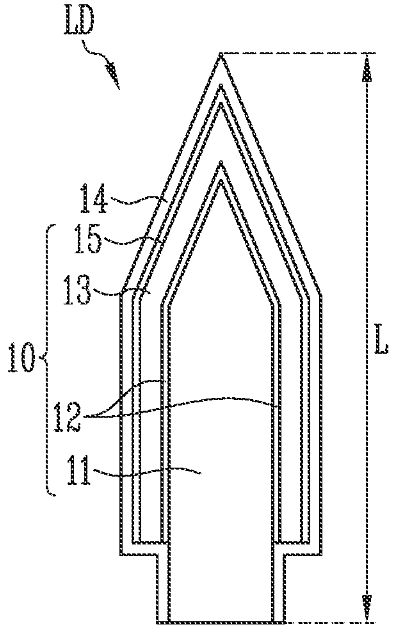
FIG. 4 illustrates a cross-sectional view of the light emitting element of FIG. 3.

FIG. 1 illustrates a schematic perspective view of a light emitting element according to one or more embodiments of the present disclosure, FIG. 2 illustrates a cross-sectional view of the light emitting element of FIG. 1, FIG. 3 illustrates a schematic perspective view of a light emitting element according to one or more embodiments of the present disclosure, and FIG. 4 illustrates a cross-sectional view of the light emitting element of FIG. 3.

In one or more embodiments of the present disclosure, a type and/or shape of the light emitting element is not limited to embodiments shown in FIG. 1 to FIG. 4.

Referring to FIG. 1 to FIG. 4, a light emitting element LD may include a first semiconductor layer 11, a second semiconductor layer 13, and an active layer 12 interposed between the first and second semiconductor layers 11 and 13. For example, the light emitting element LD may be implemented as a stacked light emitting body in which the first semiconductor layer 11, the active layer 12, and the second semiconductor layer 13 are sequentially stacked.

The light emitting element LD may be provided to have a shape extending in one direction. When the extending direction of the light emitting element LD is a length direction, the light emitting element LD may include one end portion (or lower end portion) and the other end portion (or upper end portion) along the extending direction. One of the first and second semiconductor layers 11 and 13 may be disposed at one end portion (or lower end portion) of the light emitting element LD, and the remaining one of the first and second semiconductor layers 11 and 13 may be disposed at the other end portion (or upper end portion) of the light emitting element LD. For example, the first semiconductor layer 11 may be disposed at one end portion (or lower end portion) of the light emitting element LD, and the second semiconductor layer 13 may be disposed at the other end portion (or upper end portion) of the light emitting element LD.

The light emitting element LD may be provided in various shapes. For example, the light emitting element LD may have a rod-like shape or a bar-like shape that is long in the length direction (that is, an aspect ratio is greater than 1). In one or more embodiments of the present disclosure, a length L of the light emitting element LD in the length direction may be larger than a diameter D thereof (or a width of a cross-section thereof). For example, the light emitting element LD may include a light emitting diode (LED) manufactured in an ultra-small size having the diameter D and/or the length L of nano scale to micro scale.

The diameter D of the light emitting element LD may be about 0.5 μm to 500 μm, and the length L thereof may be about 1 μm to 1000 μm. However, the diameter D and the length L of the light emitting element LD are not limited thereto, and the size of the light emitting element LD may be changed so that the light emitting element LD meets requirements (or design conditions) of a lighting device or a self-luminous display device to which the light emitting element LD is applied.

For example, the first semiconductor layer 11 may include at least one n-type semiconductor layer. For example, the first semiconductor layer 11 may include a semiconductor material of one of InAlGaN, GaN, AlGaN, InGaN, AlN, or InN, and or may be a n-type semiconductor layer doped with a first conductive dopant (or n-type dopant) such as Si, Ge, Sn, or the like. However, the material included in the first semiconductor layer 11 is not limited thereto, and the first semiconductor layer 11 may be made of various materials. The first semiconductor layer 11 may include a gallium nitride (GaN) semiconductor material doped with the first conductive dopant (or n-type dopant). The first semiconductor layer 11 may include an upper surface contacting the active layer 12 along the direction of the length L of the light emitting element LD and a lower surface exposed to the outside. The lower surface of the first semiconductor layer 11 may be one end portion (or a lower end portion) of the light emitting element LD.

The active layer 12 is disposed on the first semiconductor layer 11, and may be formed to have a single or multi-quantum well structure. For example, when the active layer 12 is formed of a multi-quantum well structure, the active layer 12 may have a structure in which a barrier layer, a strain reinforcing layer, and a well layer, which consist of one unit, are periodically and repeatedly stacked. Because the strain reinforcing layer has a smaller lattice constant than that of the barrier layer, it may further reinforce strain applied to the well layer, for example, compressive strain. However, the structure of the active layer 12 is not limited to the above-described embodiment.

The active layer 12 may emit light having a wavelength of 400 nm to 900 nm, and may have a double hetero-structure. In one or more embodiments of the present disclosure, a cladding layer doped with a conductive dopant may be formed on upper and/or lower portions of the active layer 12 along the direction of the length L of the light emitting element LD. For example, the clad layer may be formed of an AlGaN layer or an InAlGaN layer. In one or more embodiments, a material such as AlGaN and InAlGaN may be used to form the active layer 12, and in addition, various materials may form the active layer 12. The active layer 12 may include the first surface contacting the first semiconductor layer 11 and the second surface contacting the second semiconductor layer 13.

When an electric field of a suitable voltage or more (e.g., a predetermined voltage) or more is applied to respective end portions of the light emitting element LD, the light emitting element LD emits light while electron-hole pairs are combined in the active layer 12. By controlling the light emission of the light emitting element LD by using this principle, the light emitting element LD may be used as a light source (or light emitting source) for various light emitting devices in addition to pixels of a display device.

The second semiconductor layer 13 is disposed on the second surface of the active layer 12, and may include a semiconductor layer of a type different from that of the first semiconductor layer 11. For example, the second semiconductor layer 13 may include at least one p-type semiconductor layer. For example, the second semiconductor layer 13 may include at least one semiconductor material of InAlGaN, GaN, AlGaN, InGaN, AlN, or InN, and may include a p-type semiconductor layer doped with a second conductive dopant (or p-type dopant) such as Mg. However, the material included in the second semiconductor layer 13 is not limited thereto, and the second semiconductor layer 13 may be formed of various materials. In one or more embodiments of the present disclosure, the second semiconductor layer 13 may include a gallium nitride (GaN) semiconductor material doped with the second conductive dopant (or p-type dopant). The second semiconductor layer 13 may include a lower surface contacting the second surface of the active layer 12 along the length L direction of the light emitting element LD and an upper surface exposed to the outside. Here, the upper surface of the second semiconductor layer 13 may be the other end portion (or upper end portion) of the light emitting element LD.

In one or more embodiments of the present disclosure, the first semiconductor layer 11 and the second semiconductor layer 13 may have different thicknesses from each other in the length L direction of the light emitting element LD. For example, the first semiconductor layer 11 may be relatively thicker than that of the second semiconductor layer 13 along the length L direction of the light emitting element LD. Accordingly, the active layer 12 of the light emitting element LD may be disposed to be closer to the upper surface of the second semiconductor layer 13 than the lower surface of the first semiconductor layer 11.

In one or more embodiments, it is illustrated that each of the first semiconductor layer 11 and the second semiconductor layer 13 are formed as one layer, but the present disclosure is not limited thereto. In one or more embodiments of the present disclosure, each of the first semiconductor layer 11 and the second semiconductor layer 13 may further include at least one or more layers, for example, a cladding layer and/or a tensile strain barrier reducing (TSBR) layer according to the material of the active layer 12. The TSBR layer may be a strain reducing layer disposed between semiconductor layers having different lattice structures and serving as a buffer to reduce a difference in lattice constant. The TSBR layer may be formed of a p-type semiconductor layer such as p-GaInP, p-AlInP, or p-AlGaInP, but the present disclosure is not limited thereto.

In one or more embodiments, the light emitting element LD may further include an additional electrode (hereinafter referred to as a "first additional electrode") disposed on the second semiconductor layer 13 in addition to the first semiconductor layer 11, the active layer 12, and the second semiconductor layer 13 described above. In addition, in one or more embodiments, another additional electrode (hereinafter referred to as a "second additional electrode") disposed on one end of the first semiconductor layer 11 may be further included.

Each of the first and second additional electrodes may be an ohmic contact electrode, but the present disclosure is not limited thereto. In one or more embodiments, the first and second additional electrodes may be a Schottky contact electrode. The first and second additional electrodes may include a conductive material (or a conductive substance). For example, the first and second additional electrodes may include an opaque metal in which at least one selected from among chromium (Cr), titanium (Ti), aluminum (Al), gold (Au), nickel (Ni), and an oxide or alloy thereof are used alone or in combination, but the present disclosure is not limited thereto. In one or more embodiments, the first and second additional electrodes may include a transparent conductive oxide such as an indium tin oxide (ITO), an indium zinc oxide (IZO), a zinc oxide (ZnO), an indium gallium zinc oxide (IGZO), and/or an indium tin zinc oxide (ITZO).

Materials included in the first and second additional electrodes may be the same or different from each other. The first and second additional electrodes may be substantially transparent or translucent. Accordingly, light generated by the light emitting element LD may transmit through each of the first and the second additional electrodes to be outputted to the outside of the light emitting element LD. In one or more embodiments, when the light generated by the light emitting element LD does not transmit through the first and the second additional electrodes and is discharged to the outside through an area except for respective end portions of the light emitting element LD, the first and the second additional electrodes may include an opaque metal.

In one or more embodiments of the present disclosure, the light emitting element LD may further include an insulating film 14. However, in one or more embodiments, the insulating film 14 may be omitted, or it may be provided so as to cover only some of the first semiconductor layer 11, the active layer 12, and the second semiconductor layer 13.

The insulating film 14 may prevent an electrical short circuit that may occur when the active layer 12 contacts conductive materials other than the first and second semiconductor layers 11 and 13. In addition, the insulating film 14 may reduce or minimize surface defects of the light emitting element LD to improve lifespan and luminous efficiency of the light emitting element LD. In addition, when a plurality of light emitting elements LD are closely disposed, the insulating film 14 may prevent unwanted short circuits that may occur between the light emitting elements LD. As long as the active layer 12 may prevent a short circuit with an external conductive material from being caused, whether or not the insulating film 14 is provided is not limited.

The insulating film 14 may be provided in a form that is around (e.g., partially, or entirely surrounds) an outer surface (e.g., an outer peripheral or circumferential surface) of a light emitting stacked structure including the first semiconductor layer 11, the active layer 12, and the second semiconductor layer 13.

In the above-described embodiment, the structure in which the insulating film 14 entirely surrounds the outer surface (e.g., the outer peripheral or circumferential surface) of each of the first semiconductor layer 11, the active layer 12, and the second semiconductor layer 13 is described, but the present disclosure is not limited thereto. In one or more embodiments, when the light emitting element LD includes a first additional electrode, the insulating film 14 may entirely surround the outer circumferential surface of each of the first semiconductor layer 11, the active layer 12, the second semiconductor layer 13, and the first additional electrode. In addition, according to another embodiment, the insulating film 14 may not entirely surround the outer surface (e.g., the outer peripheral or circumferential surface) of the first additional electrode, or may only surround a portion of the outer surface (e.g., the outer peripheral or circumferential surface) of the first additional electrode and may not surround the remaining portion of the external outer surface (e.g., the external outer peripheral or circumferential surface) of the first additional electrode. In addition, in one or more embodiments, when the first additional electrode is disposed at the other end portion (or an upper end portion) of the light emitting element LD and a second additional electrode is disposed at one end portion (or a lower end portion) of the light emitting element LD, the insulating film 14 may expose at least one area of each of the first and second additional electrodes.

The insulating film 14 may include a transparent insulating material. For example, the insulating film 14 may include one or more insulating material selected from among a silicon oxide ($SiO_x$), a silicon nitride ($SiN_x$), a silicon oxynitride ($SiO_xN_y$), an aluminum oxide ($AlO_x$), and a titanium oxide ($TiO_2$), but the present disclosure is not limited thereto, and various materials having insulating properties may be used as the material of the insulating film 14.

In one or more embodiments, the light emitting element LD may include a light emitting pattern 10 having a core-shell structure as shown in FIG. 3 and FIG. 4. In this case, the first semiconductor layer 11 may be positioned at a core, that is, a middle (or center) of the light emitting element LD, and the active layer 12 may be around (e.g., may surround) the outer surface (e.g., the outer peripheral or circumferential surface) of the first semiconductor layer 11 in the length L direction of the light emitting element LD, and the second semiconductor layer 13 may be provided and/or formed to be around (e.g., to surround) the active layer 12 in the length L direction of the light emitting element LD. In addition, the light emitting element LD may further include an additional electrode around (e.g., surrounding) at least one side of the second semiconductor layer 13. In addition, in one or more embodiments, the light emitting element LD may further include the insulating film 14 provided on the outer surface (e.g., the outer peripheral or circumferential surface) of the light emitting pattern 10 having a core-shell structure and including a transparent insulating material. The light emitting element LD including the light emitting pattern 10 having the core-shell structure may be manufactured by a growth method.

The light emitting element LD described above may be used as a light emitting source of various display devices. The light emitting element LD may be manufactured through a surface treatment process. For example, when the plurality of light emitting elements LD are mixed with a fluid solution (or a solvent) and supplied to each pixel area (for example, an emission area of each pixel or an emission area of each sub pixel), each light emitting element LD may be surface-treated so that the light emitting elements LD may be not non-uniformly aggregated in the solution and may be uniformly sprayed.

An emission unit (or emission device) including the above-described light emitting element LD may be used in various types of electronic devices that require a light source in addition to the display device. For example, when a plurality of light emitting elements LD are disposed in a pixel area of each pixel of a display panel, the light emitting elements LD may be used as a light source of each pixel. However, an application field of the light emitting element LD is not limited to the above-described example. For example, the light emitting element LD may be used in other types of electronic devices that require a light source, such as a lighting device.

Figure 5:
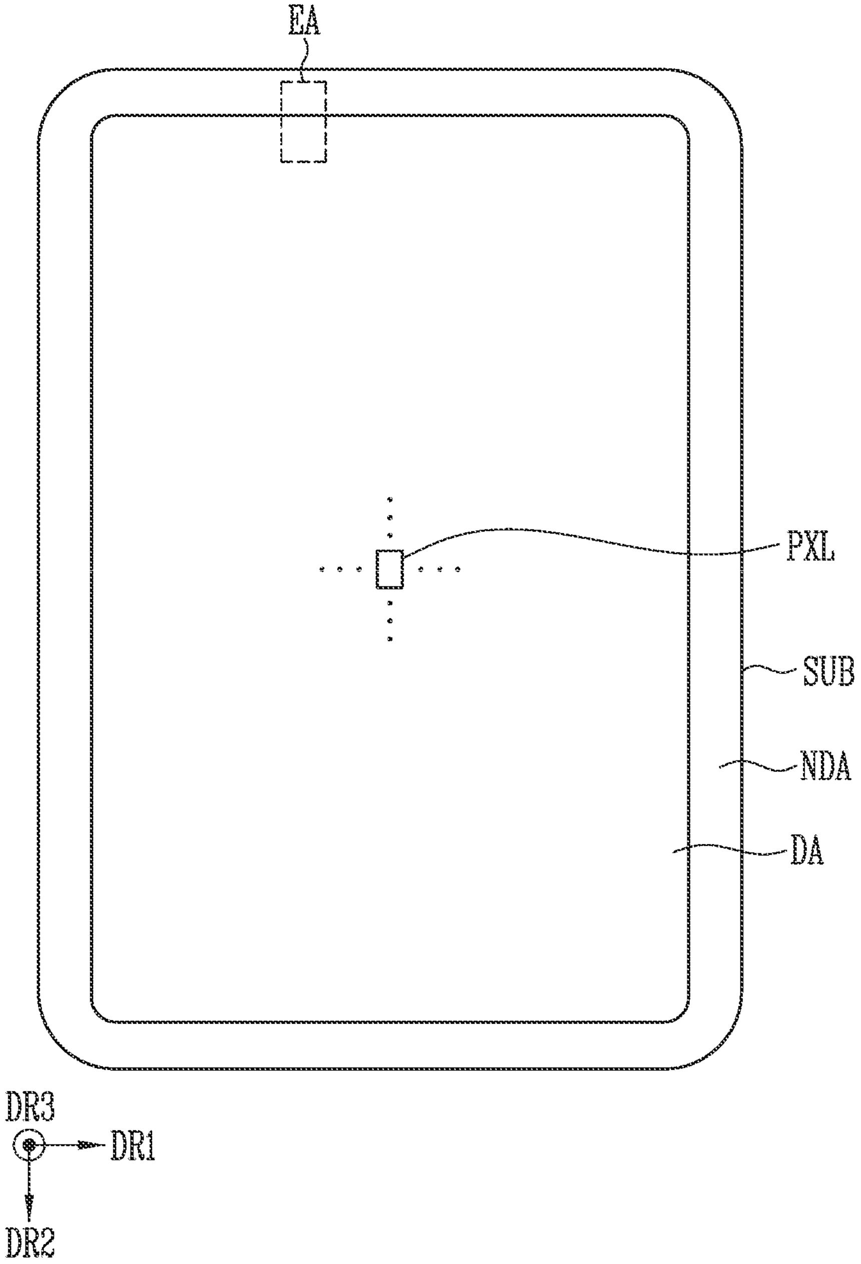
FIG. 5 illustrates a display device according to one or more embodiments of the present disclosure, particularly, a schematic top plan view of a display device using one of the light emitting elements shown in FIG. 1 to FIG. 4 as a light source.

FIG. 5 illustrates a display device according to one or more embodiments of the present disclosure, particularly, a schematic top plan view of a display device using one of the light emitting elements shown in FIG. 1 to FIG. 4 as a light source.

In FIG. 5, for convenience, a structure of the display device is briefly illustrated based on a display area DA on which an image is displayed.

Referring to FIG. 1 to FIG. 5, the display device according to one or more embodiments of the present disclosure may include a substrate SUB, a plurality of pixels PXL provided on the substrate SUB and respectively including at least one light emitting element LD, a driver provided on the substrate SUB and configured to drive the pixels PXL, and a wire part connecting the pixels PXL and the driver.

When the display device is one in which a display surface is applied to at least one surface thereof such as a smart phone, a television, a tablet PC, a mobile phone, an image phone, an electron book reader, a desktop PC, a laptop PC, a netbook computer, a workstation, a server, a PDA, a portable multimedia player (PMP), an MP3 player, a medical device, a camera, or a wearable device, the present disclosure may be applied thereto.

The display device may be classified into a passive matrix type display device and an active matrix type display device according to a method of driving the light emitting element LD. For example, when the display device is implemented as the active matrix type display device, each of the pixels PXL may include a driving transistor for controlling an amount of current supplied to the light emitting element LD, a switching transistor for transmitting a data signal to the driving transistor, and the like.

The display device may be provided in various shapes, and as an example, may be provided in a rectangular plate shape having two pairs of sides parallel to each other, but the present disclosure is not limited thereto. When the display device is provided in the rectangular plate shape, one of the two pairs of sides may be provided to be longer than the other a pair of sides. For convenience, it is illustrated that the display device has a rectangular shape with a pair of long sides and a pair of short sides, and an extension direction of the long side is indicated as a second direction DR2, and an extension direction of the short side is indicated as a first direction DR1. The display device provided in the rectangular plate shape may have a round shape at a corner where one long side and one short side contact (or meet).

The substrate SUB may include the display area DA and a non-display area NDA around an edge or periphery of the display area DA.

The display area DA may be an area in which the pixels PXL for displaying an image are provided. The non-display area NDA may be an area in which the driver for driving the pixels PXL and a portion of the wire part for connecting the driver and the pixels PXL are provided. For better understanding and ease of description, only one pixel PXL is shown in FIG. 5, but a plurality of pixels PXL may be substantially provided in the display area DA of the substrate SUB.

The non-display area NDA may be provided in at least one side of the display area DA. The non-display area NDA may be around (e.g., may surround) a periphery of circumference (e.g., an edge) of the display area DA. The non-display area NDA may be provided with a wire part connected to the pixels PXL and a driver for driving the pixels PXL.

The wire part may electrically connect the driver and the pixels PXL. The wire part provides a signal to each pixel PXL, and it may be signal lines connected to each pixel PXL, for example, a fan-out line connected to a scan line, a data line, an emission control line, and the like. In addition, the wire part may be a fan-out line connected to signal lines connected to each pixel PXL, for example, connected to a control line, a sensing line, and the like, in order to compensate for changes in electrical characteristics of each pixel PXL in real time.

The substrate SUB may include a transparent insulating material to transmit light. The substrate SUB may be a rigid substrate or a flexible substrate.

One area of the substrate SUB is provided as the display area DA in which pixels PXL are disposed, and the remaining area of the substrate SUB may be provided as a non-display area NDA. For example, the substrate SUB may include the display area DA including pixel areas in which respective pixels PXL are disposed, and the non-display area NDA disposed around the display area DA (or adjacent to the display area DA).

Each of the pixels PXL may be provided in the display area DA of the substrate SUB. In one or more embodiments of the present disclosure, the pixels PXL may be arranged in the display area DA in a stripe or a PENTILE™ structure, or the like. The PENTILE® pixel arrangement structure may be referred to as an RGBG matrix structure (e.g., a a PENTILE® matrix structure or an RGBG structure (e.g., a PENTILE® structure)). PENTILE® is a registered trademark of Samsung Display Co., Ltd., Republic of Korea.

However, the arrangement structure of the pixels PXL is not limited thereto, and the pixels PXL may be arranged in the display area DA by using various structures and/or methods.

Each pixel PXL may include at least one or more light emitting element LD driven by corresponding scan and data signals. The light emitting element LD has a size as small as nano-scale to micro-scale, and may be mutually connected to adjacent light emitting elements in parallel, but the present disclosure is not limited thereto. The light emitting element LD may form a light source of each pixel PXL.

Each pixel PXL includes at least one light source, for example, the light emitting element LD shown in FIG. 1 to FIG. 4 driven by a suitable signal (e.g., a set or predetermined signal, for example, a scan signal and a data signal) and/or a suitable power source (e.g., a predetermined power source, for example, a first driving power source and a second driving power source). However, in one or more embodiments of the present disclosure, the type of the light emitting element LD that may be used as the light source of each pixel PXL is not limited thereto.

The driver may provide a suitable signal (e.g., a predetermined signal) and a suitable power source (e.g., a predetermined power source) to each pixel PXL through the wire part, thereby controlling driving of the pixel PXL. The driver may include a scan driver, a light emission driver, a data driver, and a timing controller and the like.

Figure 6A:
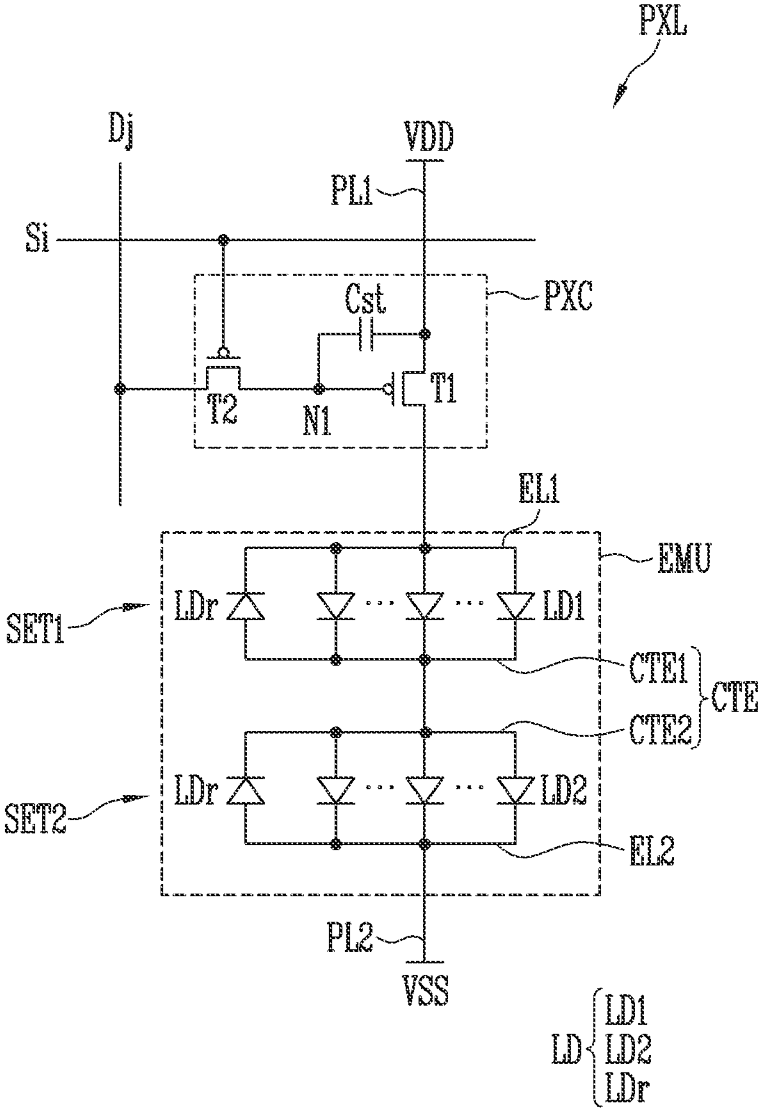
FIG. 6A to FIG. 6C illustrate circuit diagrams of electrical connection relationships of constituent elements included in one pixel illustrated in FIG. 5 according to one or more embodiments.
Figure 6B:
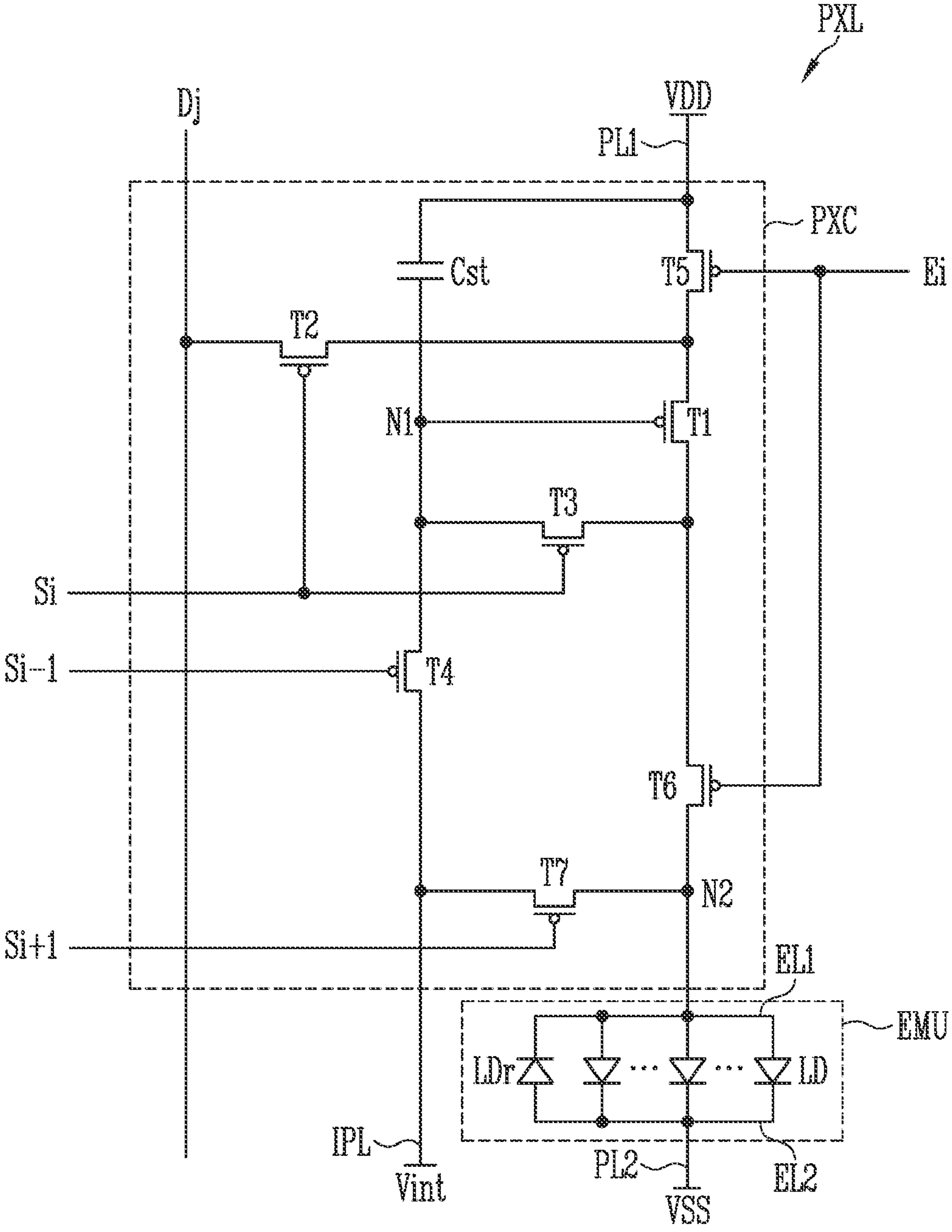
Figure 6C:
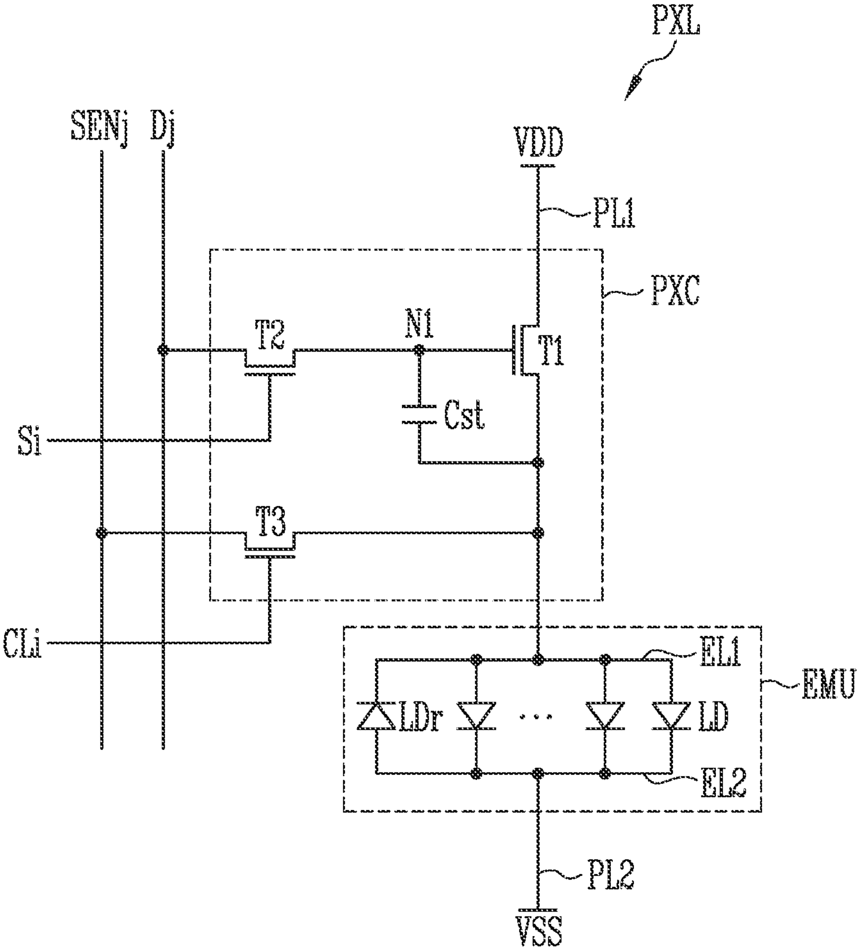

FIG. 6A to FIG. 6C illustrate circuit diagrams of electrical connection relationships of constituent elements included in one pixel illustrated in FIG. 5 according to one or more embodiments.

For example, FIG. 6A to FIG. 6C illustrate an electrical connection relationship between constituent elements included in the pixel PXL applicable to an active display device according to one or more embodiments. However, the types of constituent elements included in the pixel PXL to which one or more embodiments of the present disclosure may be applied are not limited thereto.

In FIG. 6A to FIG. 6C, not only the constituent elements included in each of the pixels PXL illustrated in FIG. 5 but also the area in which the constituent elements are provided (or positioned) are comprehensively referred to as the pixel PXL.

Referring to FIG. 1 to FIG. 6C, one pixel PXL (hereinafter referred to as a "pixel") may include an emission unit EMU that generates light having luminance corresponding to a data signal. In addition, the pixel PXL may further selectively include a pixel circuit PXC for driving the emission unit EMU.

The emission unit EMU may include a plurality of light emitting elements LD connected in parallel between a first power line PL1 to which a voltage of a first driving power source VDD is applied and a second power line PL2 to which a voltage of a second driving power source VSS is applied. For example, the emission unit EMU may include a first electrode EL1 (also referred to as a "first alignment electrode") connected to the first driving power source VDD via the pixel circuit PXC and the first power line PL1, a second electrode EL2 (also referred to as a "second alignment electrode") connected to the second driving power source VSS through the second power line PL2, and a plurality of light emitting elements LD connected in parallel in the same direction between the first and second electrodes EL1 and EL2. In one or more embodiments of the present disclosure, the first electrode EL1 may be an anode electrode, and the second electrode EL2 may be a cathode electrode.

Each of the light emitting elements LD included in the emission unit EMU may include one end portion connected to the first driving power source VDD through the first electrode EL1 and the other end portion connected to the second driving power source VSS through the second electrode EL2. The first driving power source VDD and the second driving power source VSS may have different potentials. For example, the first driving power source VDD may be set as a high potential power source, and the second driving power source VSS may be set as a low potential power source.

Each of the light emitting elements LD connected in parallel in the same direction between the first electrode EL1 and the second electrode EL2 to which voltages of different potentials are respectively supplied may configure an effective light source. The effective light sources may be collected to configure the emission unit EMU of each pixel PXL.

The light emitting elements LD of the emission unit EMU may emit light with luminance corresponding to a driving current supplied through the corresponding pixel circuit PXC. For example, during each frame period, the pixel circuit PXC may supply a driving current corresponding to a grayscale value of corresponding frame data to the emission unit EMU. The driving current supplied to the emission unit EMU may be divided to flow in the light emitting elements LD. Therefore, while each light emitting element LD emits light with a luminance corresponding to the current flowing therein, the emission unit EMU may emit light having a luminance corresponding to the driving current.

The emission unit EMU may further include at least one ineffective light source, for example, a reverse light emitting element LDr, in addition to the light emitting elements LD forming respective effective light sources. The reverse light emitting element LDr is connected in parallel between the first and second electrodes EL1 and EL2 together with the light emitting elements LD forming the effective light sources, but may be connected between the first and second electrodes EL1 and EL2 in the opposite direction with respect to the light emitting elements LD. The reverse light emitting element LDr maintains an inactive state even when a suitable driving voltage (e.g., a predetermined driving voltage, for example, a driving voltage in the forward direction) is applied between the first and second electrodes EL1 and EL2, thus a current does not substantially flow in the reverse light emitting element.

The pixel circuit PXC may be connected to a scan line Si and a data line Dj of the pixel PXL. For example, when the pixel PXL is disposed in an i-th (i is a natural number) row and a j-th (is a natural number) column of the display area DA, the pixel circuit PXC of the pixel PXL may be connected to an i-th scan line Si and a j-th data line Dj of the display area DA. In one or more embodiments, the pixel circuit PXC may include first and second transistors T1 and T2 and a storage capacitor Cst. However, the structure of the pixel circuit PXC is not limited to the embodiments illustrated in FIG. 6A to FIG. 6C.

First, referring to FIG. 6A, the pixel circuit PXC may include the first and second transistors T1 and T2, and the storage capacitor Cst.

A first terminal of the second transistor T2 (or a switching transistor) may be connected to the j-th data line Dj, and a second terminal thereof may be connected to a first node N1. Here, the first terminal and the second terminal of the second transistor T2 are different terminals, and for example, when the first terminal is a source electrode, the second terminal may be a drain electrode. In addition, a gate electrode of the second transistor T2 may be connected to the i-th scan line Si. The second transistor T2 is turned on when a scan signal of a voltage (for example, a low voltage) capable of turning on the second transistor T2 is supplied from the i-th scan line Si to electrically connect the j-th data line Dj and the first node N1. In this case, a data signal of a corresponding frame is supplied to the j-th data line Dj, and accordingly, the data signal is transmitted to the first node N1. The data signal transmitted to the first node N1 is charged in the storage capacitor Cst.

A first terminal of the first transistor T1 (or a driving transistor) may be connected to the first driving power source VDD, and a second terminal thereof may be electrically connected to the first electrode EL1. A gate electrode of the first transistor T1 may be connected to the first node N1. The first transistor T1 controls an amount of driving current supplied to the light emitting elements LD in response to a voltage of the first node N1.

One electrode of the storage capacitor Cst may be connected to the first driving power source VDD, and the other electrode thereof may be connected to the first node N1. The storage capacitor Cst is charged with a voltage corresponding to the data signal supplied to the first node N1, and maintains the charged voltage until a data signal of a next frame is supplied.

FIG. 6A illustrates the pixel circuit PXC including the second transistor T2 for transmitting a data signal into the pixel PXL, the storage capacitor Cst for the data signal, and the first transistor T1 for supplying a driving current corresponding to the data signal to the light emitting elements LD.

However, the present disclosure is not limited thereto, and the structure of the pixel circuit PXC may be variously changed. For example, the pixel circuit PXC may additionally include other circuit elements such as at least one transistor element such as a transistor element for compensating a threshold voltage of the first transistor T1, a transistor element for initializing the first node N1, and/or a transistor element for controlling a light emitting time of the light emitting elements LD, or a boosting capacitor for boosting the voltage of the first node N1.

In addition, FIG. 6A illustrates the transistors included in the pixel circuit PXC, for example, the first and second transistors T1 and T2 as P-type transistors, but the present disclosure is not limited thereto. That is, at least one of the first and second transistors T1 and T2 included in the pixel circuit PXC may be changed to an N-type transistor, or both the first and second transistors T1 and T2 may be changed to N-type transistors.

The pixel circuit PXC may be further connected to at least one other scan line according to one or more embodiments. As described above, when the pixel PXL is disposed on an i-th pixel row of the display area DA, the pixel circuit PXC of the corresponding pixel PXL may be connected to an (i−1)-th scan line Si−1 and/or an (i+1)-th scan line Si+1 as shown in FIG. 6B. In addition, in one or more embodiments, the pixel circuit PXC may be further connected to a third power source in addition to the first and second driving power sources VDD and VSS. For example, the pixel circuit PXC may also be connected to an initialization power source Vint. In this case, the pixel circuit PXC may include first to seventh transistors T1 to T7 and a storage capacitor Cst.

A first terminal of the first transistor T1 (or a driving transistor), for example, a source electrode thereof may be connected to the first driving power VDD via the fifth transistor T5, and a second terminal, for example, a drain electrode thereof may be electrically connected to one end portion of the light emitting elements LD via the sixth transistor T6. A gate electrode of the first transistor T1 may be connected to a first node N1. The first transistor T1 controls a driving current flowing between the first driving power source VDD and the second driving power source VSS through the light emitting elements LD in response to a voltage of the first node N1.

The second transistor T2 (or a switching transistor) may be connected between the j-th data line Dj connected to the pixel PXL and the first terminal of the first transistor T1. In addition, a gate electrode of the second transistor T2 may be connected to the i-th scan line Si. When a scan signal of a gate-on voltage (for example, a low voltage) is supplied from the i-th scan line Si, the second transistor T2 may be turned on to electrically connect the j-th data line Dj to the first terminal of the first transistor T1. Accordingly, when the second transistor T2 is turned on, a data signal supplied from the j-th data line Dj may be transmitted to the first transistor T1.

The third transistor T3 may be connected between the second terminal of the first transistor T1 and the first node N1. In addition, a gate electrode of the third transistor T3 may be connected to the i-th scan line Si. When the scan signal of the gate-on voltage is supplied from the i-th scan line Si, the third transistor T3 may be turned on to electrically connect the second terminal of the first transistor T1 to the first node N1 (e.g., the first transistor T1 may be diode-connected).

The fourth transistor T4 may be connected between the first node N1 and an initialization power line IPL to which the initialization power source Vint is applied. A gate electrode of the fourth transistor T4 may be connected to a previous scan line, for example, the (i−1)-th scan line Si−1. When the scan signal of the gate-on voltage is supplied to the (i−1)-th scan line Si−1, the fourth transistor T4 may be turned on to transmit a voltage of the initialization power source Vint to the first node N1. Here, the initialization power source Vint may have a voltage smaller than or equal to a lowest voltage of the data signal.

The fifth transistor T5 may be connected between the first driving power source VDD and the first transistor T1. In addition, a gate electrode of the fifth transistor T5 may be connected to the corresponding emission control line, for example, an i-th emission control line Ei. When an emission control signal of a gate-off voltage is supplied to the i-th emission control line Ei, the fifth transistor T5 may be turned off, and when an emission control signal of a gate-on voltage is supplied to the i-th emission control line Ei, the fifth transistor T5 may be turned on.

The sixth transistor T6 may be connected between the first transistor T1 and a second node N2 electrically connected to one end portion of the light emitting elements LD. In addition, agate electrode of the sixth transistor T6 may be connected to an i-th emission control line Ei. When the emission control signal of the gate-off voltage is supplied to the i-th emission control line Ei, the sixth transistor T6 may be turned off, and when an emission control signal of a gate-on voltage is supplied to the i-th emission control line Ei, the sixth transistor T6 may be turned on.

The seventh transistor T7 may be connected between the initialization power line IPL and the second node N2 that is electrically connected to one end portion of the light emitting elements LD. In addition, a gate electrode of the seventh transistor T7 may be connected to one of the scan lines in a next row, for example, to the (i+1)-th scan line Si+1. When the scan signal of the gate-on voltage is supplied to the (i+1)-th scan line Si+1, the seventh transistor T7 may be turned on to supply a voltage of the initialization power source Vint to one end portion of the light emitting elements LD.

The storage capacitor Cst may be connected between the first driving power source VDD and the first node N1. The storage capacitor Cst may store the data signal supplied to the first node N1 in each frame period and a voltage corresponding to the threshold voltage of the first transistor T1.

FIG. 6B illustrates the transistors included in the pixel circuit PXC, for example, the first to seventh transistors T1 to T7 as P-type transistors, but the present disclosure is not limited thereto. For example, at least one of the first to seventh transistors T1 to T7 may be changed to an N-type transistor, or all of the first to seventh transistors T1 to T7 may be changed to an N-type transistor.

In one or more embodiments of the present disclosure, the configuration of the pixel circuit PXC is not limited to the embodiments shown in FIG. 6A and FIG. 6B. For example, the pixel circuit PXC may be configured as in the embodiment shown in FIG. 6C.

The pixel circuit PXC may be further connected to a control line CLi and a sensing line SENj, as shown in FIG. 6C. For example, the pixel circuit PXC may be connected to an i-th control line CLi and a j-th sensing line SENj of the display area DA. The above-described pixel circuit PXC may further include a third transistor T3 in addition to the first and second transistors T1 and T2 shown in FIG. 6A. The first to third transistors T1 to T3 may be configured as N-type transistors.

The third transistor T3 is connected between the first transistor T1 and the j-th sensing line SENj. For example, one electrode of the third transistor T3 may be connected to the first terminal (for example, a source electrode) of the first transistor T1 connected to the first electrode EL1, and the other electrode of the third transistor T3 may be connected to the j-th sensing line SENj. According to one or more embodiments, a gate electrode of the third transistor T3 is connected to the i-th control line CLi.

The third transistor T3 is turned on by a control signal of a gate-on voltage (for example, a high level voltage) supplied to the i-th control line CLi during a sensing period (e.g., predetermined sensing period) to electrically connect the j-th sensing line SENj to the first transistor T1.

In one or more embodiments, the sensing period may be a period for extracting characteristic information (for example, a threshold of signal of the first transistor T1) of each of the pixels PXL disposed in the display area DA. During the above-mentioned sensing period, the first transistor T1 may be turned on by supplying a suitable reference voltage (e.g., a predetermined reference voltage) at which the first transistor T1 may be turned on, to the first node N1 through the j-th data line Dj and the second transistor T2 and by connecting each pixel PXL to a current source or the like. In addition, by supplying the control signal of a gate-on voltage to the third transistor T3 to turn on the third transistor T3, the first transistor T1 may be connected to the j-th sensing line SENj. Accordingly, the characteristic information of each pixel PXL including the threshold voltage of the first transistor T1 can be extracted through the above-described j-th sensing line SENj. The detected characteristic information may be used to convert image data so that a characteristic deviation between the pixels PXL is compensated.

FIG. 6C discloses an embodiment in which all of the first to third transistors T1 to T3 are N-type transistors, but the present disclosure is not limited thereto. For example, at least one of the first to third transistors T1 to T3 described above may be changed to a P-type transistor. In addition, although FIG. 6C discloses the embodiment in which the emission unit EMU is connected between the pixel circuit PXC and the second driving power source VSS, the emission unit EMU may also be connected between the first driving power source VDD and the pixel circuit PXC.

FIG. 6B and FIG. 6C illustrate the embodiments in which the light emitting elements LD forming each emission unit EMU are all connected in parallel, but the present disclosure is not limited thereto. In one or more embodiments, the emission unit EMU may be configured to include at least one series stage including a plurality of light emitting elements LD connected in parallel to each other. For example, the emission unit EMU may be configured in a series/parallel mixed structure as shown in FIG. 6A.

Referring to FIG. 6A, the emission unit EMU may include first and second serial stages SET1 and SET2 sequentially connected between the first and second driving power sources VDD and VSS. Each of the first and second serial stages SET1 and SET2 may include two electrodes (EL1 and CTE1, CTE2 and EL2) configuring an electrode pair of the corresponding serial stage, and a plurality of light emitting elements LD connected in parallel in the same direction between the two electrodes (EL1 and CTE1, CTE2 and EL2).

The first serial stage SET1 includes the first electrode EL1 and the first intermediate electrode CTE1, and it may include at least one first light emitting element LD1 connected between the first electrode EL1 and the first intermediate electrode CTE1. In addition, the first serial stage SET1 may include a reverse direction light emitting element LDr connected to the first light emitting element LD1 in an opposite direction between the first electrode EL1 and the first intermediate electrode CTE1.

The second serial stage SET2 includes the second intermediate electrode CTE2 and the second electrode EL2, and it may include at least one second light emitting element LD2 connected between the second intermediate electrode CTE2 and the second electrode EL2. In addition, the second serial stage SET2 may include a reverse direction light emitting element LDr connected to the second light emitting element LD2 in an opposite direction between the second electrode EL2 and the second intermediate electrode CTE2.

The first intermediate electrode CTE1 of the first serial stage SET1 and the second intermediate electrode CTE2 of the second serial stage SET2 are integrally provided to be connected to each other. That is, the first intermediate electrode CTE1 and the second intermediate electrode CTE2 may form an intermediate electrode CTE that electrically connects the continuous first serial stage SET1 and second serial stage SET2. When the first intermediate electrode CTE1 and the second intermediate electrode CTE2 are integrally provided, the first intermediate electrode CTE1 and the second intermediate electrode CTE2 may be different areas of the intermediate electrode CTE.

In the above-described embodiment, the first electrode EL1 of the first serial stage SET1 may be an anode electrode of the emission unit EMU of each pixel PXL, and the second electrode EL2 of the second serial stage SET2 may be a cathode electrode of the emission unit EMU.

As described above, the emission unit EMU of the pixel PXL including the light emitting elements LD connected in a series/parallel mixed structure may easily adjust a driving current/voltage condition according to of the applied product specification.

Particularly, the emission unit EMU of the pixel PXL including the light emitting elements LD connected in the series/parallel mixed structure may reduce a driving current compared to the emission unit EMU having a structure in which the light emitting elements LD are connected in parallel. In addition, the emission unit EMU of the pixel PXL including the light emitting elements LD connected in the series/parallel mixed structure may reduce a driving voltage applied to both ends of the emission unit EMU compared to the emission unit EMU having a structure in which all of the light emitting elements LD are connected in series.

The structure of the pixel PXL that may be applied to the present disclosure is not limited to one or more embodiments illustrated in FIG. 6A to FIG. 6C, and the corresponding pixel PXL may have various structures. For example, each pixel PXL may be configured inside a passive light emitting display device or the like. In this case, the pixel circuit PXC may be omitted, and respective end portions of the light emitting elements LD included in the emission unit EMU may be directly connected to the i-th scan line Si, the j-th data line Dj, the first power line PL1 to which the first driving power source VDD is applied, the second power line PL2 to which the second driving power source VSS is applied, and/or a suitable control line CLi (e.g., a predetermined control line).

Figure 7:
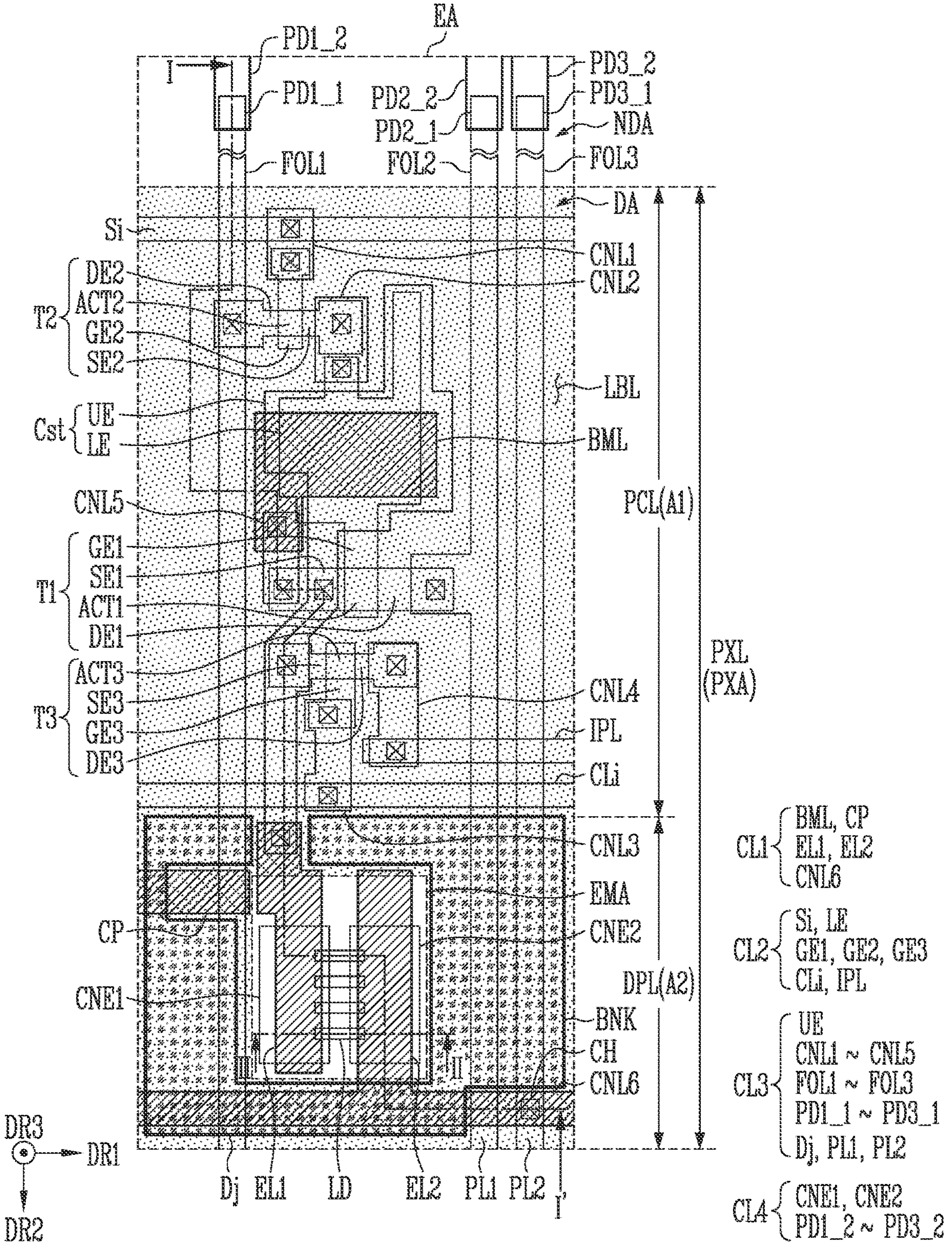
FIG. 7 illustrates a schematic enlarged top plan view of a portion EA of FIG. 5.
Figure 8:
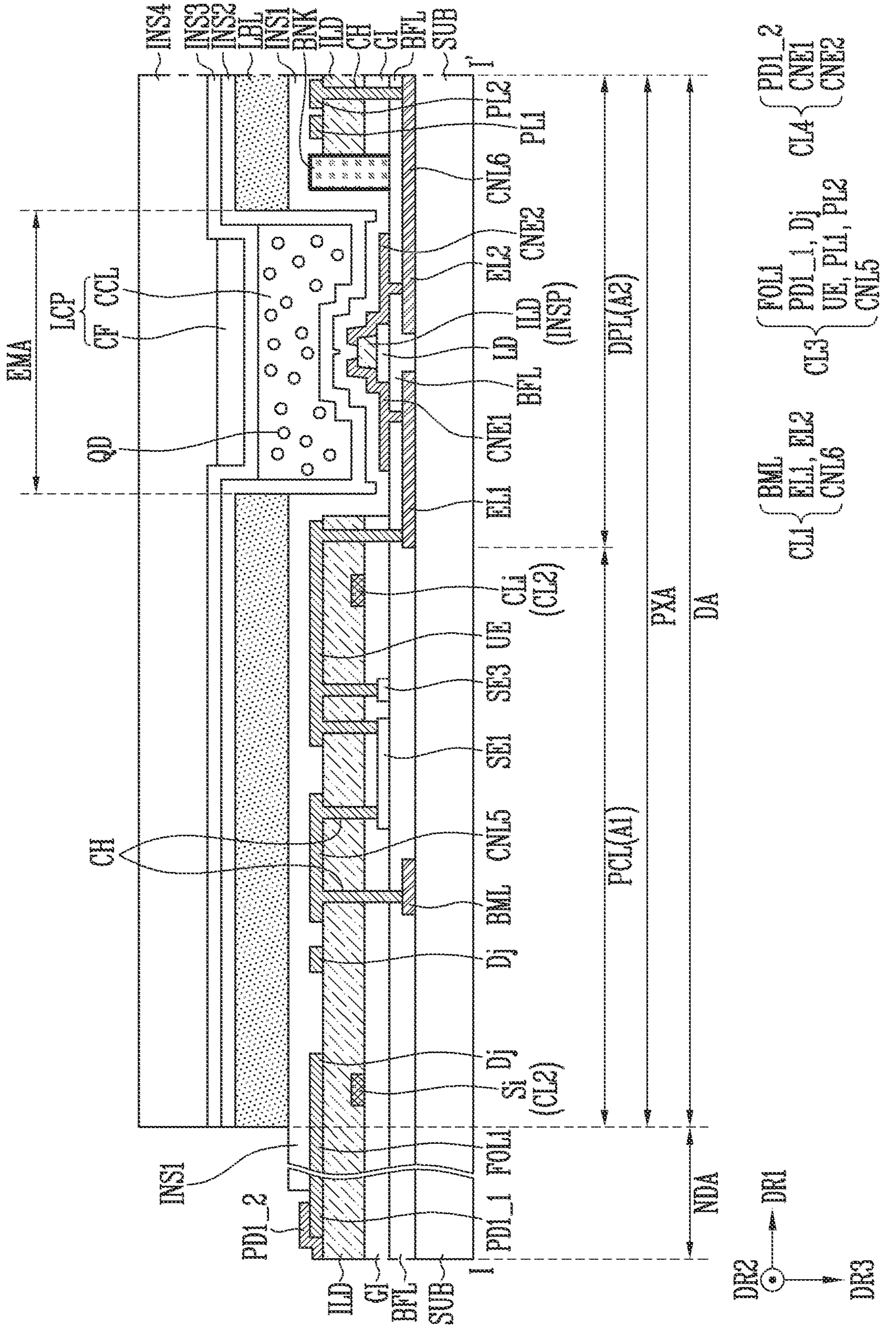
FIG. 8 illustrates a cross-sectional view taken along the line I~I' of FIG. 7.
Figure 9:
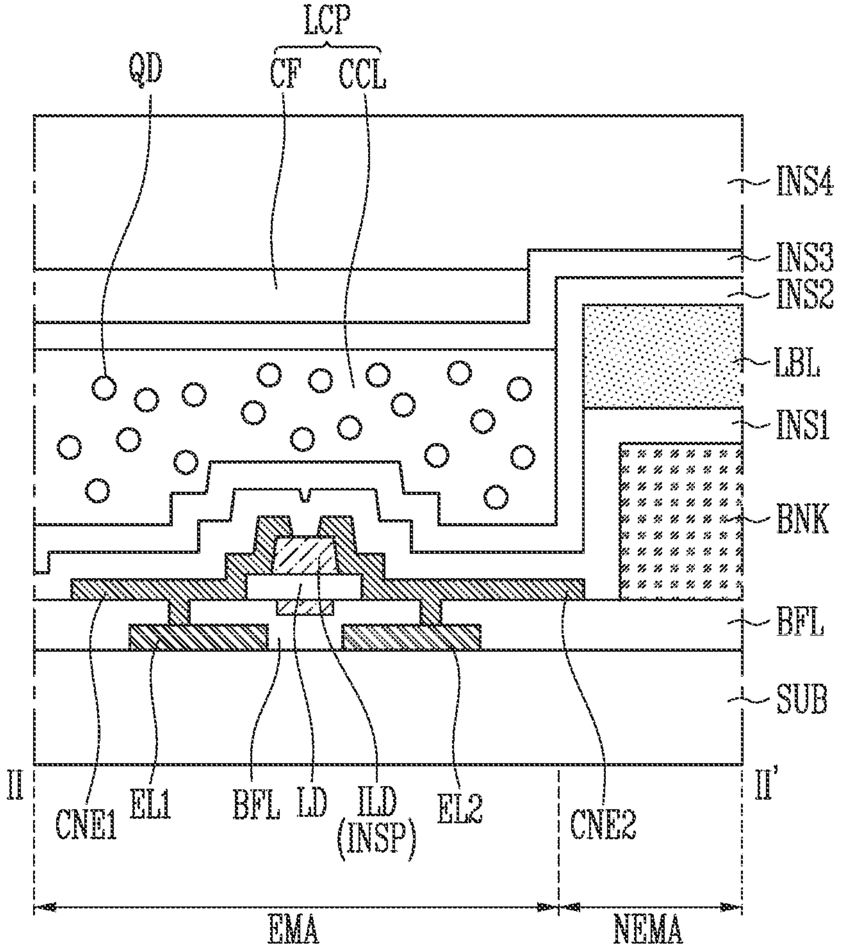
FIG. 9 illustrates a cross-sectional view taken along the line II~II' of FIG. 7.
Figure 10A:
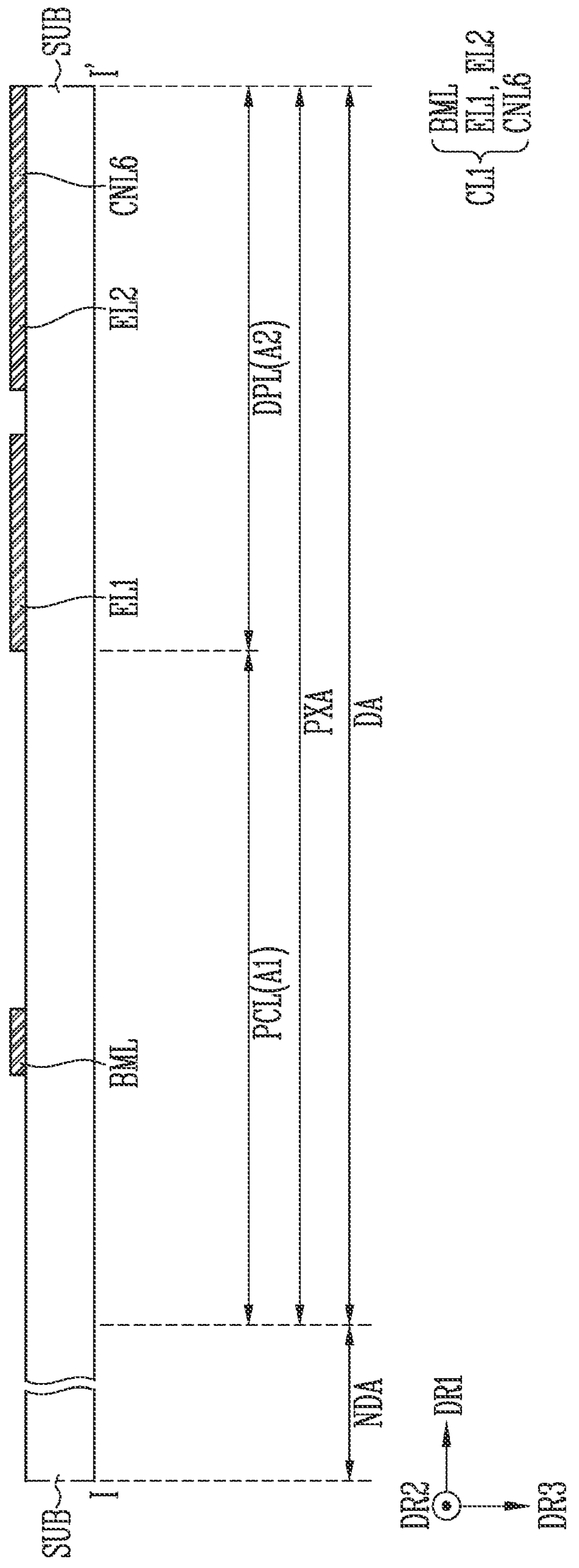
FIG. 10A to FIG. 10M sequentially illustrate cross-sectional views of a manufacturing method of a display device illustrated in FIG. 8.
Figure 10B:
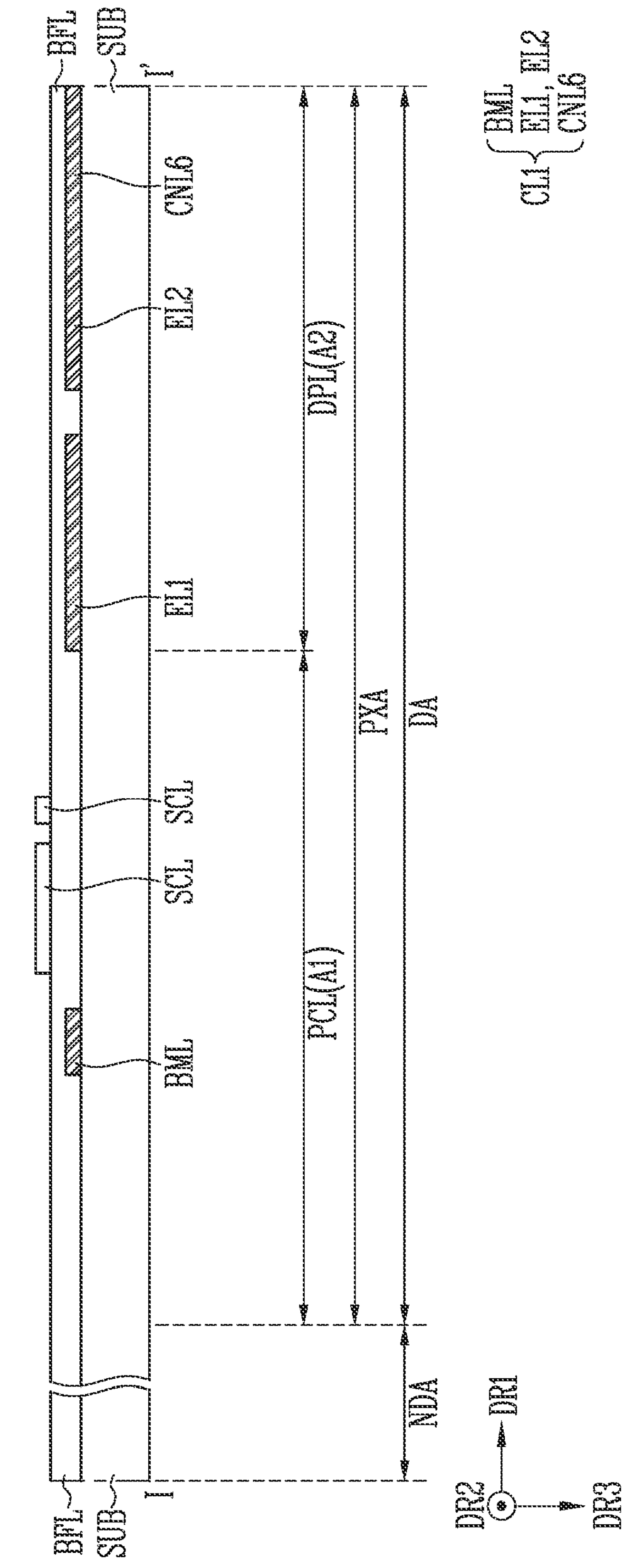
Figure 10C:
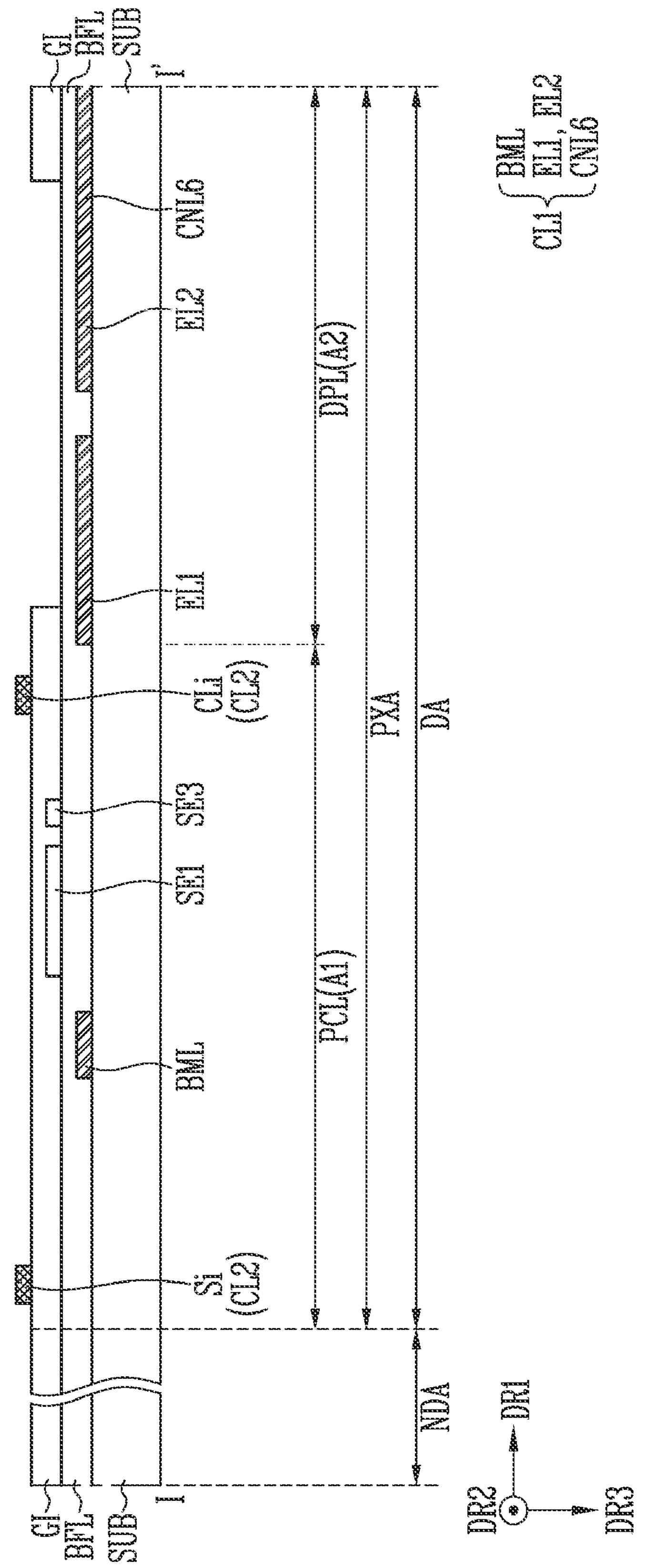
Figure 10D:
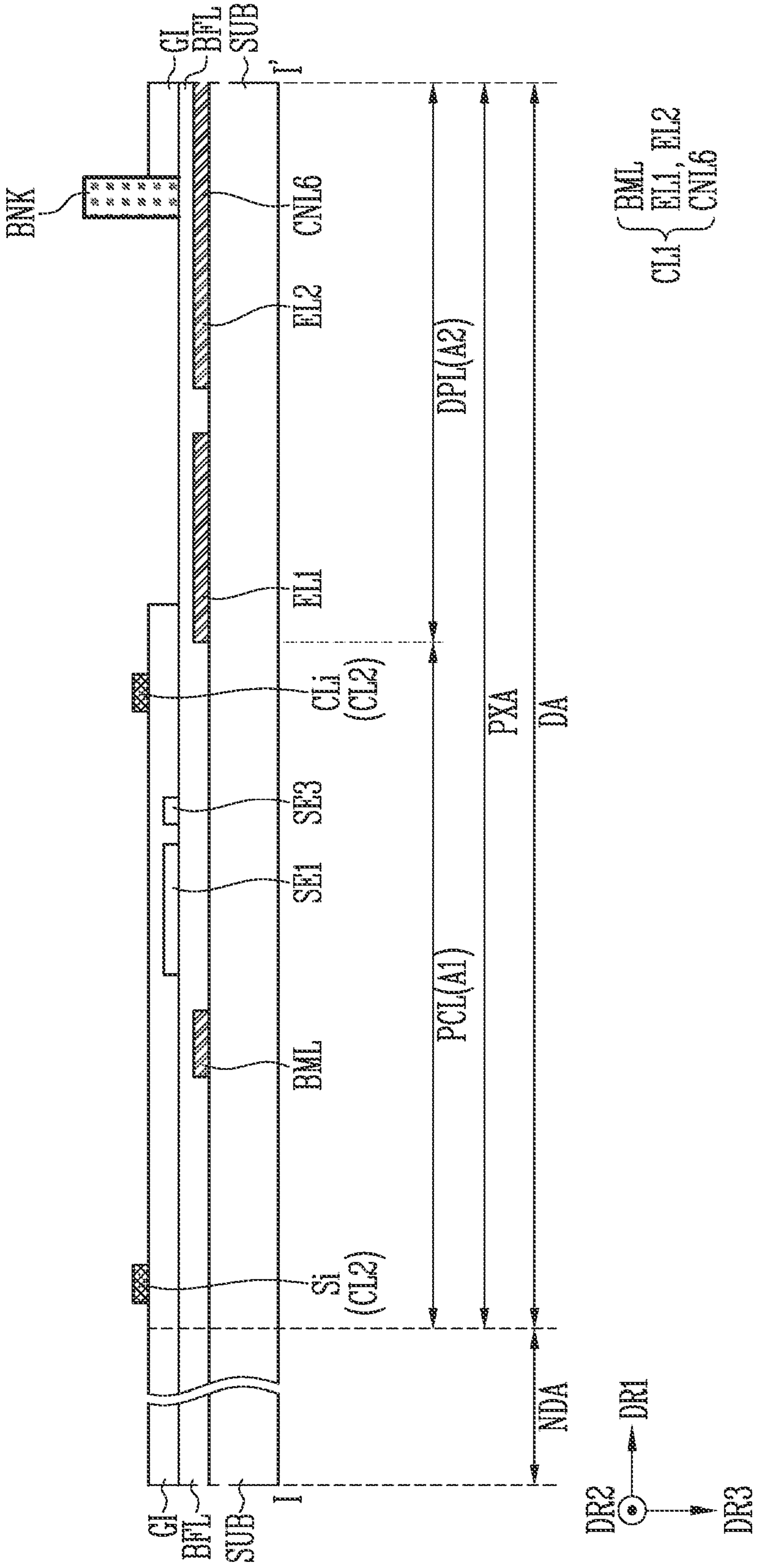
Figure 10E:
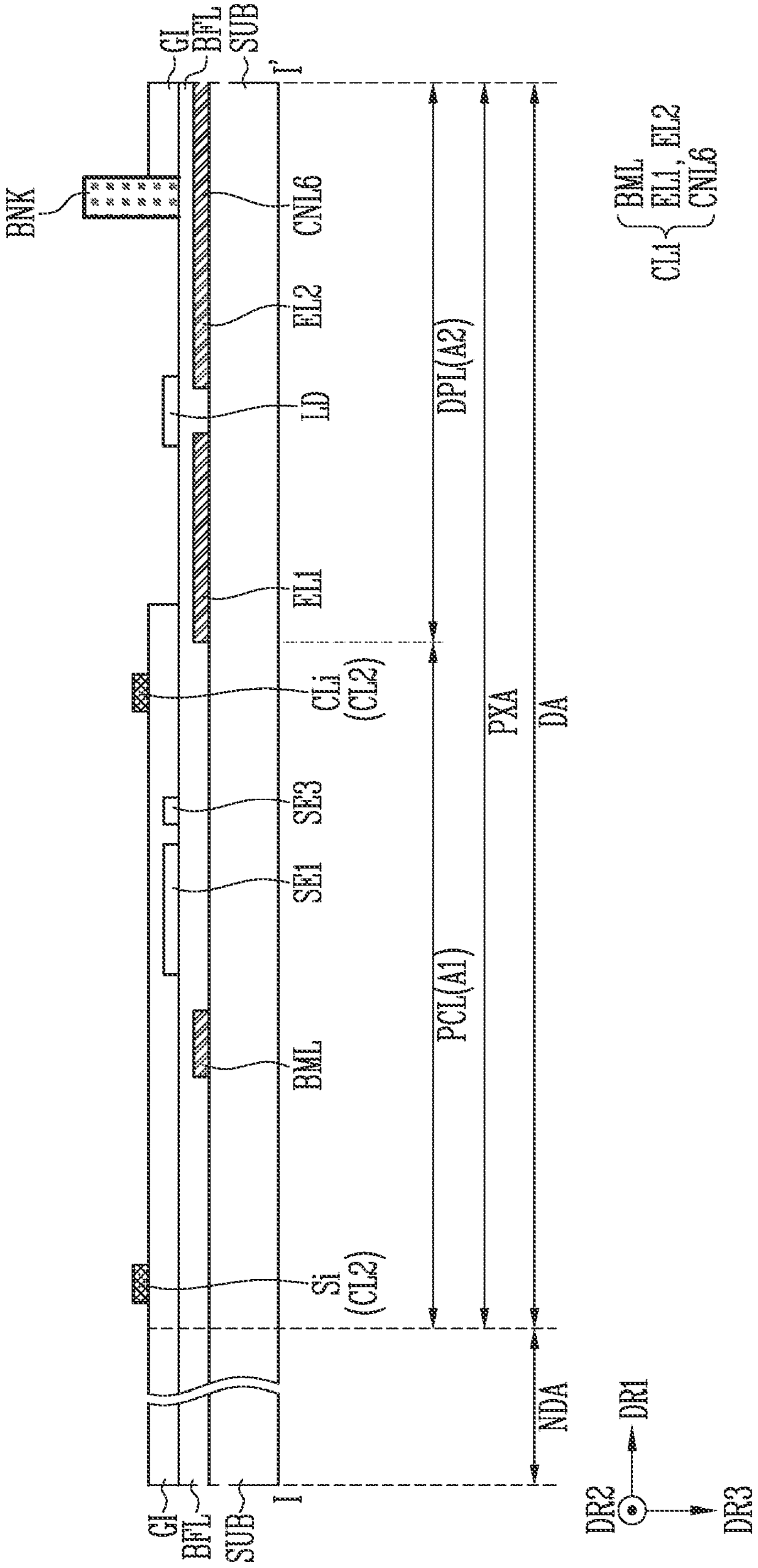
Figure 10F:
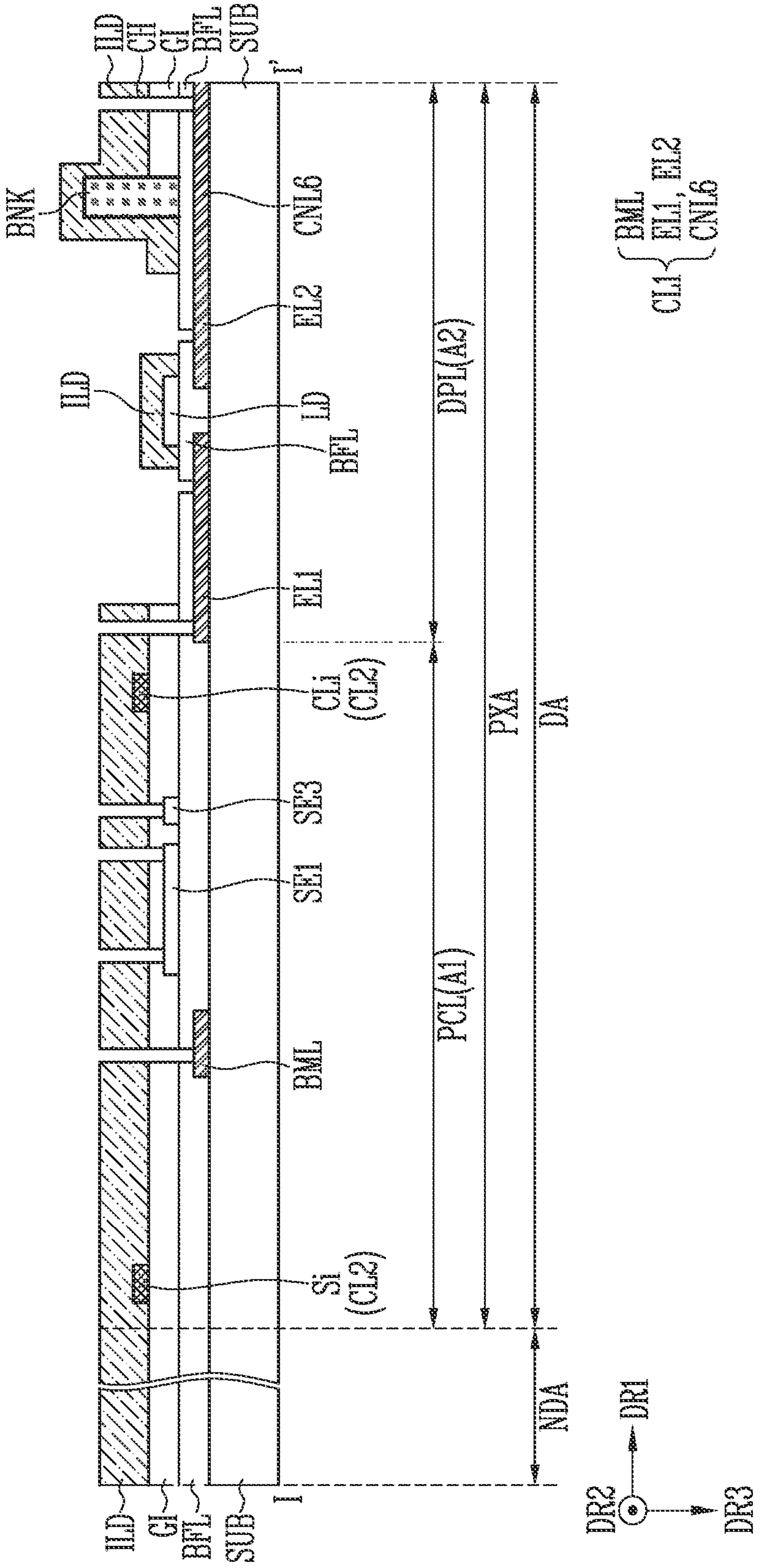
Figure 10G:
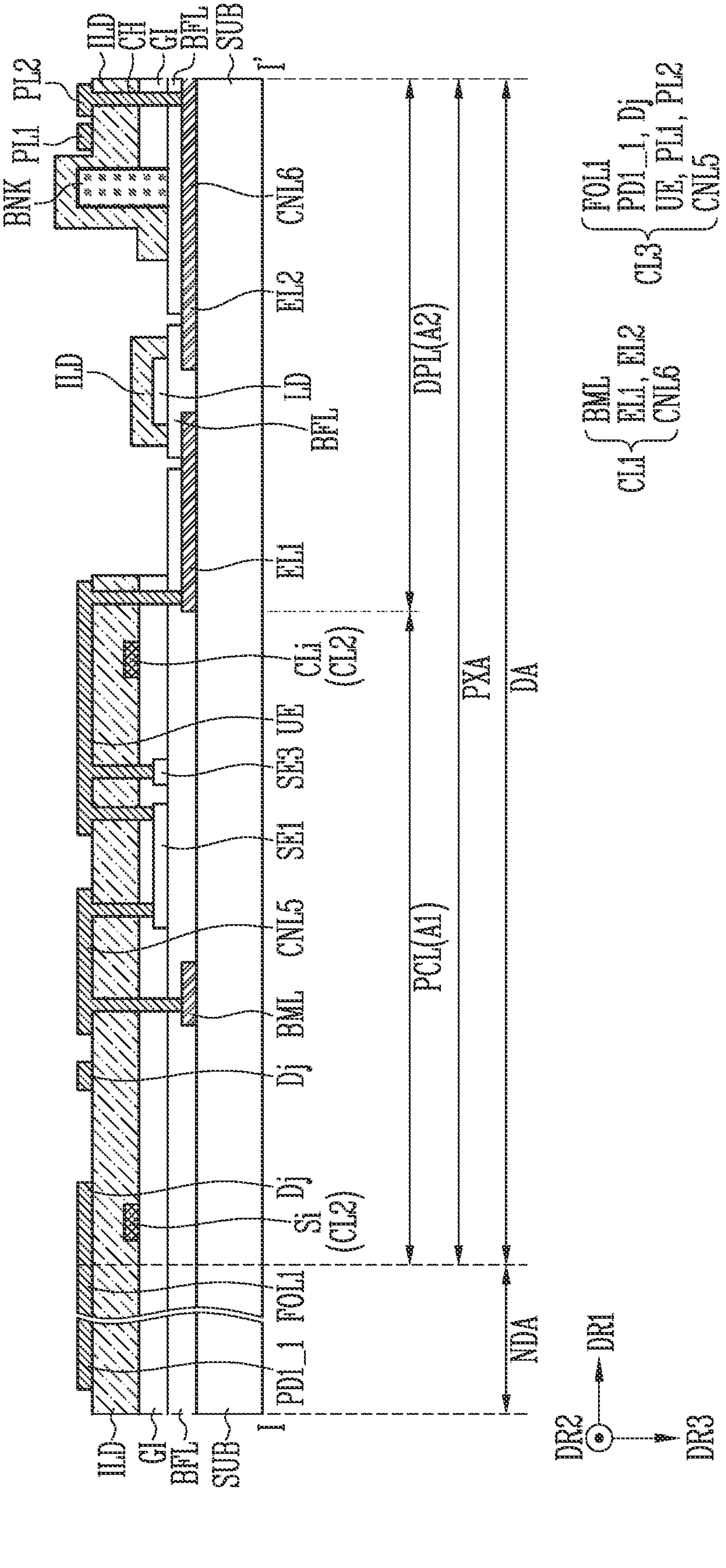
Figure 10H:
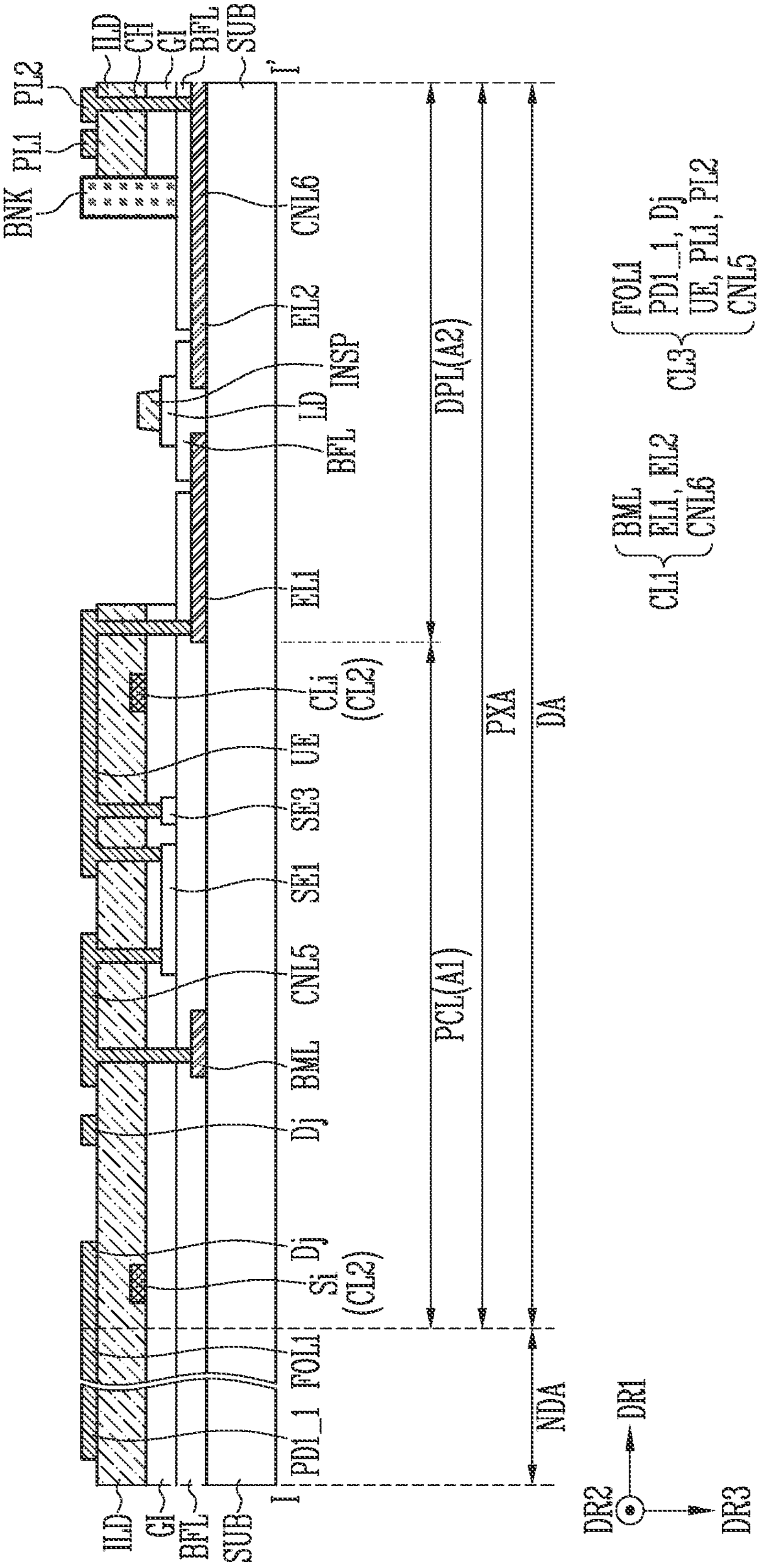
Figure 10I:
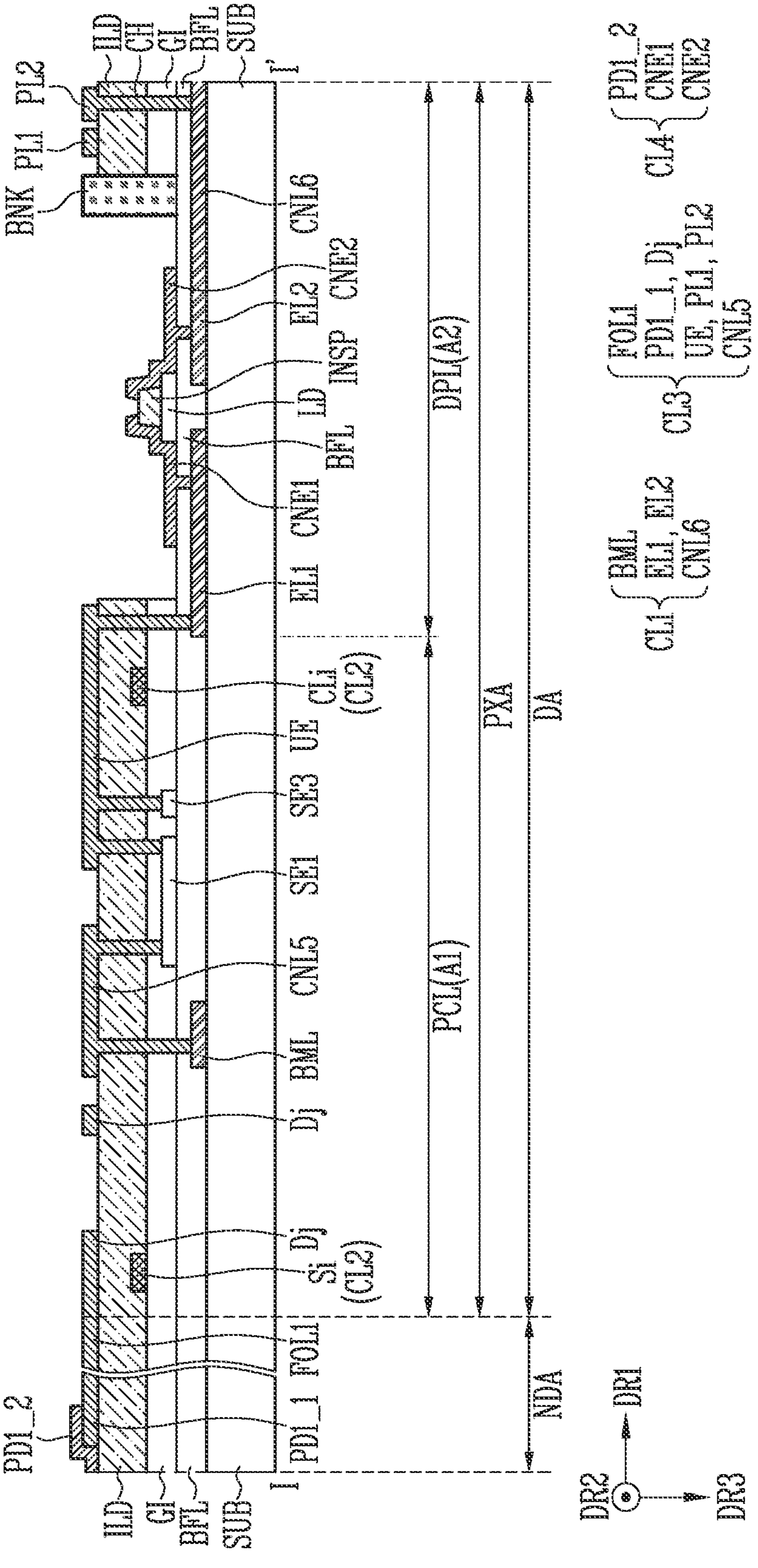
Figure 10J:
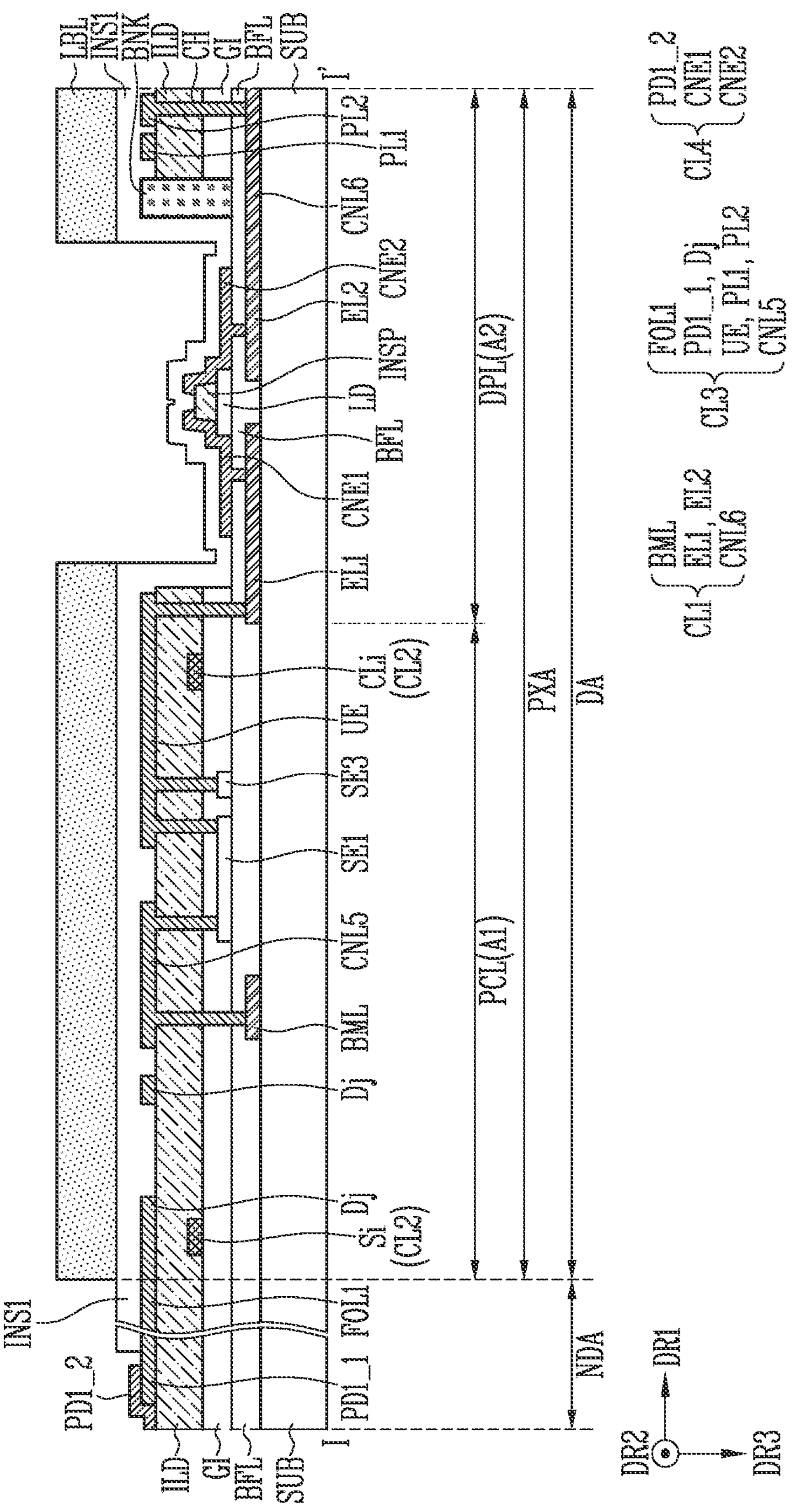
Figure 10K:
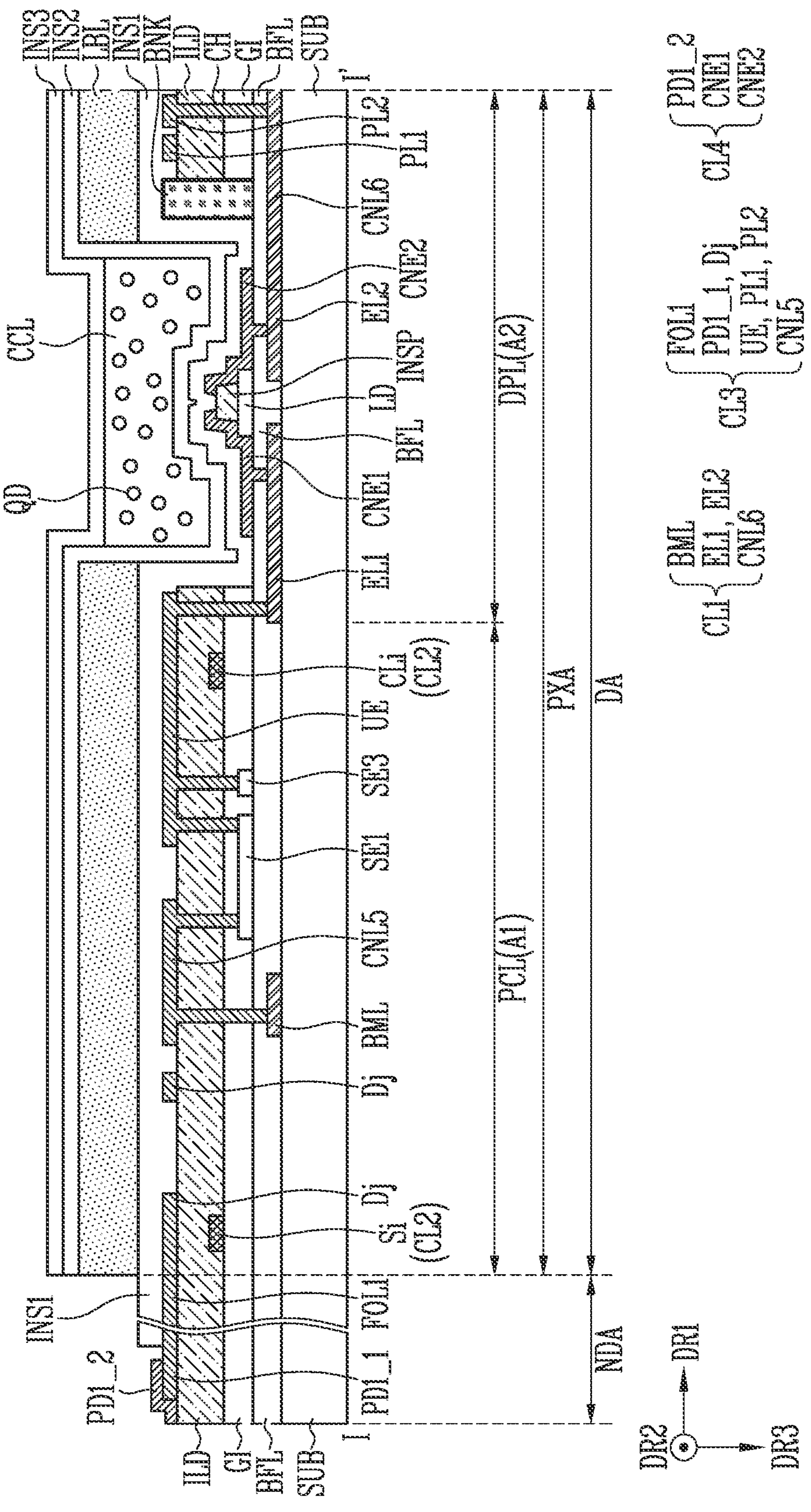
Figure 10L:
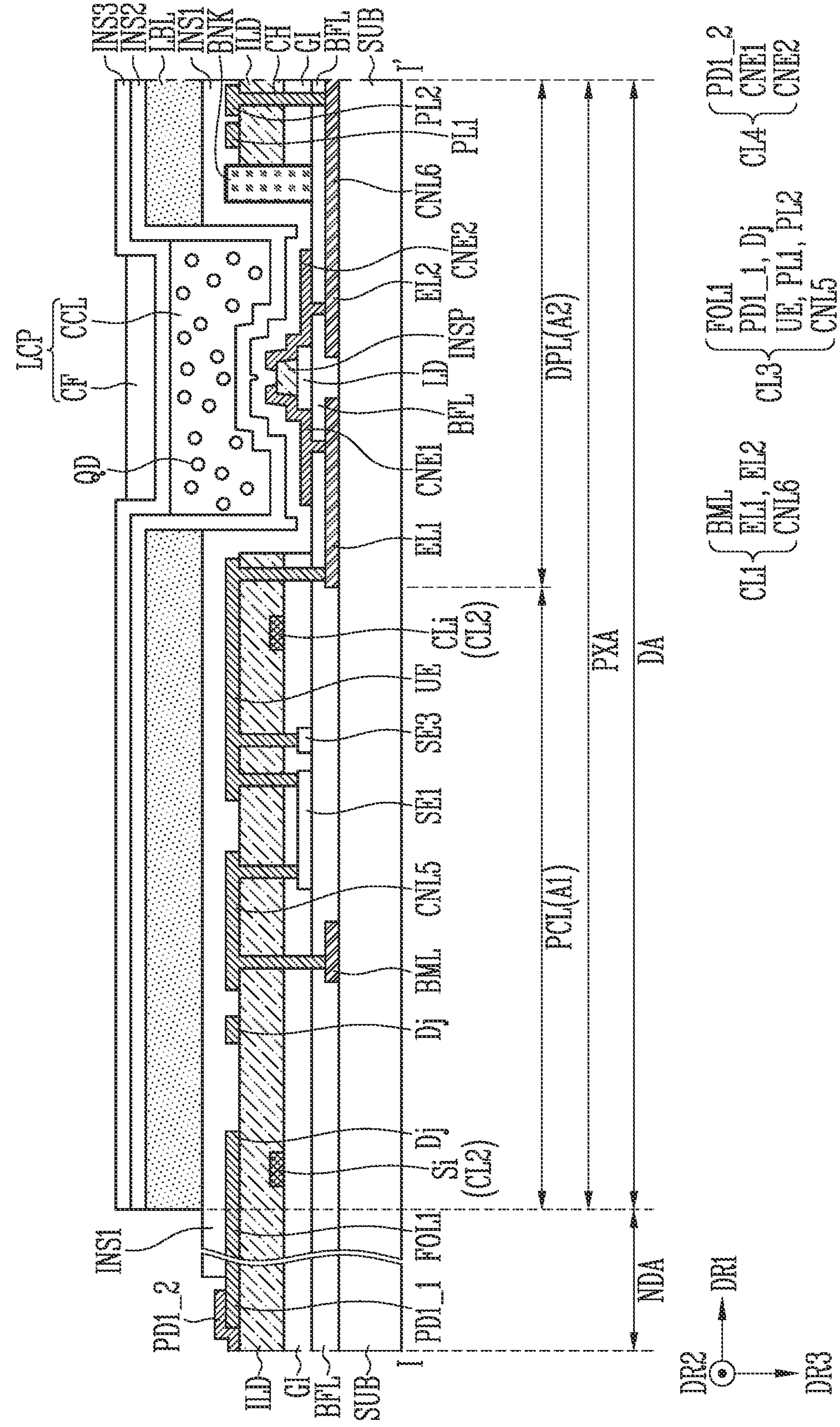
Figure 10M:
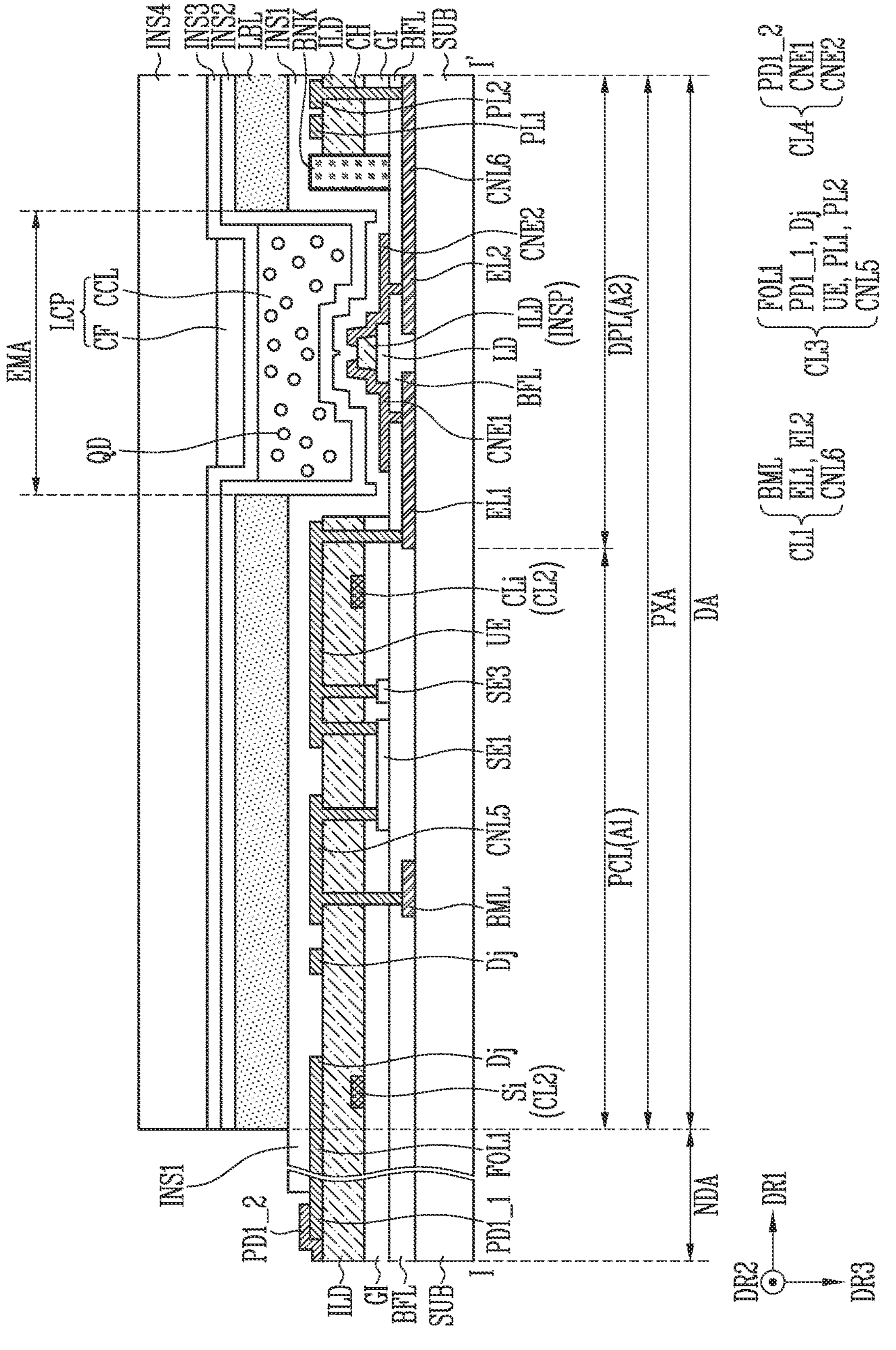

FIG. 7 illustrates a schematic enlarged top plan view of a portion EA of FIG. 5, FIG. 8 illustrates a cross-sectional view taken along line the I~I' of FIG. 7, and FIG. 9 illustrates a cross-sectional view taken along line the II~II' of FIG. 7.

A pixel illustrated in FIG. 7 may be one of the pixels described with reference to FIG. 5.

For convenience, in FIG. 7, in the portion EA, the scan line Si, the control line CLi, the data line Dj, the power lines PL1 and PL2, and an initialization power line IPL that are connected to the pixel PXL are shown based on one pixel PXL disposed in an area in which the j-th pixel column and the i-th pixel row cross. Here, the i-th pixel row may be a first pixel row.

In addition, for better understanding and ease of description, in the wires provided in the pixel PXL, the data line of the j-th column to which a data signal is applied is referred to as a "data line Dj", the scan line of the i-th row is referred to as a "scan line Si", the power line to which the first driving power source VDD is applied is referred to as a "first power line PL1", and the power line to which the second driving power source VSS is applied is referred to as a "second power line PL2".

In FIG. 7 to FIG. 9, the pixel PXL is simplified by showing each electrode as an electrode of a single film and each insulating layer as an insulating layer of a single film, but the present disclosure is not limited thereto.

Additionally, in one or more embodiments of the present disclosure, "formed and/or provided on (or at) the same layer" means formed in the same process, and "formed and/or provided on (or at) another layer" means formed in a different process.

In addition, in one or more embodiments of the present disclosure, "connection" between two elements may comprehensively mean both electrical and physical connections.

In addition, in one or more embodiments of the present disclosure, for better understanding and ease of description, a horizontal direction in a plan view is indicated by the first direction DR1, a vertical direction in a plan view is indicated by the second direction DR2, and a thickness of the substrate SUB in a cross-sectional view is indicated by the third direction DR3. The first to third directions DR1, DR2, and DR3 may mean directions indicated by the first to third directions DR1, DR2, and DR3, respectively.

Referring to FIG. 1 to FIG. 5 and FIG. 7 to FIG. 9, the display device according to one or more embodiments of the present disclosure may include a substrate SUB, the wire part, and a plurality of pixels PXL.

The substrate SUB may include a transparent insulating material to transmit light. The substrate SUB may be a rigid substrate or a flexible substrate.

For example, the rigid substrate may be one of a glass substrate, a quartz substrate, a glass ceramic substrate, and a crystalline glass substrate.

The flexible substrate may be one of a film substrate and a plastic substrate, which include a polymer organic material. For example, the flexible substrate may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, or cellulose acetate propionate.

However, the material configuring the substrate SUB may be variously changed. A material applied to the substrate SUB may have resistance (or heat resistance) to a high processing temperature in a manufacturing process of the display device.

For example, the substrate SUB may include a display area DA including at least one pixel area PXA in which each of the pixels PXL is disposed, and a non-display area NDA disposed around the display area DA (or adjacent to the display area DA). The pixel area PXA may include an emission area EMA from which light is emitted and a peripheral area adjacent to the emission area EMA (or surrounding a periphery of the emission area). In one or more embodiments of the present disclosure, the peripheral area may include a non-emission area NEMA from which light is not emitted.

In the non-display area NDA, a wire part connecting each pixel PXL and the driver may be positioned. The wire part may include a plurality of fan-out lines. The fan-out lines may be connected to signal lines connected to each of the pixels PXL. The above-described signal lines may include a data line Dj to which a data signal is applied, a scan line Si to which a scan signal is applied, a control line CLi to which a control signal is applied, an initialization power line IPL to which a voltage of an initialization power source Vint is applied, a first power line PL1 to which a voltage of a first driving power source VDD is applied, and a second power line PL2 to which a voltage of a second driving power source VSS are applied. Here, the initialization power line IPL may be the j-th sensing line SENj described with reference to FIG. 6C.

First to fourth conductive layers CL1 to CL4 sequentially stacked may be provided and/or formed on the substrate SUB. At least one insulating layer may be positioned between the first to fourth conductive layers CL1 to CL4. The insulating layer may include a buffer layer BFL provided on the substrate SUB, a gate insulating layer GI provided on the buffer layer BFL, an interlayer insulating layer ILD provided on the gate insulating layer GI, a first insulating layer INS1 provided on the interlayer insulating layer ILD, and the like.

The first conductive layer CL1 may include a conductive material provided and/or formed on the substrate SUB. The second conductive layer CL2 may include a conductive material provided and/or formed on the gate insulating layer GI. The third conductive layer CL3 may include a conductive material provided and/or formed on the interlayer insulating layer ILD. The fourth conductive layer CL4 may include a conductive material provided and/or formed on the third conductive layer CL3.

The pixel PXL shown in FIG. 7 may be a pixel disposed in an crossing area of the first pixel row and the j-th pixel column. Each of the pixels PXL may have a substantially similar or identical structure. Accordingly, for convenience, a description of the plurality of pixels PXL will be replaced with a description of one pixel PXL disposed in the crossing area of the first pixel row and the j-th pixel column with reference to FIG. 7.

The one pixel PXL (hereinafter referred to as a "pixel") may be a red pixel, a green pixel, and a blue pixel, but the present disclosure is not limited thereto. The pixel PXL may be a pixel PXL disposed closest to the non-display area NDA, and may be a pixel PXL that is first connected to the wire part disposed in the non-display area NDA along the second direction DR2.

In the display area DA of the substrate SUB, an area in which the pixel PXL is disposed may be the pixel area PXA.

The pixel PXL may be electrically connected to the scan line Si, the control line CLi, the data line Dj, and the first and second power lines PL1 and PL2 positioned in the pixel area PXA. Here, the first power line PL1 may be the first power line PL1 described with reference to FIG. 6A to FIG. 6C, and the second power line PL2 may be the second power line PL2 described with reference to FIG. 6A to FIG. 6C.

The scan line Si may extend in the first direction DR1. The scan line Si may be one of the conductive layers described above. As an example, the scan line Si may be the second conductive layer CL2 provided and/or formed on the gate insulating layer GI.

The second conductive layer CL2 may be formed to have a single film structure of a single or a mixture thereof selected from a group consisting of copper (Cu), molybdenum (Mo), tungsten (W), aluminum neodymium (AlNd), titanium (Ti), aluminum (Al), silver (Ag), and an alloy thereof, or in order to reduce wire resistance, it may be formed to have a double film or multi-film structure of molybdenum (Mo), titanium (Ti), copper (Cu), aluminum (Al) and/or silver (Ag), which are low-resistance materials. For example, the second conductive layer CL2 may be formed as a double film stacked in the order of titanium (Ti)/copper (Cu).

The gate insulating layer GI may be an inorganic insulating film including an inorganic material. The inorganic insulating film may include, for example, at least one of inorganic material such as a silicon nitride ($SiN_x$), a silicon oxide ($SiO_x$), a silicon oxynitride ($SiO_xN_y$), or an aluminum oxide ($AlO_x$). In one or more embodiments, the gate insulating layer GI may be formed as an organic insulating film including an organic material. The gate insulating layer GI may be provided as a single film, but may also be provided as a multi-film of at least two or more films.

The control line CLi may extend in the same direction as the scan line Si, for example, in the first direction DR1. A gate-on-voltage (for example, high level voltage) control signal may be applied to the control line CLi during a suitable sensing period (e.g., predetermined sensing period). In one or more embodiments of the present disclosure, the control line CLi may be the second conductive layer CL2 provided and/or formed on the gate insulating layer GI.

The initialization power line IPL may extend in the same direction as the scan line Si and the control line CLi. The initialization power line IPL is electrically connected to the corresponding pixel PXL, and the voltage of the initialization power source Vint may be applied thereto. The initialization power line IPL may be the second conductive layer CL2 provided and/or formed on the gate insulating layer GI. However, the present disclosure is not limited thereto, and in one or more embodiments, the initialization power line IPL may be the third conductive layer CL3 disposed on the interlayer insulating layer ILD.

The data line Dj may extend in the second direction DR2 that is different from, for example, crosses the first direction DR1. A corresponding data signal may be applied to the data line Dj. The data line Dj may be one of the conductive layers provided on the substrate SUB. For example, the data line Dj may be the third conductive layer CL3 provided on the interlayer insulating layer ILD.

Similar to the second conductive layer CL2, the third conductive layer CL3 may be formed to have a single film structure of a single or a mixture thereof selected from a group consisting of copper (Cu), molybdenum (Mo), tungsten (W), aluminum neodymium (AlNd), titanium (Ti), aluminum (Al), silver (Ag), and an alloy thereof, or in order to reduce wire resistance, it may be formed to have a double film or multi-film structure of molybdenum (Mo), titanium (Ti), copper (Cu), aluminum (Al) and/or silver (Ag), which are low-resistance materials. For example, the third conductive layer CL3 may be formed as a double film stacked in the order of titanium (Ti)/copper (Cu).

The interlayer insulating layer ILD may include the same material as that of the gate insulating layer GI, or may include one or more materials selected from the materials illustrated as constituent materials of the gate insulating layer GI.

The data line Dj may be connected to a first fan-out line FOL1 included in the wire part. The first fan-out line FOL1 may be the third conductive layer CL3 provided and/or formed on the interlayer insulating layer ILD of the non-display area NDA. The first fan-out line FOL1 may be integrally provided with the data line Dj. One end of the first fan-out line FOL1 may contact the data line Dj, and the other end thereof may contact a (1-1)-th pad electrode PD1_1. The (1-1)-th pad electrode PD1_1 may be integrally provided with the first fan-out line FOL1, and may electrically connect the driver implemented through a chip-on film or an integrated circuit and the corresponding pixel PXL. For example, the (1-1)-th pad electrode PD1_1 may transmit a data signal to the data line Dj by connecting the driver and the data line Dj through the first fan-out line FOL1. In one or more embodiments, the (1-1)-th pad electrode PD1_1 may be non-integrally provided with the first fan-out line FOL1 to be electrically connected to the first fan-out line FOL1 through a separate connection means such as a bridge electrode.

The first and second power lines PL1 and PL2 may extend in the same direction as the data line Dj. The first and second power lines PL1 and PL2 may be components provided at the same layer as the data line Dj. For example, the first and second power lines PL1 and PL2 may be the third conductive layer CL3 provided on the interlayer insulating layer ILD. A voltage of the first driving power source VDD may be applied to the first power line PL1, and a voltage of the second driving power source VSS may be applied to the second power line PL2.

The first power line PL1 may be connected to a second fan-out line FOL2 included in the wire part. The second fan-out line FOL2 may be the third conductive layer CL3 provided and/or formed on the interlayer insulating layer ILD of the non-display area NDA. The second fan-out line FOL2 may be integrally provided with the first power line PL1. One end of the second fan-out line FOL2 may contact the first power line PL1, and the other end thereof may contact a (2-1)-th pad electrode PD2_1. The (2-1)-th pad electrode PD2_1 may be integrally provided with the second fan-out line FOL2, and may electrically connect the driver and the corresponding pixel PXL. That is, the (2-1)-th pad electrode PD2_1 may connect the driver and the first power line PL1 through the second fan-out line FOL2 to transmit the voltage of the first driving power source VDD to the first power line PL1. In one or more embodiments, the (2-1)-th pad electrode PD2_1 may be non-integrally provided with the second fan-out line FOL2 to be electrically connected to the second fan-out line FOL2 through a separate connection means such as a bridge electrode.

The second power line PL2 may be connected to a third fan-out line FOL3 included in the wire part. The third fan-out line FOL3 may be the third conductive layer CL3 provided and/or formed on the interlayer insulating layer ILD of the non-display area NDA. The third fan-out line FOL3 may be integrally provided with the second power line PL2. One end of the third fan-out line FOL3 may contact the second power line PL2, and the other end thereof may contact a (3-1)-th pad electrode PD3_1. The (3-1)-th pad electrode PD3_1 may be integrally provided with the third fan-out line FOL3, and may electrically connect the driver and the corresponding pixel PXL. That is, the (3-1)-th pad electrode PD3_1 may connect the driver and the second power line PL2 through the third fan-out line FOL3 to transmit the voltage of the second driving power source VDD to the second power line PL2. In one or more embodiments, the (3-1)-th pad electrode PD3_1 may be non-integrally provided with the third fan-out line FOL3 to be electrically connected to the third fan-out line FOL3 through a separate connection means such as a bridge electrode.

In one or more embodiments of the present disclosure, the pixel area PXA may include a first area A1 and a second area A2 partitioned along one direction, for example, the second direction DR2. A pixel circuit part PCL may be disposed in the first area A1, and a display element part DPL may be disposed in the second area A2. The second area A2 may include the emission area EMA from which light is emitted and the non-emission area NEMA adjacent to the emission area EMA.

For convenience, the pixel circuit part PCL will be first described, and then the display element part DPL will be described.

The pixel circuit part PCL may include a bottom metal layer BML, a buffer layer BFL, and a pixel circuit (refer to "PXC" in FIG. 6C) positioned in the first area A1 of the pixel area PXA.

The bottom metal layer BML may be provided on the substrate SUB. The bottom metal layer BML may be a light blocking film that blocks light introduced through a back surface of the substrate SUB from proceeding to the first transistor T1 of the pixel PXL. For example, the bottom metal layer BML may prevent an erroneous operation of the first transistor T1 by blocking the light introduced through the back surface of the substrate SUB from proceeding to the semiconductor layer of the first transistor T1, for example, a first active pattern ACT1. To this end, the bottom metal layer BML may be disposed on the substrate SUB to overlap the first transistor T1 in the third direction DR1. For example, the bottom metal layer BML may be disposed on the substrate SUB to overlap a first gate electrode GE1 of the first transistor T1 in the third direction DR3. In one or more embodiment of the present disclosure, the bottom metal layer BML may be the first conductive layer CL1 provided and/or formed on the substrate SUB.

The first conductive layer CL1 may be formed of a conductive material (or a conductive substance) having a constant reflectivity. The first conductive layer CL1 may include the same material as the second and third conductive layers CL2 and CL3, or may include one or more materials selected from materials discussed as examples constituent materials of the second and third conductive layers CL2 and CL3. For example, the first conductive layer CL1 may be formed as a single film including an aluminum neodymium (AlNd).

The bottom metal layer BML may be connected to a fifth connection wire CNL5 through a contact hole CH sequentially penetrating the interlayer insulating layer ILD, the gate insulating layer GI, and the buffer layer BFL.

The fifth connection wire CNL5 may be the third conductive layer CL3 provided and/or formed on the interlayer insulating layer ILD, and may overlap the bottom metal layer BML when viewed in a plan view and a cross-sectional view (e.g., in a third direction DR3). The fifth connection wire CNL5 may be provided at the same layer, may include the same material, and may be formed by the same process, as the data line Dj and the first and second power lines PL1 and PL2.

One end of the fifth connection wire CNL5 may be connected to the bottom metal layer BML through the contact hole CH. In addition, the other end of the fifth connection wire CNL5 may be connected to a first source area SE1 of the first transistor T1 through another contact hole CH sequentially penetrating the interlayer insulating layer ILD and the gate insulating layer GI. As a result, the bottom metal layer BML may be connected to the first source area SE1 of the first transistor T1 through the fifth connection wire CNL5.

As described above, when the bottom metal layer BML is connected to the first source area SE1 of the first transistor T1, a swing width margin of the second driving power source VDD may be secured. In this case, a driving range of a gate voltage applied to the first gate electrode GE1 of the first transistor T1 may be widened.

The buffer layer BFL may be provided and/or formed on the bottom metal layer BML and the substrate SUB. The buffer layer BFL may prevent impurities from being diffused into the first to third transistors T1 to T3 included in the pixel circuit PXC. The buffer layer BFL may include an inorganic insulating film including an inorganic material. The inorganic insulating film may include, for example, at least one of inorganic material such as a silicon nitride ($SiN_x$), a silicon oxide ($SiO_x$), a silicon oxynitride ($SiO_xN_y$), and an aluminum oxide ($AlO_x$). The buffer layer BFL may be provided as a single film, but may be provided as a multifilm of at least double or more films. When the buffer layer BFL is provided as the multi-film, respective layers thereof may be made of the same material or different materials. The buffer layer BFL may be omitted depending on the material, a process condition, and the like of the substrate SUB.

The pixel circuit PXC may include the first to third transistors T1 to T3 and the storage capacitor Cst provided on the buffer layer BFL. The first transistor T1 may be the first transistor T1 described with reference to FIG. 6A to FIG. 6C, the second transistor T2 may be the second transistor T2 described with reference to FIG. 6A to FIG. 6C, and the third transistor T3 may be the third transistor T3 described with reference to FIG. 6A to FIG. 6C.

The first transistor T1 (or a driving transistor) may include a first gate electrode GE1, a first active pattern ACT1, a first source area SE1, and a first drain area DE1.

The first gate electrode GE1 may be connected to a second source area SE2 of the second transistor T2 through a second connection wire CNL2. The first gate electrode GE1 may be formed and/or provided on the gate insulating layer GI. The first gate electrode GE1 may be the second conductive layer CL2 provided on the gate insulating layer GI. The first gate electrode GE1 may be provided at the same layer, may include the same material, and may be formed by the same process, as the scan line Si.

The second connection wire CNL2 may be the third conductive layer CL3 provided and/or formed on the interlayer insulating layer ILD. The second connection wire CNL2 may be provided at the same layer, may include the same material, and may be formed by the same process, as the data line Dj and the first and second power lines PL1 and PL2. One end of the second connection wire CNL2 may be connected to the first gate electrode GE1 through a corresponding contact hole CH penetrating the interlayer insulating layer ILD. The other end of the second connection wire CNL2 may be connected to the second source area SE2 through a corresponding contact hole CH sequentially penetrating the interlayer insulating layer ILD and the gate insulating layer GI.

The first active pattern ACT1, the first source area SE1, and the first drain area DE1 may be semiconductor patterns made of a polysilicon, an amorphous silicon, an oxide semiconductor, or the like. The first active pattern ACT1, the first source area SE1, and the first drain area DE1 may be formed as a semiconductor layer in which no impurity is doped or as a semiconductor layer in which an impurity is doped. For example, the first source area SE1 and the first drain area DE1 may be formed as a semiconductor layer in which an impurity is doped, and the first active pattern ACT1 may be formed as a semiconductor layer in which no impurity is doped. As the impurity, for example, an n-type impurity may be used.

The first active pattern ACT1, the first source area SE1, and the first drain area DE1 may be provided and/or formed on the buffer layer BFL.

The first active pattern ACT1 is an area overlapping the first gate electrode GE1, and may be a channel area of the first transistor T1. When the first active pattern ACT1 is formed to be long, the channel area of the first transistor T1 may be formed to be long. In this case, a driving range of a gate voltage (or a scan signal) applied to the first transistor T1 may be widened. Accordingly, it is possible to finely control a grayscale of light emitted from the light emitting elements LD.

The first source area SE1 may be connected to (or may contact) one end of the first active pattern ACT1. In addition, the first source area SE1 may be connected to a third source area SE3 of the third transistor T3 through an upper electrode UE.

The upper electrode UE may be one electrode configuring the storage capacitor Cst. The upper electrode UE may be formed of the third conductive layer CL3 provided and/or formed on the interlayer insulating layer ILD. The upper electrode UE may be connected to the first source area SE1 through a corresponding contact hole CH sequentially penetrating the interlayer insulating layer ILD and the gate insulating layer GI. In addition, the upper electrode UE may be connected to the third source area SE3 of the third transistor T3 through a corresponding contact hole CH sequentially penetrating the interlayer insulating layer ILD and the gate insulating layer GI. Additionally, the upper electrode UE may be connected to some components of the display element part DPL through a corresponding contact hole CH sequentially penetrating the interlayer insulating layer ILD, the gate insulating layer GI, and the buffer layer BFL. A detailed description thereof will be described later with reference to the display element part DPL.

In the above-described embodiment, the upper electrode UE has been described as the third conductive layer CL3 provided and/or formed on the interlayer insulating layer ILD, but the present disclosure is not limited thereto. In one or more embodiments, when an additional insulating layer is disposed between the gate insulating layer GI and the interlayer insulating layer ILD, the upper electrode UE may be configured of a conductive layer provided and/or formed on the additional insulating layer.

The first drain area DE1 may be connected to (or may contact) the other end of the first active pattern ACT1. In addition, the first drain area DE1 may be connected to the first power line PL1 through a corresponding contact hole CH sequentially penetrating the interlayer insulating layer ILD and the gate insulating layer GI. Accordingly, a voltage of the first driving power source VDD may be applied to the first drain area DE1.

The second transistor T2 (or a switching transistor) may include a second gate electrode GE2, a second active pattern ACT2, a second source area SE2, and a second drain area DE2.

The second gate electrode GE2 may be connected to the scan line Si through a first connection wire CNL1. The second gate electrode GE2 may be the second conductive layer CL2 provided and/or formed on the gate insulating layer GI. Like the first gate electrode GE1, the second gate electrode GE2 may be provided at the same layer, may include the same material, and may be formed through the same process, as the scan line Si.

The first connection wire CNL1 may be the third conductive layer CL3 provided and/or formed on the interlayer insulating layer ILD. One end of the first connection wire CNL1 may be connected to the scan line Si through a corresponding contact hole CH penetrating the interlayer insulating layer ILD. In addition, the other end of the first connection wire CNL1 may be connected to the second gate electrode GE2 through a corresponding contact hole CH penetrating the interlayer insulating layer ILD.

In the above-described embodiment (e.g., see FIGS. 7-9), it has been described that the second gate electrode GE2 is non-integrally provided with the scan line Si to be connected to the scan line Si through a separate connection means, for example, the first connection wire CNL1, but the present disclosure is not limited thereto. In one or more embodiments, the second gate electrode GE2 may be integrally provided with the scan line Si. In this case, the second gate electrode GE2 may be provided as a portion of the scan line Si, or may be provided in a shape protruding from the scan line Si.

The second active pattern ACT2, the second source area SE2, and the second drain area DE2 may be semiconductor patterns made of a polysilicon, an amorphous silicon, an oxide semiconductor, or the like. The second active pattern ACT2, the second source area SE2, and the second drain area DE2 may be formed as a semiconductor layer in which no impurity is doped or as a semiconductor layer in which an impurity is doped. For example, the second source area SE2 and the second drain area DE2 may be formed as a semiconductor layer in which an impurity is doped, and the second active pattern ACT2 may be formed as a semiconductor layer in which no impurity is doped. As the impurity, for example, an n-type impurity may be used.

The second active pattern ACT2, the second source area SE2, and the second drain area DE2 may be provided and/or formed on the buffer layer BFL.

The second active pattern ACT2 is an area overlapping the second gate electrode GE2 in the third direction DR3, and may be a channel area of the second transistor T2.

The second source area SE2 may be connected to (or may contact) one end of the second active pattern ACT2. In addition, the second source area SE2 may be connected to the first gate electrode GE1 through the second connection wire CNL2.

The second drain area DE2 may be connected to (or may contact) the other end of the second active pattern ACT2. In addition, the second drain area DE2 may be connected to the data line Dj through a corresponding contact hole CH sequentially penetrating the interlayer insulating layer ILD and the gate insulating layer GI. Accordingly, the data signal applied to the data line Dj may be transmitted to the second drain area DE2.

The third transistor T3 may include a third gate electrode GE3, a third active pattern ACT3, a third source area SE3, and a third drain area DE3.

The third gate electrode GE3 may be connected to the control line CLi through a third connection wire CNL3. The third gate electrode GE3 may be the second conductive layer CL2 provided and/or formed on the gate insulating layer GI. The third gate electrode GE3 may be provided at the same layer, may include the same material, and may be formed by the same process, as the scan line Si, the control line CLi, and the first and second gate electrodes GE1 and GE2.

A third connection wire CNL3 may be the third conductive layer CL3 provided and/or formed on the interlayer insulating layer ILD. One end of the third connection wire CNL3 may be connected to the third gate electrode GE3 through a corresponding contact hole CH penetrating the interlayer insulating layer ILD. In addition, the other end of the third connection wire CNL3 may be connected to the control line CLi through the contact hole CH penetrating the interlayer insulating layer ILD.

In the above-described embodiment, it has been described that the third gate electrode GE3 is non-integrally provided with the control line CLi to be connected to the control line CLi through a separate connection means, for example, the third connection wire CNL3, but the present disclosure is not limited thereto. In one or more embodiments, the third gate electrode GE3 may be provided as a part of the control line CLi, or may be provided in a shape protruding from the control line CLi.

The third active pattern ACT3, the third source area SE3, and the third drain area DE3 may be semiconductor patterns made of a polysilicon, an amorphous silicon, an oxide semiconductor, or the like. The third active pattern ACT3, the third source area SE3, and the third drain area DE3 may be formed as a semiconductor layer in which no impurity is doped or as a semiconductor layer in which an impurity is doped. For example, the third source area SE3 and the third drain area DE3 may be formed as a semiconductor layer in which an impurity is doped, and the third active pattern ACT3 may be formed as a semiconductor layer in which no impurity is doped. As the impurity, for example, an n-type impurity may be used.

The third active pattern ACT3, the third source area SE3, and the third drain area DE3 may be provided and/or formed on the buffer layer BFL.

The third active pattern ACT3 is an area overlapping the third gate electrode GE3 in the third direction DR3, and may be a channel area of the third transistor T3.

The third source area SE3 may be connected to (or may contact) one end of the third active pattern ACT3. In addition, the third source area SE3 may be connected to the first source area SE1 through the upper electrode UE and the corresponding contact holes CH.

The third drain area DE3 may be connected to (or may contact) the other end of the third active pattern ACT3. In addition, the third drain area DE3 may be connected to the initialization power line IPL through a fourth connection line CNL4.

The fourth connection wire CNL4 may be the third conductive layer CL3 provided and/or formed on the interlayer insulating layer ILD. One end of the fourth connection wire CNL4 may be connected to the third drain area DE3 through a corresponding contact hole CH sequentially penetrating the interlayer insulating layer ILD and the gate insulating layer GI. In addition, the other end of the fourth connection wire CNL4 may be connected to the initialization power line IPL through a corresponding contact hole CH penetrating the interlayer insulating layer ILD.

The storage capacitor Cst may include a lower electrode LE and an upper electrode UE.

The lower electrode LE may be the second conductive layer CL2 provided and/or formed on the gate insulating layer GI. The lower electrode LE may be integrally provided with the first gate electrode GE1. When the lower electrode LE is integrally provided with the first gate electrode GE1, the lower electrode LE may be an area of the first gate electrode GE1.

The upper electrode UE is disposed to overlap the lower electrode LE, and may have a larger area than the lower electrode LE. A portion of the upper electrode UE may extend in the second direction DR2, and may overlap each of the first and third source areas SE1 and SE3. The upper electrode UE may be connected to each of the first and third source areas SE1 and SE3 through the corresponding contact holes CH. In addition, the upper electrode UE may be connected to the bottom metal layer BML through a corresponding contact hole CH.

The first insulating layer INS1 may be provided and/or formed on the third conductive layer CL3. For example, the first insulating layer INS1 may be provided and/or formed on the data line Dj, the first and second power lines PL1 and PL2, the upper electrode UE, the first to fifth connection wires CNL1 to CNL5, and the first to third fan-out lines FOL1 to FOL3. In one or more embodiments of the present disclosure, the first insulating layer INS1 may not be provided on the (1-1)-th to (3-1)-th pad electrodes PD1_1 to PD3_1.

The first insulating layer INS1 may include the same material as the buffer layer BFL and/or the gate insulating layer GI, or may include one or more materials selected from example materials discussed as constituent materials of the buffer layer BFL and/or the gate insulating layer GI. For example, the first insulating layer INS1 may include an inorganic insulating film including an inorganic material or an organic insulating film including an organic material.

In the above-described embodiment, the data line Dj and the first and second power lines PL1 and PL2 may be configured to be entirely provided in both the first and second areas A1 and A2 of the pixel area PXA.

A light blocking layer LBL may be provided and/or formed on the first insulating layer INS1. The light blocking layer LBL may include a light blocking material that prevents light leakage between the pixel PXL and pixels PXL adjacent thereto. In this case, the light blocking layer LBL may be a black matrix. The light blocking layer LBL may prevent a mixture of light respectively emitted from the adjacent pixels PXL. In one or more embodiments, the light blocking layer LBL is configured to include at least one light blocking material and/or reflective material, so that it allows the light emitted from the light emitting elements LD positioned in the second area A2 of the pixel area PXA to further proceed in the image display direction of the display device (e.g., the third direction DR3), thereby improving the light emission efficiency of the light emitting elements LD.

The above-described light blocking layer LBL may be provided in one area of the display area DA except for the emission area EMA and the non-display area NDA within the pixel area PXA.

Second and third insulating layers INS2 and INS3 may be sequentially provided and/or formed on the light blocking layer LBL.

The second insulating layer INS2 may be a protective layer that protects the light blocking layer LBL. The second insulating layer INS2 may be an inorganic insulating film including an inorganic material or an organic insulating film including an organic material. The third insulating layer INS3 may be provided and/or formed on the second insulating layer INS2, and may include the same material as the second insulating layer INS2.

The second and third insulating layers INS2 and INS3 may not be provided on the (1-1)-th to (3-1)-th pad electrodes PD1_1 to PD3_1 in the non-display area NDA. Accordingly, the (1-1)-th to (3-1)-th pad electrodes PD1_1 to PD3_1 may be exposed to the outside.

A (1-2)-th pad electrode PD1_2 may be provided on the (1-1)-th pad electrode PD1_1 exposed to the outside, a (2-2)-th pad electrode PD2_2 may be provided on the (2-1)-th pad electrode PD2_1 exposed to the outside, and a (3-2)-th pad electrode PD3_2 may be provided on the (3-1)-th pad electrode PD3_1 exposed to the outside.

The (1-2)-th pad electrode PD1_2 may be the fourth conductive layer CL4. The (1-2)-th pad electrode PD1_2 may be directly disposed on the (1-1)-th pad electrode PD1_1 to be connected to the (1-1)-th pad electrode PD1_1. The (1-2)-th pad electrode PD1_2 may be configured to directly contact one terminal of a driver implemented with a chip-on film or an integrated circuit.

The fourth conductive layer CL4 may be configured of various transparent conductive materials (or transparent substances). For example, the fourth conductive layer CL4 may include at least one of various transparent conductive materials such as an indium tin oxide (ITO), an indium zinc oxide (IZO), a zinc oxide (ZnO), an indium gallium zinc oxide (IGZO), and/or an indium tin zinc oxide (ITZO), and may be formed to be substantially transparent or translucent to satisfy a suitable light transmittance (e.g., a predetermined light transmittance or light transmittance). However, the materials of the fourth conductive layer CL4 is not limited to the above-described examples. In one or more embodiments, the fourth conductive layer CL4 may be configured of various opaque conductive materials. The opaque conductive material may include, for example, titanium (Ti), aluminum (Al), silver (Ag), and/or the like, but the present disclosure is not limited thereto. The fourth conductive layer CL4 may be formed as a single film or a multifilm.

The (2-2)-th pad electrode PD2_2 may be the fourth conductive layer CL4. The (2-2)-th pad electrode PD2_2 may be directly disposed on the (2-1)-th pad electrode PD2_1 to be connected to the (2-1)-th pad electrode PD2_1. The (2-2)-th pad electrode PD2_2 may be configured to directly contact one terminal of the driver.

The (3-2)-th pad electrode PD3_2 may be the fourth conductive layer CL4. The (3-2)-th pad electrode PD3_2 may be directly disposed on the (3-1)-th pad electrode PD3_1 to be connected to the (3-1)-th pad electrode PD3_1. The (3-2)-th pad electrode PD3_2 may be configured to directly contact one terminal of the driver.

The above-described (1-2)-th to (3-2)-th pad electrodes PD1_2 to PD3_2 may be provided at the same layer, may include the same material, and may be formed by the same process.

A fourth insulating layer INS4 may be provided and/or formed on the third insulating layer INS3.

The fourth insulating layer INS4 may be a planarization layer that alleviates a step caused by constituent elements disposed thereunder. In addition, the fourth insulating layer INS4 may be a protective layer for protecting all components disposed in the pixel area PXA. The fourth insulating layer INS4 may not be provided in the non-display area NDA so as to connect each of the (1-2)-th to (3-2)-th pad electrodes PD1_2 to PD3_2 and the driver.

Hereinafter, the display element part DPL of the pixel PXL will be described.

The display element part DPL may include a conductive pattern CP, first and second electrodes EL1 and EL2, a sixth connection wire CNL6, a bank BNK, light emitting elements LD, first and second contact electrodes CNE1 and CNE2, positioned in the second area A2 of the pixel area PXA.

The conductive pattern CP, the first and second electrodes EL1 and EL2, and the sixth connection wire CNL6 may be provided on the substrate SUB. The conductive pattern CP, the first and second electrodes EL1 and EL2, and the sixth connection wire CNL6 may be the first conductive layer CL1 provided and/or formed on the substrate SUB. The conductive pattern CP, the first and second electrodes EL1 and EL2, and the sixth connection wire CNL6 may be provided at the same layer, may include the same material, and may be formed by the same process, as the bottom metal layer BML provided in the first area A1 of the pixel area PXA.

The conductive pattern CP, the first and second electrodes EL1 and EL2, and the sixth connection wire CNL6 may be made of a material having a constant reflectivity so that light emitted from each of the light emitting elements LD proceeds in the image display direction of the display device (e.g., the third direction DR3). Each of the conductive pattern CP, the first and second electrodes EL1 and EL2, and the sixth connection wire CNL6 may include a conductive material (or a conductive substance) having a constant reflectivity. The conductive material (or a conductive substance) may include an opaque metal that is suitable for reflecting light emitted by the light emitting elements LD in the image display direction of the display device (e.g., the third direction DR3). The opaque metal may include, for example, silver (Ag), magnesium (Mg), aluminum (Al), platinum (Pt), palladium (Pd), gold (Au), nickel (Ni), neodymium (Nd), iridium (Ir), chromium (Cr), titanium (Ti), and/or an alloy thereof. In one or more embodiments, each of the conductive pattern CP, the first and second electrodes EL1 and EL2, and the sixth connection wire CNL6 may include a transparent conductive material (or a conductive substance). The transparent conductive material may include a conductive oxide such as an indium tin oxide (ITO), an indium zinc oxide (IZO), a zinc oxide (ZnO), and/or an indium tin zinc oxide (ITZO), and/or a conductive polymer such as poly(3,4-ethylenedioxythiophene) (PEDOT). When each of the conductive pattern CP, the first and second electrodes EL1 and EL2, and the sixth connection wire CNL6 includes the transparent conductive material, a separate conductive layer, which is made of an opaque metal for reflecting light emitted from the light emitting elements LD in the image display direction of the display device (e.g., in the third direction DR3), may be additionally included. However, the materials of the conductive pattern CP, the first and second electrodes EL1 and EL2, and the sixth connection wire CNL6 are not limited to the above-described materials.

In addition, each of the conductive pattern CP, the first and second electrodes EL1 and EL2, and the sixth connection wire CNL6 may be provided and/or formed as a single film, but the present disclosure is not limited thereto. In one or more embodiments, each of the conductive pattern CP, the first and second electrodes EL1 and EL2, and the sixth connection wire CNL6 may be provided and/or formed as a multi-layered film in which at least two or more of metals, alloys, conductive oxides, and conductive polymers are stacked. Each of the conductive pattern CP, the first and second electrodes EL1 and EL2, and the sixth connection wire CNL6 may be formed of a multi-layered film of at least a double-layered film or more to reduce or minimize distortion caused by signal delay when transmitting a signal (or voltage) to respective end portions of each of the light emitting elements LD. In one or more embodiments of the present disclosure, the conductive pattern CP, the first and second electrodes EL1 and EL2, and the sixth connection wire CNL6 may be configured of a single layer including aluminum neodymium (AlNd).

The conductive pattern CP may be spaced rom the first electrode EL1 when viewed in a plan view. Before the light emitting elements LD are aligned in the pixel area PXA, the conductive pattern CP may be provided in a form connected to the first electrode EL1. That is, before the light emitting elements LD are aligned, the conductive pattern CP and the first electrode EL1 may be connected to each other. After the light emitting elements LD are aligned, the conductive pattern CP and the first electrode EL1 may be spaced from each other to be electrically and/or physically separated from each other. When the light emitting elements LD are aligned in the pixel area PXA, the conductive pattern CP may be connected to a first alignment signal pad positioned in the non-display area NDA to receive an alignment signal (or an alignment voltage) from the first alignment signal pad to apply the alignment signal to the first electrode EL1. Accordingly, the first electrode EL1 may function as a first alignment electrode (or a first alignment wire) for aligning the light emitting elements LD. After the light emitting elements LD are aligned in the pixel area PXA, the first electrode EL1 may be electrically separated from the conductive pattern CP, and may be connected to the upper electrode UE through a corresponding contact hole CH to function as a driving electrode for driving the light emitting elements LD.

The sixth connection wire CNL6 may be connected to the second power line PL2 a corresponding the contact hole CH sequentially penetrating the interlayer insulating layer ILD, the gate insulating layer GI, and the buffer layer BFL. When the light emitting elements LD are aligned in the pixel area PXA, the sixth connection wire CNL6 may be connected to a second alignment signal pad positioned in the non-display area NDA to receive an alignment signal (or an alignment voltage) from the second alignment signal pad to apply the alignment signal to the second electrode EL2. Accordingly, the second electrode EL2 may function as a second alignment electrode (or a second alignment wire) for aligning the light emitting elements LD. After the light emitting elements LD are aligned in the pixel area PXA, the sixth connection wire CNL6 may be electrically separated from the second alignment signal pad. In this case, the sixth connection wire CNL6 may be electrically connected to the second power line PL2 through the corresponding contact hole CH, and the voltage of the second driving power source VSS from the second power line PL2 may be transmitted to the second electrode EL2 through the sixth connection wire CNL6. Accordingly, the second electrode EL2 may function as a driving electrode for driving the light emitting elements LD.

The sixth connection wire CNL6 may extend in the first direction DR1. The sixth connection wire CNL6 may be commonly provided to the pixel PXL and pixels PXL adjacent thereto. Accordingly, a plurality of pixels PXL disposed in the same pixel row, for example, the first pixel row, in the first direction DR1 may be commonly connected to the sixth connection wire CNL6.

The second electrode EL2 may be branched from the sixth connection wire CNL6 in the second direction DR2. The second electrode EL2 may be integrally provided with the sixth connection wire CNL6. Accordingly, the second electrode EL2 and the sixth connection wire CNL6 may be electrically and/or physically connected to each other. In this case, the sixth connection wire CNL6 may be an area of the second electrode EL2, or the second electrode EL2 may be an area of the sixth connection wire CNL6. However, the present disclosure is not limited thereto, and in one or more embodiments, the second electrode EL2 and the sixth connection wire CNL6 may be separately formed from each other to be electrically connected to each other through a separate connection means and the like.

The alignment signal applied to the first electrode EL1 and the alignment signal applied to the second electrode EL2 may be signals having a voltage difference and/or a phase difference to the extent that the light emitting elements LD may be aligned between the first and second electrodes EL1 and EL2. At least one of the alignment signal applied to the first electrode EL1 and the alignment signal applied to the second electrode EL2 may be an AC signal, but the present disclosure is not limited thereto.

In one or more embodiments of the present disclosure, the first electrode EL1 may be an anode electrode, and the second electrode EL2 may be a cathode electrode.

The first electrode EL1 and the second electrode EL2 may be positioned in the emission area EMA of the second area A2 of the pixel area PXA. The emission area EMA may be an area from which light is finally emitted within the pixel area PXA.

The buffer layer BFL may be provided and/or formed on the first electrode EL1 and the second electrode EL2. The buffer layer BFL may have the same configuration as the buffer layer BFL positioned in the first area A1 of the pixel area PXA. The buffer layer BFL may expose a portion of the first electrode EL1 and a portion of the second electrode EL2 to the outside.

The light emitting elements LD may be disposed on the buffer layer BFL.

Each of the light emitting elements LD may be an ultra-small light emitting diode using a material having an inorganic crystal structure, for example, having a size as small as nano-scale or micro-scale. For example, each of the light emitting elements LD may be an ultra-small light emitting diode manufactured by an etching method or an ultra-small light emitting diode manufactured by a growth method.

At least two to several tens of light emitting elements LD may be aligned and/or provided in the pixel area PXA, but the number of the light emitting elements LD is not limited thereto. In one or more embodiments, the number of light emitting elements LD aligned and/or provided in the pixel area PXA may be variously changed. The light emitting elements LD may be positioned in the emission area EMA of the pixel area PXA.

Each of the light emitting elements LD may emit one of color light and/or white light. Each of the light emitting elements LD may be arranged on the buffer layer BFL between the first electrode EL1 and the second electrode EL2 such that the extending direction (or the length L direction) thereof is parallel to the first direction DR1. The light emitting elements LD may be prepared in a form dispersed in a solution and then be sprayed in the pixel area PXA.

The light emitting elements LD may be injected in the pixel area PXA of each pixel PXL through an inkjet printing method, a slit coating method, or other methods. For example, the light emitting elements LD may be mixed with a volatile solvent to be supplied in the pixel area PXA through an inkjet printing method or a slit coating method. In this case, when a corresponding alignment signal is applied to each of the first and second electrodes EL1 and EL2 provided in the pixel area PXA, an electric field may be formed between the first and second electrodes EL1 and EL2. Accordingly, the light emitting elements LD may be aligned between the first electrode EL1 and the second electrode EL2.

After the light emitting elements LD are arranged, the light emitting elements LD are finally arranged and/or provided in the pixel area PXA of each pixel PXL by volatilizing the solvent or eliminating the solvent in another manner.

The bank BNK may be positioned in a peripheral area surrounding at least one side of the emission area EMA of the pixel PXL. Here, the peripheral area is the non-emission area NEMA from which light is not emitted, and may be one area of the second area A2 of the pixel area PXA. The bank BNK may be provided and/or formed only in the second area A2. When viewed in a plan view, the bank BNK may be provided in a form that surrounds (or encloses) the light emitting elements LD aligned in the emission area EMA. Alternatively, the bank BNK may be provided in a form that surrounds (or encloses) at least a portion of the first and second electrodes EL1 and EL2 positioned in the emission area EMA when viewed in a plan view.

The bank BNK may be a structure defining (or partitioning) the emission area EMA of the corresponding pixel PXL and the emission area EMA of each of the pixels PXL adjacent thereto. In addition, the bank BNK may define alignment positions of the light emitting elements LD when the light emitting elements LD are aligned in the pixel area PXA. The bank BNK may be configured to include at least one light blocking material and/or a reflective material to prevent light leakage from occurring between the corresponding pixel PXL and pixels PXL adjacent thereto. In one or more embodiments, the bank BNK may include a transparent material (or a transparent substance). As the transparent material, for example, a polyamide resin, a polyimide resin, and the like may be included, but the present disclosure is not limited thereto. According to one or more embodiments, a reflective material layer may be formed on the bank BNK to further improve the efficiency of light emitted from the corresponding pixel PXL. The bank BNK may be provided and/or formed on the buffer layer BFL provided in the second area A2 of the pixel area PXA.

An interlayer insulating layer (ILD, INSP) may be provided on each of the light emitting elements LD. The interlayer insulating layer (ILD, INSP) may have the same configuration as the interlayer insulating layer ILD positioned in the first area A1 of the pixel area PXA. The interlayer insulating layer (ILD, INSP) may be formed as a single film or multi-film, and may include an inorganic insulating film including at least one inorganic material or an organic insulating film including at least one organic material.

Within the emission area EMA, the interlayer insulating layer (ILD, INSP) may be provided and/or formed on the light emitting elements LD to partially cover an outer surface (e.g., an outer peripheral or circumferential surface or a surface) of each of the light emitting elements LD and to expose both end portions of the light emitting elements LD to the outside. The interlayer insulating layer (ILD, INSP) may further fix each of the light emitting elements LD. The interlayer insulating layer (ILD, INSP) may include an inorganic insulating film suitable for protecting the active layer 12 of each of the light emitting elements LD from external oxygen and moisture. However, the present disclosure is not limited thereto. Depending on the design condition of the display device to which the light emitting elements LD are applied, the interlayer insulating layer (ILD, INSP) may be configured as an organic insulating film including an organic material.

After the alignment of the light emitting elements LD is completed in the pixel area PXA, the interlayer insulating layer (ILD, INSP) is formed on the light emitting elements LD so that it is possible to prevent the light emitting elements LD from being separated from the aligned positions. Before the interlayer insulating layer (ILD, INSP) is formed, as shown in FIG. 9, when there is an empty gap (or space) between the buffer layer BFL and the light emitting elements LD, the empty gap may be filled with the interlayer insulating layer (ILD, INSP) in the process of forming the interlayer insulating layer (ILD, INSP). Accordingly, the interlayer insulating layer (ILD, INSP) may be configured as an organic insulating film suitable for filling the empty gap between the buffer layer BFL and the light emitting elements LD.

In addition, the interlayer insulating layer (ILD, INSP) may be provided even in a peripheral area surrounding the emission area EMA, for example, the non-emission area NEMA. In this case, the interlayer insulating layer (ILD, INSP) may be provided and/or formed on the gate insulating layer GI positioned in the non-emission area NEMA of the second area A2.

In the emission area EMA of the pixel area PXA, the interlayer insulating layer (ILD, INSP) may cover one surface, for example, a portion of an upper surface of each of the light emitting elements LD, and may expose both end portions of each of the light emitting elements LD. The interlayer insulating layer (ILD, INSP) provided in the emission area EMA may be positioned only on the light emitting elements LD to be provided as an insulating pattern independent of the interlayer insulating layer (ILD, INSP) positioned in the non-emission area NEMA adjacent to the emission area EMA. In the following embodiment, for convenience, the interlayer insulating layer (ILD, INSP) that is respectively provided on the light emitting elements LD to expose both end portions of each of the light emitting elements LD to the outside is referred to as an "insulating pattern INSP".

The first and second contact electrodes CNE1 and CNE2 may be configured to electrically (e.g., more stably electrically) connect each of the first and second electrodes EL1 and EL2 and the light emitting elements LD. The first and second contact electrodes CNE1 and CNE2 may be the fourth conductive layer CL4 provided and/or formed on the substrate SUB after the above-described interlayer insulating layer (ILD, INSP) is formed. In one or more embodiments of the present disclosure, the first and second contact electrodes CNE1 and CNE2 may be provided at the same layer, may include the same material, and may be formed by the same process, as the (1-2)-th to (3-2)-th pad electrodes PD1_2 to PD3_2 provided in the non-display area NDA.

The first contact electrode CNE1 may be provided on the buffer layer BFL positioned in the second area A2, and may be connected to the first electrode EL1 exposed to the outside. In addition, the first contact electrode CNE1 may be connected to one of both end portions of each of the light emitting elements LD. A suitable signal (e.g., a predetermined signal) applied to the first electrode EL1 may be transmitted to one end of each of the light emitting elements LD through the first contact electrode CNE1.

The second contact electrode CNE2 may be provided on the buffer layer BFL positioned in the second area A2, and may be connected to the second electrode EL2 exposed to the outside. In addition, the second contact electrode CNE2 may be connected to the other one of both end portions of each of the light emitting elements LD. A suitable signal (e.g., a predetermined signal) applied to the second electrode EL2 may be transmitted to the remaining end portions of each of the light emitting elements LD through the second contact electrode CNE2.

When viewed in a plan view, each of the first and second contact electrodes CNE1 and CNE2 may have a bar shape extending in the second direction DR2, but the present disclosure is not limited thereto. In one or more embodiments, the shape of each of the first and second contact electrodes CNE1 and CNE2 may be variously changed within a range in which it is electrically stably connected to each of the light emitting elements LD. In addition, the shape of each of the first and second contact electrodes CNE1 and CNE2 may be variously changed in consideration of the connection relationship with electrodes disposed thereunder.

The first and second contact electrodes CNE1 and CNE2 may be positioned in the emission area EMA of the pixel area PXA.

The first and second insulating layers INS1 and INS2 may be sequentially provided and/or formed on the first and second contact electrodes CNE1 and CNE2. The first insulating layer INS1 may have the same configuration as the first insulating layer INS1 positioned in the first area A1 of the pixel area PXA, and the second insulating layer INS2 may have the same configuration as the second insulating layer INS2 positioned in the first area A1. Each of the first and second insulating layers INS1 and INS2 may be an inorganic insulating film including an inorganic material or an organic insulating film including an organic material. As an example, at least one of the first and second insulating layers INS1 and INS2 may have a structure in which at least one inorganic insulating film or at least one organic insulating film is alternately stacked. The second insulating layer INS2 may be an encapsulation layer that may entirely cover the display element part DPL to block moisture or moisture from the outside from being introduced into the display element part DPL including the light emitting elements LD.

A light converting pattern layer LCP may be provided and/or formed on the second insulating layer INS2. The light converting pattern layer LCP may be positioned in the emission area EMA of the pixel area PXA. The light converting pattern layer LCP may include a color converting layer CCL and a color filter CF.

The color converting layer CCL may include color converting particles 0D corresponding to a specific color. The color filter CF may selectively transmit the light of the specific color.

The color converting layer CCL may include color converting particles QD that converts light emitted from the light emitting elements LD disposed in the pixel PXL into light of a specific color. For example, when the pixel PXL is a red pixel, the color converting layer may include color converting particles QD of red quantum dots that convert light emitted from the light emitting elements LD into red light. As another example, when the pixel PXL is a green pixel, the color converting layer may include color converting particles QD of green quantum dots that convert light emitted from the light emitting elements LD into green light. As another example, when the pixel PXL is a blue pixel, the color converting layer may include color converting particles QD of blue quantum dots that convert light emitted from the light emitting elements LD into blue light.

The third insulating layer INS3 may be provided and/or formed on the color converting layer CCL. The third insulating layer INS3 may have the same configuration as the third insulating layer INS3 positioned in the first area A1 of the pixel area PXA. The third insulating layer INS3 may include the same material as the second insulating layer INS2, or may include one or more materials selected from the materials illustrated as constituent materials of the second insulating layer INS2. For example, the third insulating layer INS3 may include an inorganic insulating film including an inorganic material or an organic insulating film including an organic material.

The color filter CF may be provided and/or formed on the third insulating layer INS3. The color filter CF may form the light converting pattern layer LCP together with the color converting layer CCL, and may include a color filter material that selectively transmits light of a specific color converted by the color converting layer CCL. The color filter CF may include a red color filter, a green color filter, and a blue color filter. The above-described color filter CF may be provided in the emission area EMA of the pixel area PXA to correspond to the color converting layer CCL.

The fourth insulating layer INS4 may be provided on the color filter CF. The fourth insulating layer INS4 may have the same configuration as the fourth insulating layer INS4 positioned in the first area A1 of the pixel area PXA. The fourth insulating layer INS4 may be a planarization layer that alleviates a step generated by constituent elements disposed thereunder in the second area A2 of the pixel area PXA.

When a driving current flows from the first power line PL1 to the second power line PL2 through the pixel circuit PXC by the first transistor T1 included in the pixel circuit PXC of the pixel PXL, the driving current may flow into the emission unit (refer to "EMU" in FIG. 6A to FIG. 6C) of the pixel PXL through the sixth transistor T6 and the upper electrode UE. For example, the driving current is supplied to the first electrode EL1 through the upper electrode UE and a corresponding contact hole CH, and the driving current flows to the second electrode EL2 through the light emitting elements LD. Accordingly, each of the light emitting elements LD may emit light with luminance corresponding to a distributed current.

As described above, each of the pixel circuit part PCL and the display element part DPL of the pixel PXL may be provided as a multilayer including at least one or more conductive layer and at least one or more insulating layer provided and/or formed on one surface of the substrate SUB. At least one layer of the pixel circuit part PCL and at least one layer of the display element part DPL may be provided at the same layer, may include the same material, and may be formed by the same process.

In addition, according to the above-described embodiment, by forming the components included in the pixel circuit part PCL and the components included in the display element part DPL by the same process, it is possible to reduce the number of masks compared to a conventional display device in which the pixel circuit part PCL and the display element part DPL are respectively formed by separate processes, so that the display device in which the manufacturing process is simplified may be provided. When the manufacturing process of the display device is simplified, the manufacturing cost of the display device may be reduced.

Additionally, according to the above-described embodiment, by intensively aligning the light emitting elements LD in the second area A2 in which the display element part DPL is positioned in the pixel area PXA of the pixel PXL, in a desired area (or a target area), for example, in the second area A2, the alignment distribution of the light emitting elements LD in the pixel PXL and the alignment distribution of the light emitting elements LD in the adjacent pixels PXL may be made uniform. In this case, the display device may have a uniform output light distribution in the entire area.

In addition, according to the above-described embodiment, when the light emitting elements LD are intensively aligned in a target area, the number of unaligned light emitting elements LD may be reduced. Accordingly, loss of the light emitting elements LD may be reduced or minimized, and abnormal misalignment in which the light emitting elements LD are aligned in an unwanted area may be prevented.

FIG. 10A to FIG. 10M sequentially illustrate cross-sectional views of a manufacturing method of the display device illustrated in FIG. 8.

Hereinafter, a manufacturing method of the display device according to one or more embodiments of the present disclosure shown in FIG. 8 will be sequentially described with reference to FIG. 10A to FIG. 10M.

Referring to FIG. 1 to FIG. 5, FIG. 7, FIG. 8, and FIG. 10A, the substrate SUB is provided.

The first conductive layer CL1 made of a conductive material (or a conductive substance) with high reflectivity is respectively formed in the first area A1 and the second area A2 on the substrate SUB.

The first conductive layer CL1 of the first area A1 may be a first conductive layer positioned on the substrate SUB from among the conductive layers included in the pixel circuit part PCL, and the first conductive layer CL1 of the second area A2 may be a first conductive layer positioned on the substrate SUB from among the conductive layers included in the display element part DPL.

The first conductive layer CL1 of the pixel circuit part PCL and the first conductive layer CL1 of the display element part DPL may be provided at the same layer, may include the same material, and may be formed by the same process.

The first conductive layer CL1 of the pixel circuit part PCL may include the bottom metal layer BML. The first conductive layer CL1 of the display element part DPL may include the first and second electrodes EL1 and EL2, the conductive pattern CP, and the sixth connection wire CNL6.

Referring to FIG. 1 to FIG. 5, FIG. 7, FIG. 8, FIG. 10A, and FIG. 10B, the buffer layer BFL is formed on the substrate SUB including the first conductive layer CL1. Then, a semiconductor layer SCL is formed on the buffer layer BFL.

The semiconductor layer SCL may be made of silicon, that is, amorphous silicon, or polysilicon. When the semiconductor layer SCL is made of amorphous silicon, a crystallization process may be further performed by using a laser or the like.

In one or more embodiments, the semiconductor layer SCL may be made of a semiconductor oxide including a binary compound ($AB_x$), a ternary compound ($AB_xC_y$), a quaternary compound ($AB_xC_yD_z$), and/or the like containing indium (In), zinc (Zn), gallium (Ga), tin (Sn), titanium (Ti), aluminum (Al), hafnium (Hf), zirconium (Zr), and/or magnesium (Mg). These may be used alone or in combination with each other.

The semiconductor layer SCL may be provided only in the first area A1 included in the pixel area PXA of the pixel PXL, but the present disclosure is not limited thereto. In one or more embodiments, the semiconductor layer SCL may be provided in the second area A2 included in the pixel area PXA.

Referring to FIG. 1 to FIG. 5, FIG. 7, FIG. 8, and FIG. 10A to FIG. 10C, the gate insulating layer GI is formed on the buffer layer BFL including the semiconductor layer SCL. The gate insulating layer GI may be formed only in the pixel area PXA except for the emission area EMA.

Next, the second conductive layer CL2 is formed on the gate insulating layer GI.

The second conductive layer CL2 may include the lower electrode LE of the storage capacitor Cst, the first to third gate electrodes GE1 to GE3, the initialization power line IPL, the control line CLi, and the scan line Si, positioned in the first area A1 of the pixel area PXA.

One area of the semiconductor layer SCL overlapping the first gate electrode GE1 may be the first active pattern ACT1. Both side portions of the first active pattern ACT1 that do not overlap the first gate electrode GE1 may be the first source area SE1 and the first drain area DE1. The first active pattern ACT1, the first gate electrode GE1, the first source area SE1, and the first drain area DE1 may configure the first transistor T1.

One area of the semiconductor layer SCL overlapping the second gate electrode GE2 may be the second active pattern ACT2. Both side portions of the second active pattern ACT2 that do not overlap the second gate electrode GE2 may be the second source area SE2 and the second drain area DE2. The second active pattern ACT2, the second gate electrode GE2, the second source area SE2, and the second drain area DE2 may configure the second transistor T2.

One area of the semiconductor layer SCL overlapping the third gate electrode GE3 may be the third active pattern ACT3. Both side portions of the third active pattern ACT3 that do not overlap the third gate electrode GE3 may be the third source area SE3 and the third drain area DE3. The third active pattern ACT3, the third gate electrode GE3, the third source area SE3, and the third drain area DE3 may configure the third transistor T3.

Referring to FIG. 1 to FIG. 5, FIG. 7, FIG. 8, and FIG. 10A to FIG. 10D, the bank BNK is formed on the buffer layer BFL of the second area A2 of the pixel area PXA. The bank BNK may be positioned in the non-emission area (refer to "NEMA" in FIG. 9) that is a peripheral area in the second area A2. The bank BNK may be provided in a form that surrounds at least one side of the first and second electrodes EL1 and EL2 positioned in the emission area EMA when viewed in a plan view.

The bank BNK may be provided in the non-emission area NEMA to guide the alignment positions of the light emitting elements LD when aligning the light emitting elements LD in the pixel area PXA.

Referring to FIG. 1 to FIG. 5, FIG. 7, FIG. 8, and FIG. 10A to FIG. 10E, by applying a corresponding alignment signal (or an alignment voltage) to each of the first electrode EL1 and the second electrode EL2 through the conductive pattern CP and the sixth connection line CNL6, an electric field is formed between the first electrode EL1 and the second electrode EL2. In this case, the alignment signal from the first alignment signal pad may be transmitted to the first electrode EL1 through the conductive pattern CP, and the alignment signal from the second alignment signal pad may be transmitted to the second electrode EL2 through the sixth connection wire CNL6.

Each of the first electrode EL1 and the second electrode EL2 may be an alignment electrode (or an alignment wire) for aligning the light emitting elements LD in the second area A2 of the pixel area PXA.

When an alignment signal (or an alignment voltage) of a DC power source or an AC power source having a suitable voltage (e.g., a predetermined voltage) and a suitable period (e.g., a predetermined period) is applied to each of the first electrode EL1 and the second electrode EL2, an electric field according to a potential difference between the first and second electrodes EL1 and EL2 may be formed between the first electrode EL1 and the second electrode EL2. In the state in which an electric field is formed between the first and second electrodes EL1 and EL2, a mixed solution including the light emitting elements LD is injected into the pixel area PXA by using an inkjet printing method or the like. For example, an inkjet nozzle may be disposed on the buffer layer BFL of the second area A2, and the solvent mixed with a plurality of light emitting elements LD may be injected into the pixel area PXA through the inkjet nozzle. Here, the solvent may be one or more of acetone, water, alcohol, and toluene, but the present disclosure is not limited thereto. For example, the solvent may be in a form of ink or a paste. The method of injecting the light emitting elements LD into the pixel area PXA is not limited to the above-described embodiment, and the method of injecting the light emitting elements LD may be variously changed.

After the light emitting elements LD are injected, the solvent may be removed.

When the light emitting elements LD are injected into the pixel area PXA, self-alignment of the light emitting elements LD may be induced due to an electric field formed between the first and second electrodes EL1 and EL2. Accordingly, the light emitting elements LD may be aligned between the first electrode EL1 and the second electrode EL2. For example, each of the light emitting elements LD may be aligned on the buffer layer BFL positioned in the emission area EMA surrounded by the bank BNK in the second area A2 of the pixel area PXA.

Referring to FIG. 1 to FIG. 5, FIG. 7, FIG. 8, and FIG. 10A to FIG. 10F, after the insulating material layer is applied on the substrate SUB on which the light emitting elements LD are aligned, a process using a mask is performed to form the interlayer insulating layer ILD including the plurality of contact holes CH.

Through the above-described process, the contact holes CH that sequentially pass through the interlayer insulating layer ILD, the gate insulating layer GI, and the buffer layer BFL to expose a portion of the bottom metal layer BML, a portion of each of the first and second electrodes EL1 and EL2, and a portion of the sixth connection wire CNL6, respectively, the contact holes CH that sequentially pass through the interlayer insulating layer ILD and the gate insulating layer GI to expose a portion of each of the first to third source areas SE1 to SE3, and the contact holes CH that expose a portion of each of the first to third drain areas DE1 to DE3, may be formed.

In addition, by the above-described process, the contact holes CH that pass through the interlayer insulating layer ILD to expose a portion of the scan line Si, a portion of the control line CLi, and a portion of the initialization power line IPL, respectively, may be formed.

Additionally, by the above-described process, the contact holes CH that pass through the interlayer insulating layer ILD to expos a portion of each of the first to third gate electrodes GE1 to GE3 may be formed.

In addition, by the above-described process, one surface of the buffer layer BFL positioned in the emission area EMA of the second area A2 of the pixel area PXA may be at least exposed to the outside.

The interlayer insulating layer ILD manufactured by the above-described process may be formed on the bank BNK and the light emitting elements LD, respectively, in the second area A2 to completely cover the bank BNK and the light emitting elements LD.

Additionally, by the above-described process, by removing a portion of the conductive pattern CP and a portion of the first electrode EL1 to electrically separate the conductive pattern CP and the first electrode EL1, and the pixel PXL may be driven independently (or separately) from the pixels PXL adjacent thereto.

Referring to FIG. 1 to FIG. 5, FIG. 7, FIG. 8, and FIG. 10A to FIG. 10G, the third conductive layer CL3 is formed on the interlayer insulating layer ILD.

The third conductive layer CL3 may include the first to fifth connection wires CNL1 to CNL5 and the upper electrode UE of the storage capacitor Cst that are positioned in the first area A1 of the pixel area PXA. In addition, the third conductive layer CL3 may include the data line Dj and the first and second power lines PL1 and PL2 that are entirely positioned in the first and second areas A1 and A2 of the pixel area PXA. Additionally, the third conductive layer CL3 may include the first to third fan-out lines FOL1 to FOL3 and the (1-1)-th to (3-1)-th pad electrodes PD1_1 to PD3_1 positioned in the non-display area NDA.

The data line Dj may be electrically connected to the second drain area DE2 through a corresponding contact hole CH sequentially penetrating the interlayer insulating layer ILD and the gate insulating layer GI. The data line Dj may be integrally provided with the first fan-out line FOL1 and the (1-1)-th pad electrode PD1_1 of the non-display area NDA.

The first power line PL1 may be electrically connected to the first drain area DE1 through a corresponding contact hole CH sequentially penetrating the interlayer insulating layer ILD and the gate insulating layer GI. The first power line PL1 may be integrally provided with the second fan-out line FOL2 and the (2-1)-th pad electrode PD2_1 of the non-display area NDA.

The second power line PL2 may be electrically connected to the sixth connection wire CNL6 through a corresponding contact hole CH sequentially penetrating the interlayer insulating layer ILD, the gate insulating layer GI, and the buffer layer BFL. The second power line PL2 may be integrally provided with the third fan-out line FOL3 and the (3-1)-th pad electrode PD3_1 of the non-display area NDA.

The upper electrode UE may be electrically connected to the bottom metal layer BML through a corresponding contact hole CH sequentially penetrating the interlayer insulating layer ILD, the gate insulating layer GI, and the buffer layer BFL. In addition, the upper electrode UE may be electrically connected to each of the first source area SE1 and the third source area SE3 through a corresponding contact hole CH sequentially penetrating the interlayer insulating layer ILD and the gate insulating layer GI. Additionally, the upper electrode UE may be electrically connected to the first electrode EL1 through a corresponding contact holes CH sequentially penetrating the interlayer insulating layer ILD, the gate insulating layer GI, and the buffer layer BFL.

The first connection wire CNL1 may be electrically connected to each of the scan line Si and the second gate electrode GE2 through a corresponding contact holes CH penetrating the interlayer insulating layer ILD.

The second connection wire CNL2 may be electrically connected to the second source area SE2 through a corresponding contact hole CH sequentially penetrating the interlayer insulating layer ILD and the gate insulating layer GI, and may be electrically connected to the first gate electrode GE1 through a corresponding contact hole CH penetrating the interlayer insulating layer ILD.

The third connection wire CNL3 may be electrically connected to the third gate electrode GE3 through a corresponding contact hole CH penetrating the interlayer insulating layer ILD, and may be electrically connected to the control line CLi through a corresponding contact hole CH penetrating the interlayer insulating layer ILD.

The fourth connection wire CNL4 may be electrically connected to the third drain area DE3 through a corresponding contact hole CH sequentially penetrating the interlayer insulating layer ILD and the gate insulating layer GI, and may be electrically connected to the initialization power line IPL through a corresponding contact hole CH penetrating the interlayer insulating layer ILD.

The fifth connection wire CNL5 may be electrically connected to the bottom metal layer BML through a corresponding contact hole CH sequentially penetrating the interlayer insulating layer ILD, the gate insulating layer GI, and the buffer layer BFL, and may be electrically connected to the first source area SE1 through a corresponding contact hole CH sequentially penetrating the interlayer insulating layer ILD and the gate insulating layer GI.

Referring to FIG. 1 to FIG. 5, FIG. 7, FIG. 8, and FIG. 10A to FIG. 10H, a process using a mask is performed to form the insulating pattern INSP in the emission area EMA included in the second area A2 of the pixel area PXA, and the interlayer insulating layer ILD positioned on the bank BNK positioned in the non-emission area NEMA of the second area A2 is removed.

The insulating pattern INSP may be positioned on one surface of each of the light emitting elements LD within the emission area EMA, for example, on the upper surface thereof in the third direction DR3, and may expose both end portions of each of the light emitting elements LD to the outside. The insulating pattern INSP may include the same material as the interlayer insulating layer ILD described with reference to FIG. 10F.

Referring to FIG. 1 to FIG. 5, FIG. 7, FIG. 8, and FIG. 10A to FIG. 10I, the fourth conductive layer CL4 is formed in the non-display area NDA and the emission area EMA.

The fourth conductive layer CL4 of the non-display area NDA may include the (1-2)-th to (3-2)-th pad electrodes PD1_2 to PD3_2. The (1-2)-th pad electrode PD1_2 may be directly disposed on the (1-1)-th pad electrode PD1_1 exposed to the outside to be connected to the (1-1)-th pad electrode PD1_1. The (2-2)-th pad electrode PD2_2 may be directly disposed on the (2-1)-th pad electrode PD2_1 exposed to the outside to be connected to the (2-1)-th pad electrode PD2_1. The (3-2)-th pad electrode PD3_2 may be directly disposed on the (3-1)-th pad electrode PD3_1 exposed to the outside to be connected to the (3-1)-th pad electrode PD3_1.

The first contact electrode CNE1 may be provided on the buffer layer BFL of the emission area EMA, and may overlap the first electrode EL1 and one of both end portions of each of the light emitting elements LD. The first contact electrode CNE1 may be connected to the first electrode EL1 exposed to the outside, and may be connected to one end portion of each of the light emitting elements LD.

The second contact electrode CNE2 may be provided on the buffer layer BFL of the emission area EMA, and may overlap the second electrode EL2 and the other end portion of both end portions of each of the light emitting elements LD. The second contact electrode CNE2 may be connected to the second electrode EL2 exposed to the outside, and may be connected to the other end portion of each of the light emitting elements LD.

Referring to FIG. 1 to FIG. 5, FIG. 7, FIG. 8, and FIG. 10A to FIG. 10J, the first insulating layer INS1 is formed on the fourth conductive layer CL4, and the light blocking layer LBL is formed thereon.

The first insulating layer INS1 may be provided only in the first and second areas A1 and A2 of the pixel area PXA, and may not be provided in the non-display area NDA. Accordingly, the (1-2)-th to (3-2)-th pad electrodes PD1_2 to PD3_2 that are the fourth conductive layer CL4 positioned in the non-display area NDA may be exposed to the outside.

The first insulating layer INS1 may be provided on the data line Dj, the upper electrode UE, the first and second power lines PL1 and PL2, the first to fifth connection wires CNL1 to CNL5 corresponding to the third conductive layer CL3 in the first area A1 of the pixel area PXA, respectively, to protect the third conductive layer CL3.

In addition, the first insulating layer INS1 may be provided on the first and second contact electrodes CNE1 and CNE2 corresponding to the fourth conductive layer CL4 in the second area A2 of the pixel area PXA to protect the first and second contact electrodes CNE1 and CNE2.

The light blocking layer LBL may be provided on the first insulating layer INS1 of the first area A1 of the pixel area PXA. In addition, in the second area A2 of the pixel area PXA, the light blocking layer LBL may be provided on the first insulating layer INS1 of an area other than the emission area EMA in which the light emitting elements LD are aligned to emit light, for example, of the non-emission area NEMA.

The light blocking layer LBL may include a light blocking material that prevents light leakage defects between the pixel PXL and pixels PXL adjacent thereto, and may include, for example, a black matrix.

Referring to FIG. 1 to FIG. 5, FIG. 7, FIG. 8, and FIG. 10A to FIG. 10K, the second insulating layer INS2 is formed on the light blocking layer LBL and the first insulating layer INS1.

Next, the color converting layer CCL including the color converting particles QD is formed on the second insulating layer INS2. The color converting layer CCL may be provided on the second insulating layer INS2 of the second area A2 to correspond to the emission area EMA of the pixel area PXA.

Subsequently, the third insulating layer INS3 is formed on the second insulating layer INS2 including the color converting layer CCL. The second and third insulating layers INS2 and INS3 may be an inorganic insulating film including an inorganic material or an organic insulating film including an organic material.

The second and third insulating layers INS2, and INS3 may be provided in the pixel area PXA except for the non-display area NDA. The (1-2)-th to (3-2)-th pad electrodes PD1_2 to PD3_2 positioned in the non-display area NDA may be exposed to the outside. Each of the (1-2)-th to (3-2)-th pad electrodes PD1_2 to PD3_2 exposed to the outside may be directly connected to a driver implemented with a chip-on film or an integrated circuit.

Referring to FIG. 1 to FIG. 5, FIG. 7, FIG. 8, and FIG. 10A to FIG. 10L, the color filter CF is formed on the third insulating layer INS3 on the color converting layer CCL. The color filter CF may be provided on one area of the third insulating layer INS3 to correspond to the color converting layer CCL. The color filter CF and the color converting layer CCL may configure the light converting pattern layer LCP that converts light emitted from the light emitting elements LD into light of a specific color and selectively transmits the light.

Referring to FIG. 1 to FIG. 5, FIG. 7, FIG. 8, and FIG. 10A to FIG. 10M, the fourth insulating layer INS4 is formed on the third insulating layer INS3. The fourth insulating layer INS4 may be provided only in the pixel area PXA.

In the display device formed through the above-described manufacturing process, the thickness may further be reduced, compared to a conventional display device in which the pixel circuit part PCL and the display element part DPL are disposed on one surface of the same substrate SUB and the display element part DPL is disposed on the pixel circuit part PCL.

In addition, in the display device formed through the above-described manufacturing process, by forming the components included in the pixel circuit part PCL and the components included in the display element part DPL by the same process, it is possible to reduce the number of masks compared to a conventional display device in which the pixel circuit part PCL and the display element part DPL are respectively formed by separate processes, thereby simplifying the manufacturing process and reducing the manufacturing cost.

FIG. 11A to FIG. 11L sequentially illustrate schematic cross-sectional views of a manufacturing method of a display device illustrated in FIG. 8.

In FIG. 11A to FIG. 11L, differences from the above-described embodiment will be mainly described in order to avoid duplicate descriptions with the above-described embodiment. In the present embodiment, parts not specifically described follow the above-described embodiment, and the same numbers as in the above-described embodiment indicate the same components, and similar numbers to those of the above-described embodiment indicate similar components.

The manufacturing method of the display device illustrated in FIGS. 11A to 11E may be substantially the same as the manufacturing method of the display device illustrated in FIG. 10A to 10E. Accordingly, a detailed description of the manufacturing method of the display device of FIG. 11A to FIG. 11E will be omitted in order to avoid a duplicate description.

Referring to FIG. 1 to FIG. 5, FIG. 7, FIG. 8, and FIG. 11A to FIG. 11E, the first conductive layer CL1 is formed on the substrate SUB, the buffer layer BFL is formed on the first conductive layer CL1, the semiconductor layer SCL is formed on the buffer layer BFL, the gate insulating layer GI is formed on the buffer layer BFL including the semiconductor layer SCL, and the second conductive layer CL2 is formed on the gate insulating layer GI. In addition, the bank BNK is formed in the second area A2 of the pixel area PXA.

An electric field is formed between the first and second electrodes EL1 and EL2 included in the first conductive layer CL1 by applying a corresponding alignment signal to each of the conductive pattern CP and the sixth connection wire CNL6 included in the first conductive layer CL1. After the light emitting elements LD are supplied in the state in which the electric field is formed between the first electrode EL1 and the second electrode EL2, the light emitting elements LD are aligned on the buffer layer BFL between the first electrode EL1 and the second electrode EL2.

Referring to FIG. 1 to FIG. 5, FIG. 7, FIG. 8, and FIG. 11A to FIG. 11F, after the insulating material layer is applied on the substrate SUB on which the light emitting elements LD are aligned, a process using a mask is performed to form the interlayer insulating layer ILD including the plurality of contact holes CH.

By the above-described process, the contact holes CH respectively exposing a portion of the bottom metal layer BML, a portion of the first electrode EL1, a portion of the second electrode EL2, and a portion of the sixth connection wire CNL6 that are included in the first conductive layer CL1, may be formed. In addition, by the above-described process, the contact holes CH exposing a portion of each of the first to third source areas SE1 to SE3 included in the semiconductor layer SCL and the contact holes CH exposing a portion of each of the first to third drain areas DE1 to DE3 included in the semiconductor layer SCL may be formed.

In addition, by the above-described process, the contact holes CH respectively exposing a portion of the scan line Si, a portion of the control line CLi, a portion of the initialization power line IPL, and a portion of each of the first to third gate electrodes GE1 to GE3 included in the second conductive layer CL2 may be formed.

The interlayer insulating layer ILD is formed on one surface, for example, an upper surface of each of the light emitting elements LD in the emission area EMA included in the second area A2 of the pixel area PXA. Accordingly, both end portions of each of the light emitting elements LD may be exposed to the outside.

By the above-described process, the interlayer insulating layer ILD positioned in the first area A1 of the pixel area PXA and the interlayer insulating layer ILD positioned on the light emitting elements LD in the second area A2 may be formed by the same process.

By removing a portion of the conductive pattern CP or a portion of the first electrode EL1 included in the first conductive layer CL1 to electrically separate the conductive pattern CP and the first electrode EL1, the corresponding pixel PXL may be independently (or separately) driven from the pixels PXL adjacent thereto through a process of forming the interlayer insulating layer ILD or an etching process performed before and after it.

Referring to FIG. 1 to FIG. 5, FIG. 7, FIG. 8, and FIG. 11A to FIG. 11G, the third conductive layer CL3 is formed on the interlayer insulating layer ILD.

The third conductive layer CL3 may include the first to fifth connection wires CNL1 to CNL5, the upper electrode UE of the storage capacitor Cst, the data line Dj, the first and second power lines PL1 and PL2, the first to third fan-out lines FOL1 to FOL3, and the (1-1)-th to (3-1)-th pad electrodes PD1_1 to PD3_1.

Referring to FIG. 1 to FIG. 5, FIG. 7, FIG. 8, and FIG. 11A to FIG. 11H, the fourth conductive layer CL4 is formed in the pixel area PXA and the non-display area NDA.

The fourth conductive layer CL4 of the non-display area NDA may include the (1-2)-th to (3-2)-th pad electrodes PD1_2 to PD3_2. The fourth conductive layer CL4 of the pixel area PXA may include the first and second contact electrodes CNE1 and CNE2 positioned in the emission area EMA.

Referring to FIG. 1 to FIG. 5, FIG. 7, FIG. 8, and FIG. 11A to FIG. 11I, the first insulating layer INS1 is formed on the fourth conductive layer CL4, and the light blocking layer LBL is formed thereon.

Figure 11A:
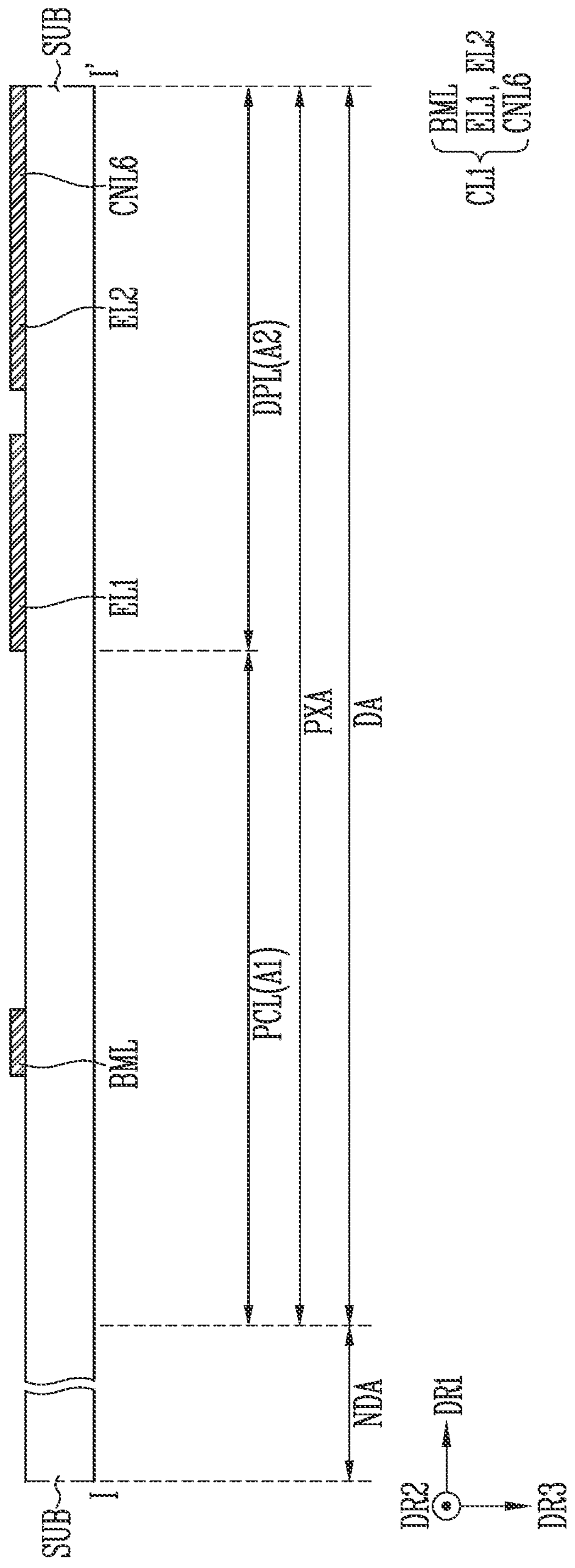
FIG. 11A to FIG. 11L sequentially illustrate schematic cross-sectional views of a manufacturing method of a display device illustrated in FIG. 8.
Figure 11B:
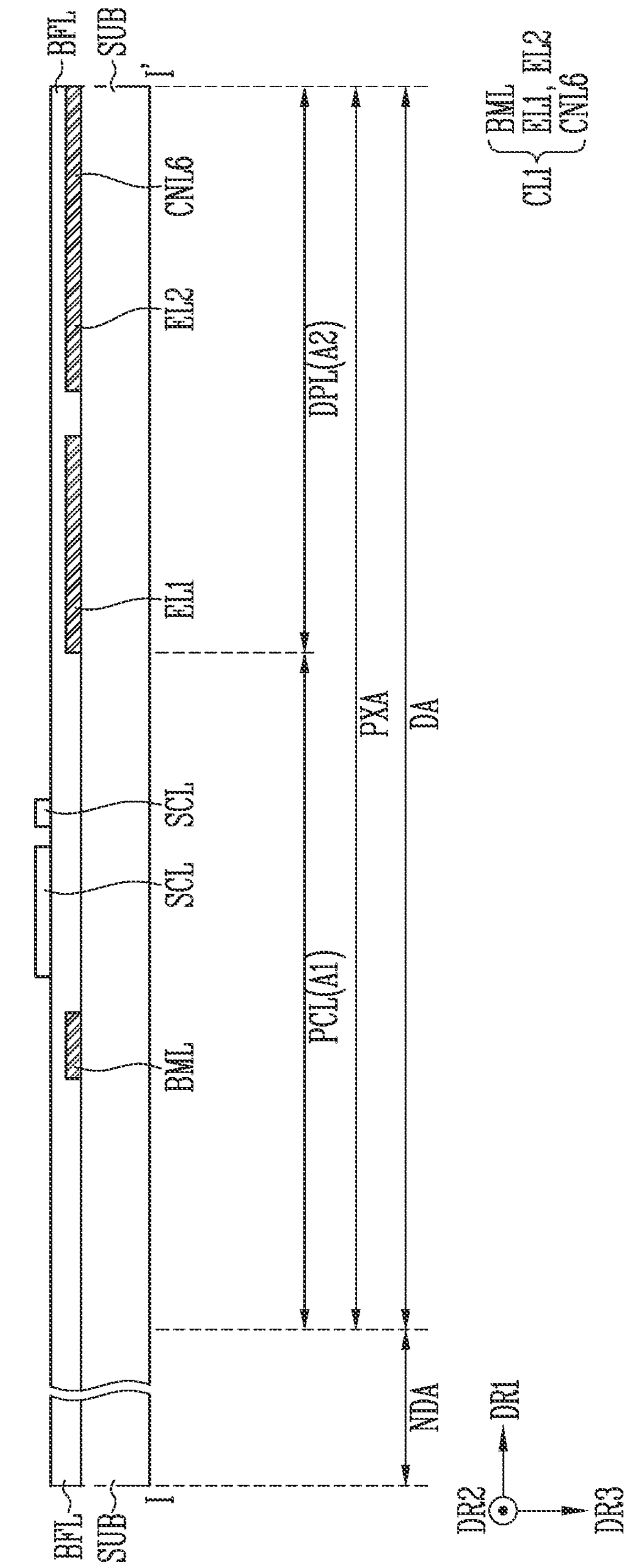
Figure 11C:
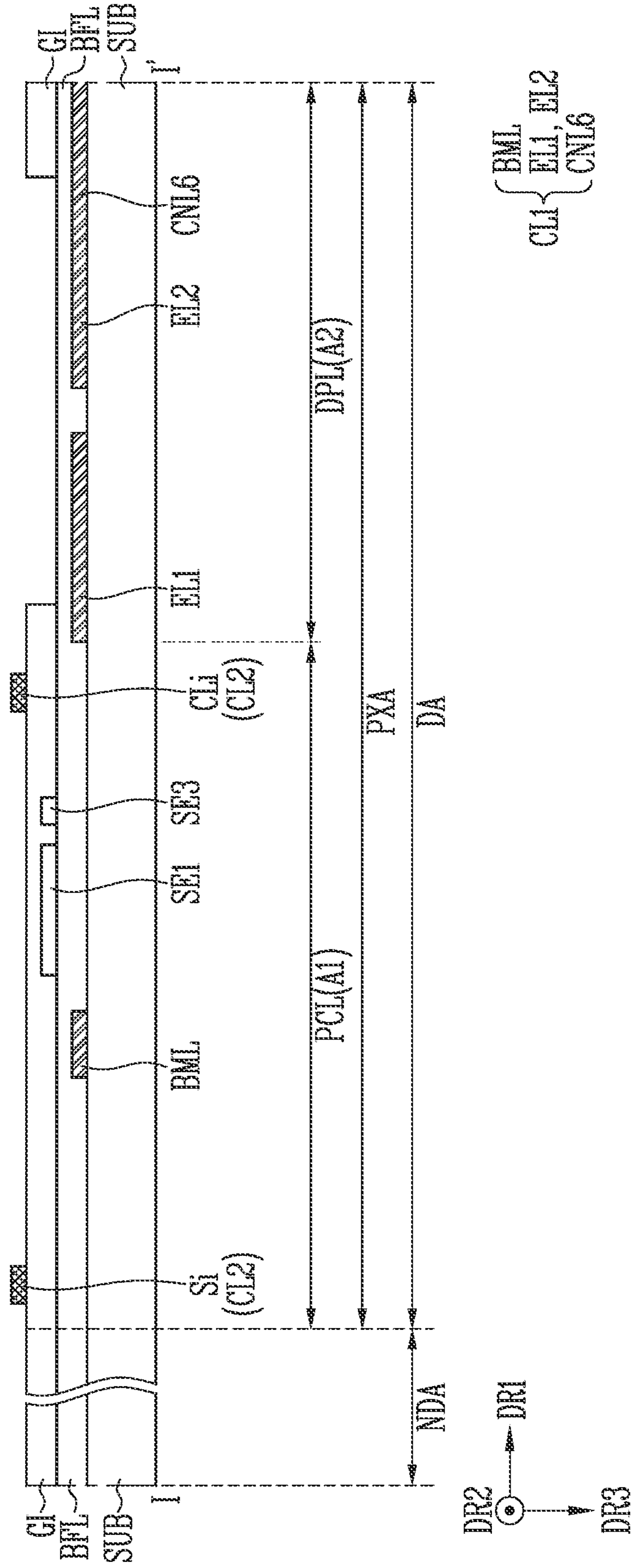
Figure 11D:
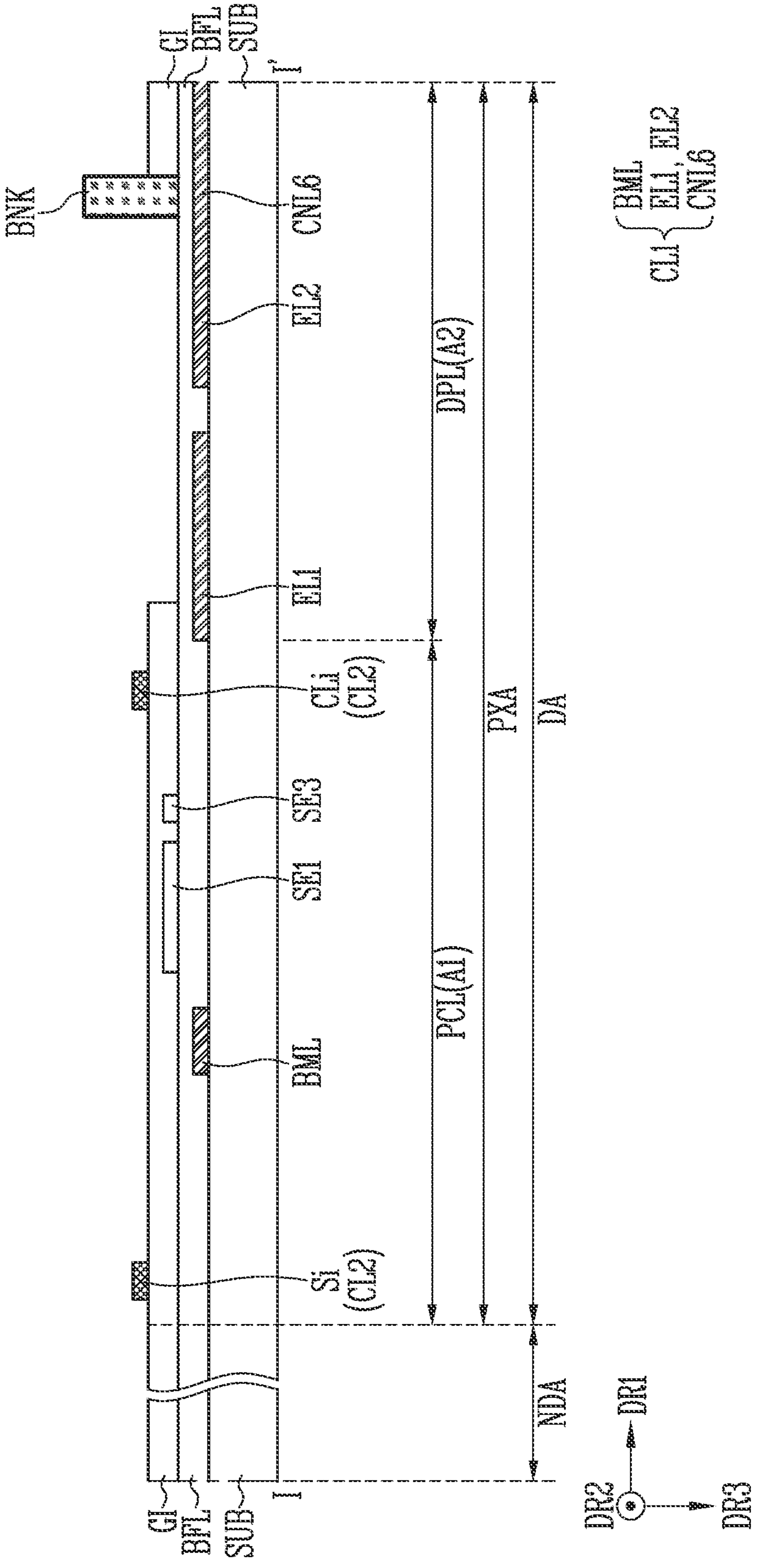
Figure 11E:
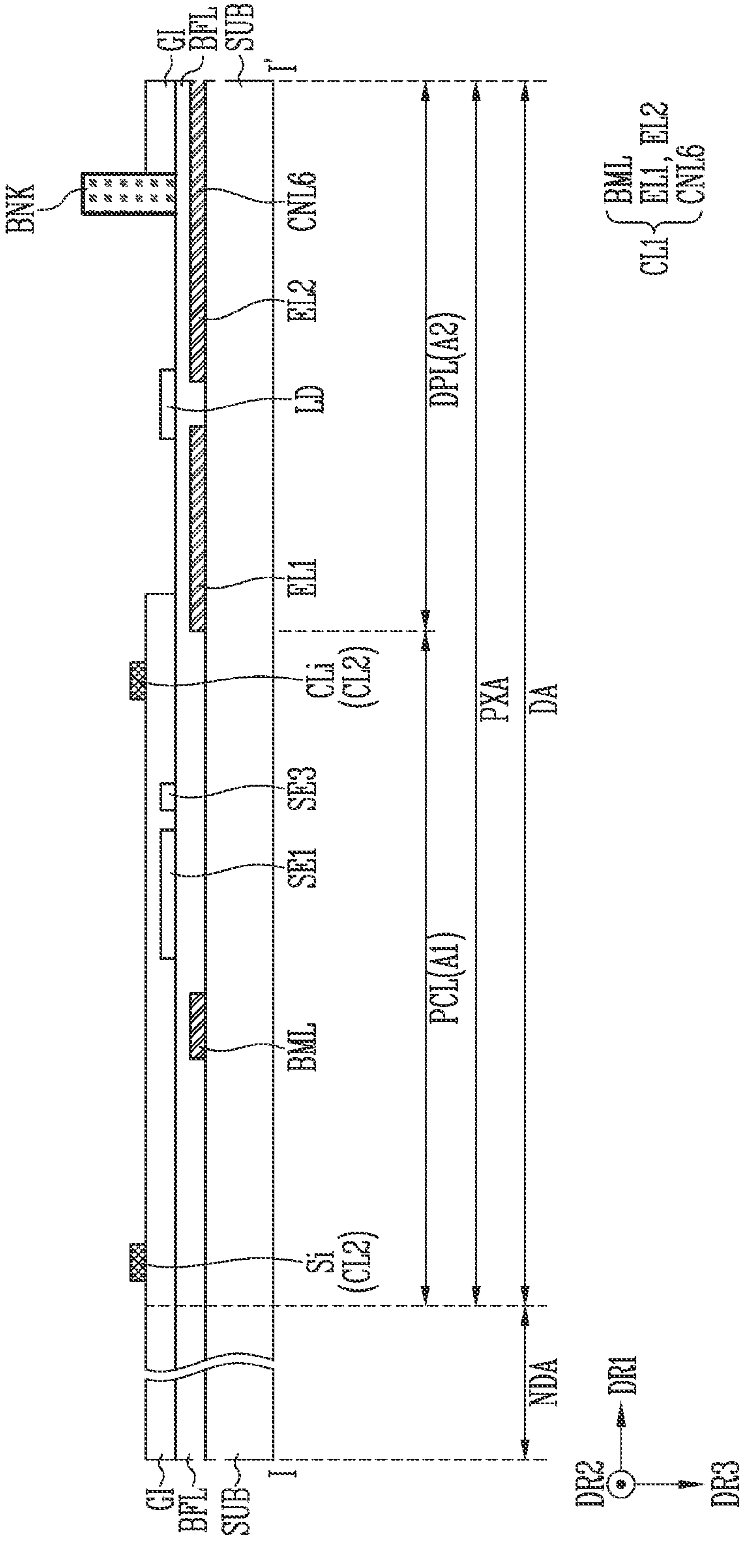
Figure 11F:
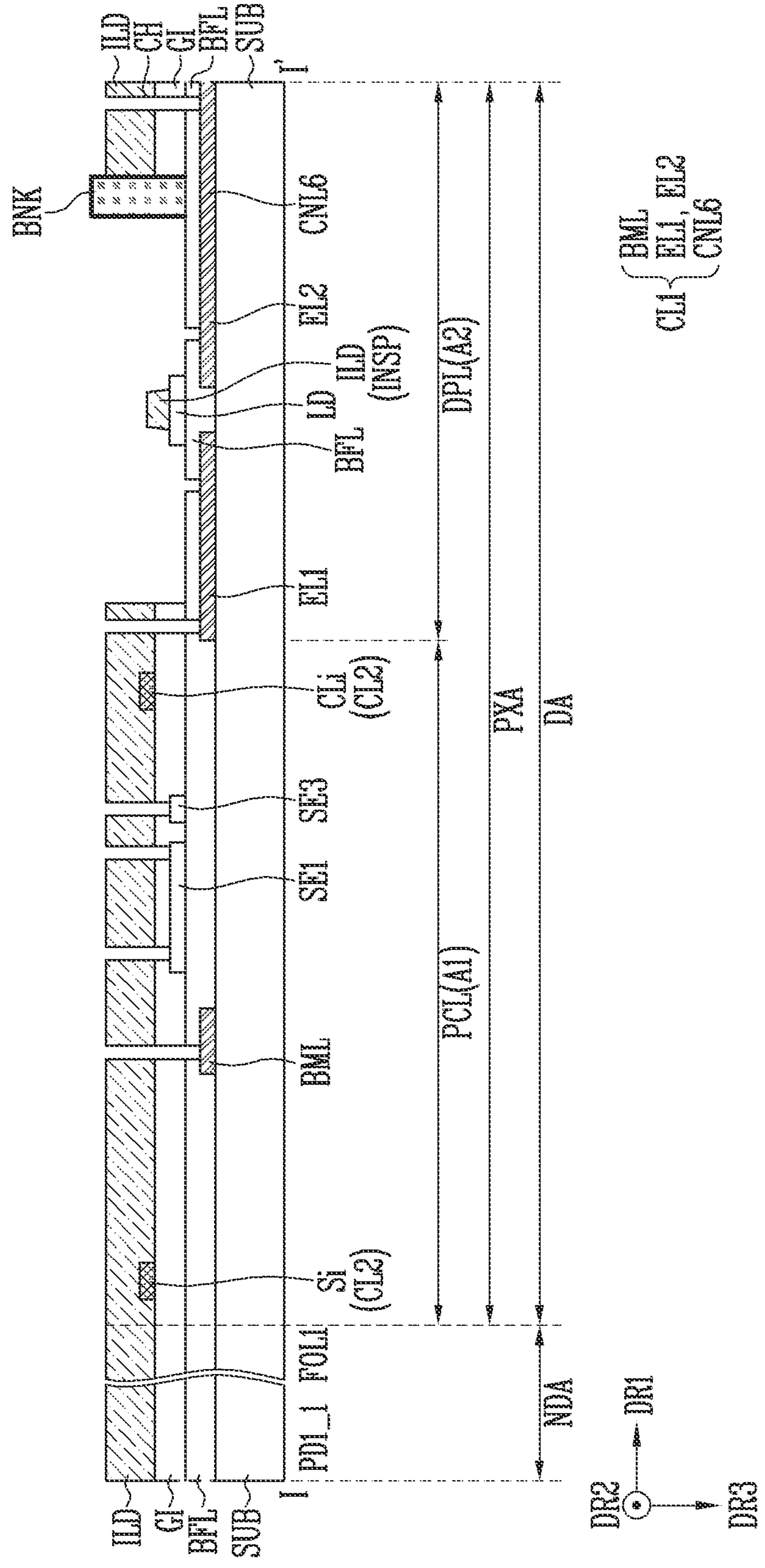
Figure 11G:
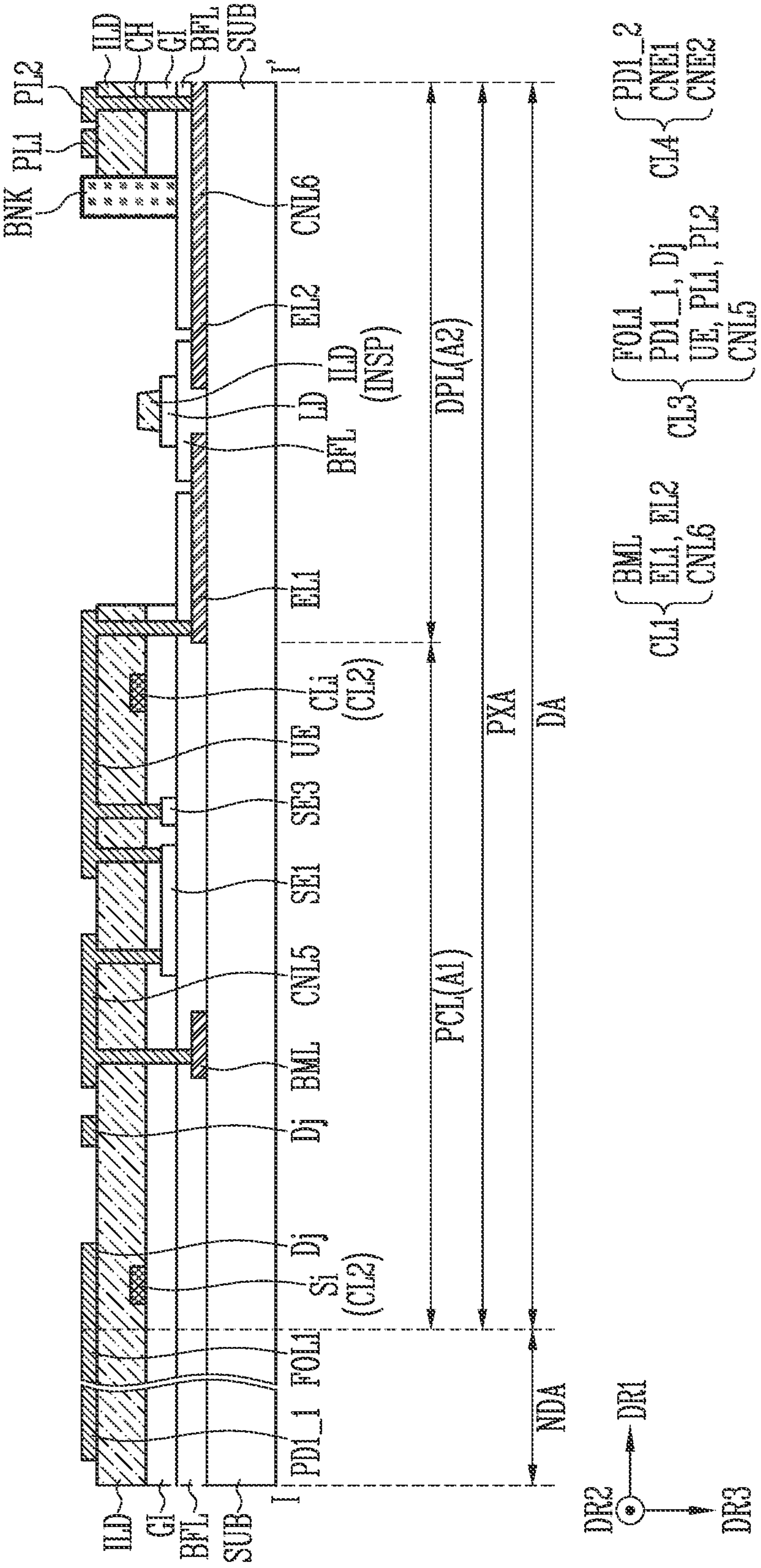
Figure 11H:
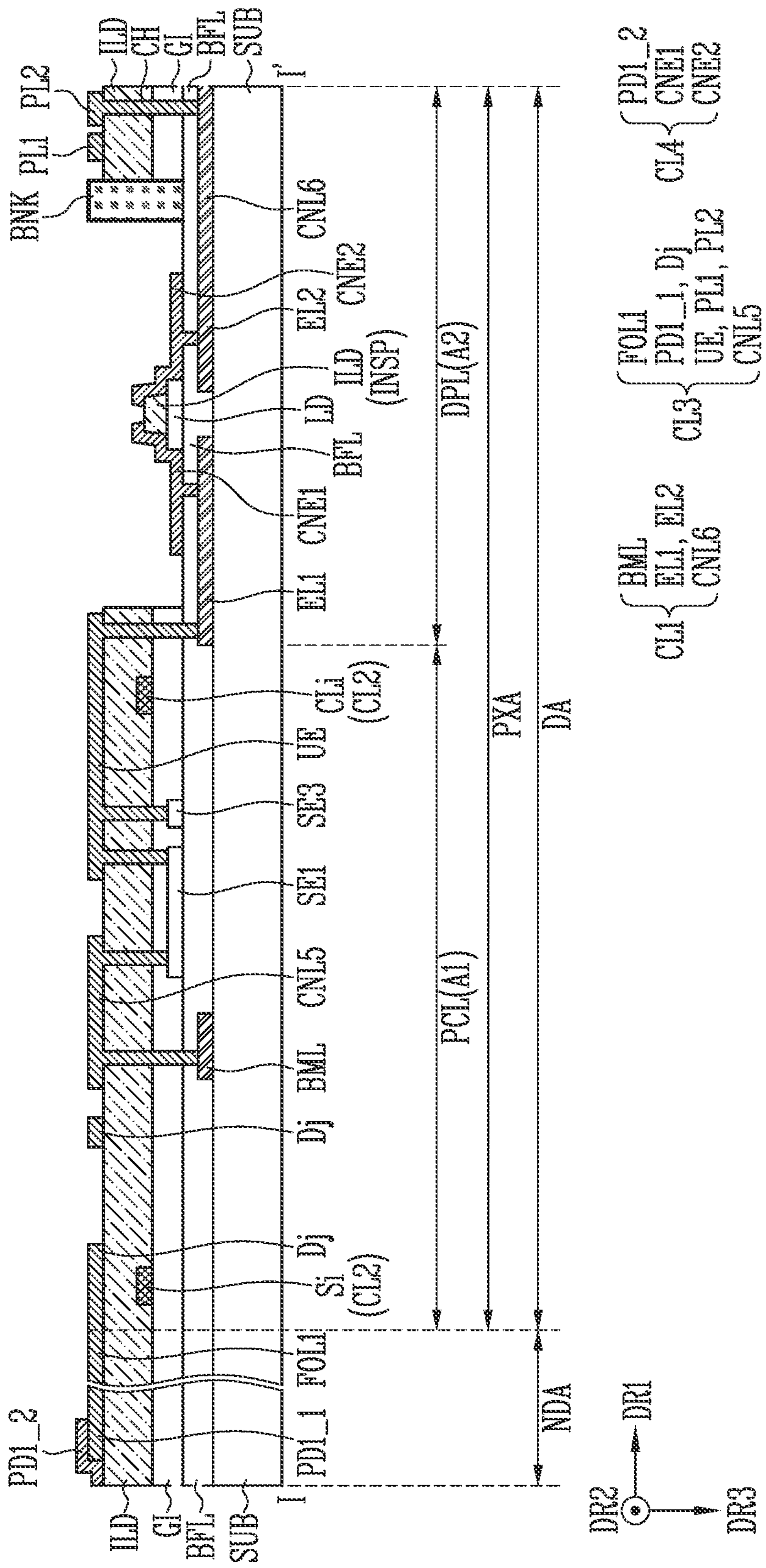
Figure 11I:
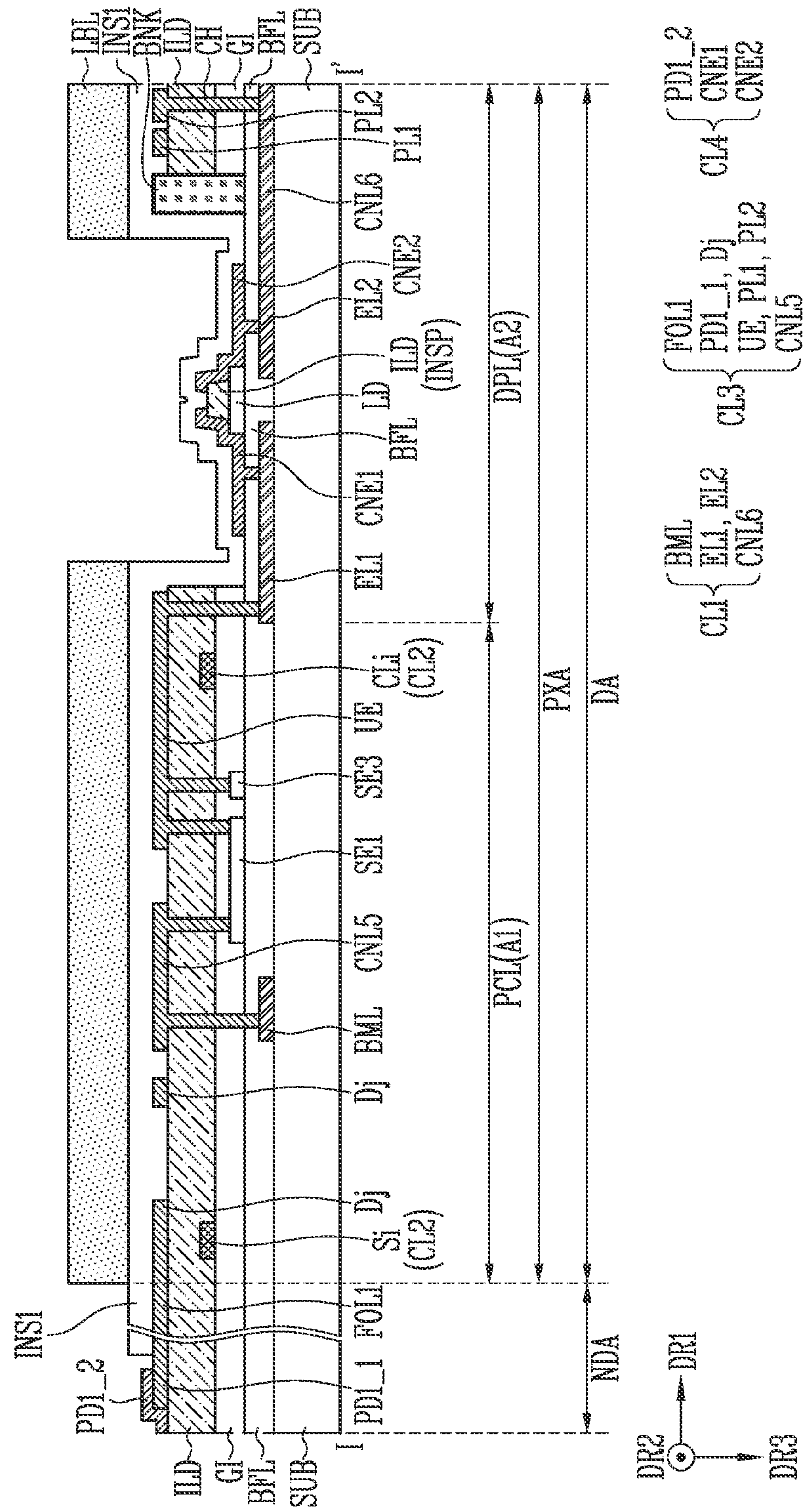
Figure 11J:
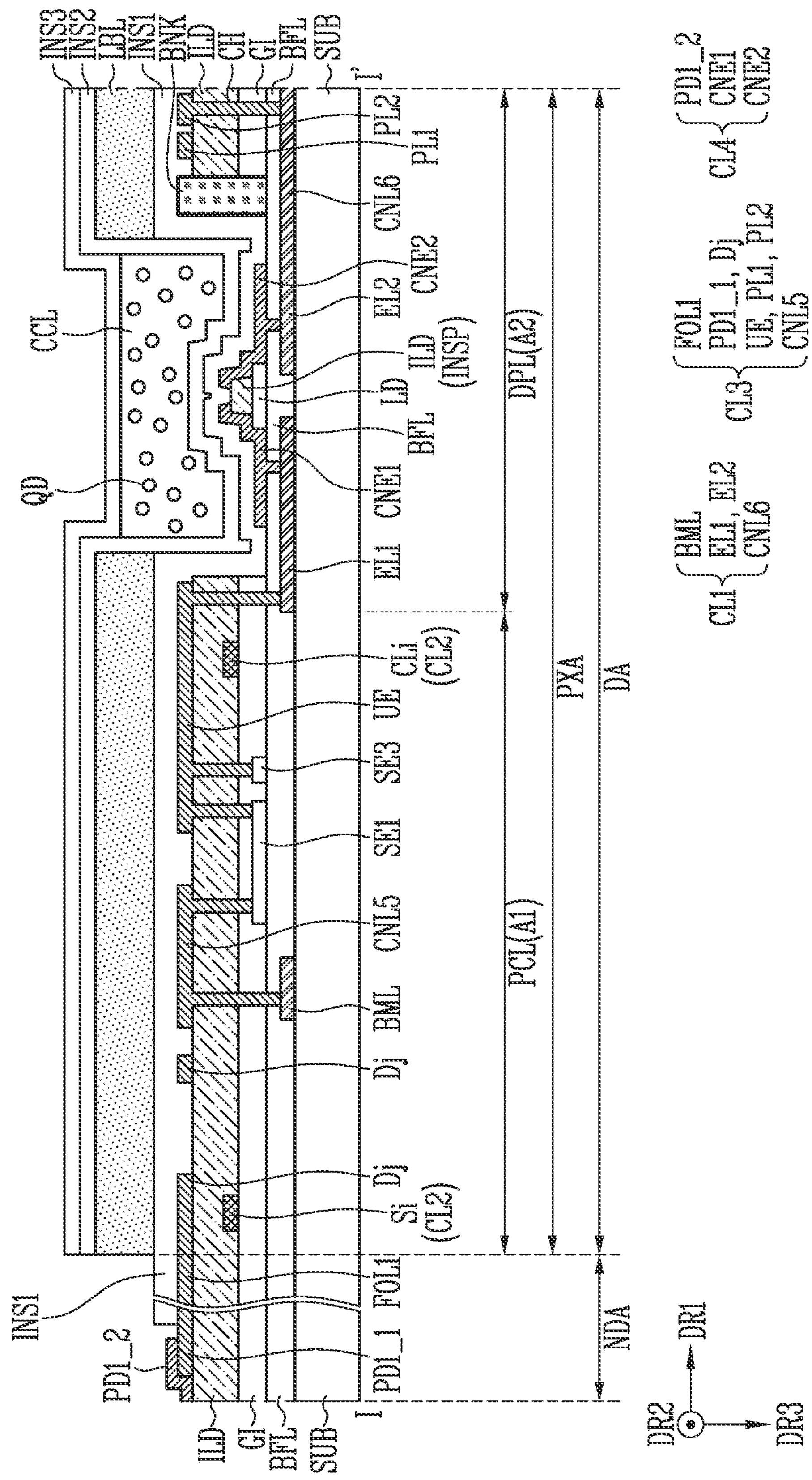
Figure 11K:
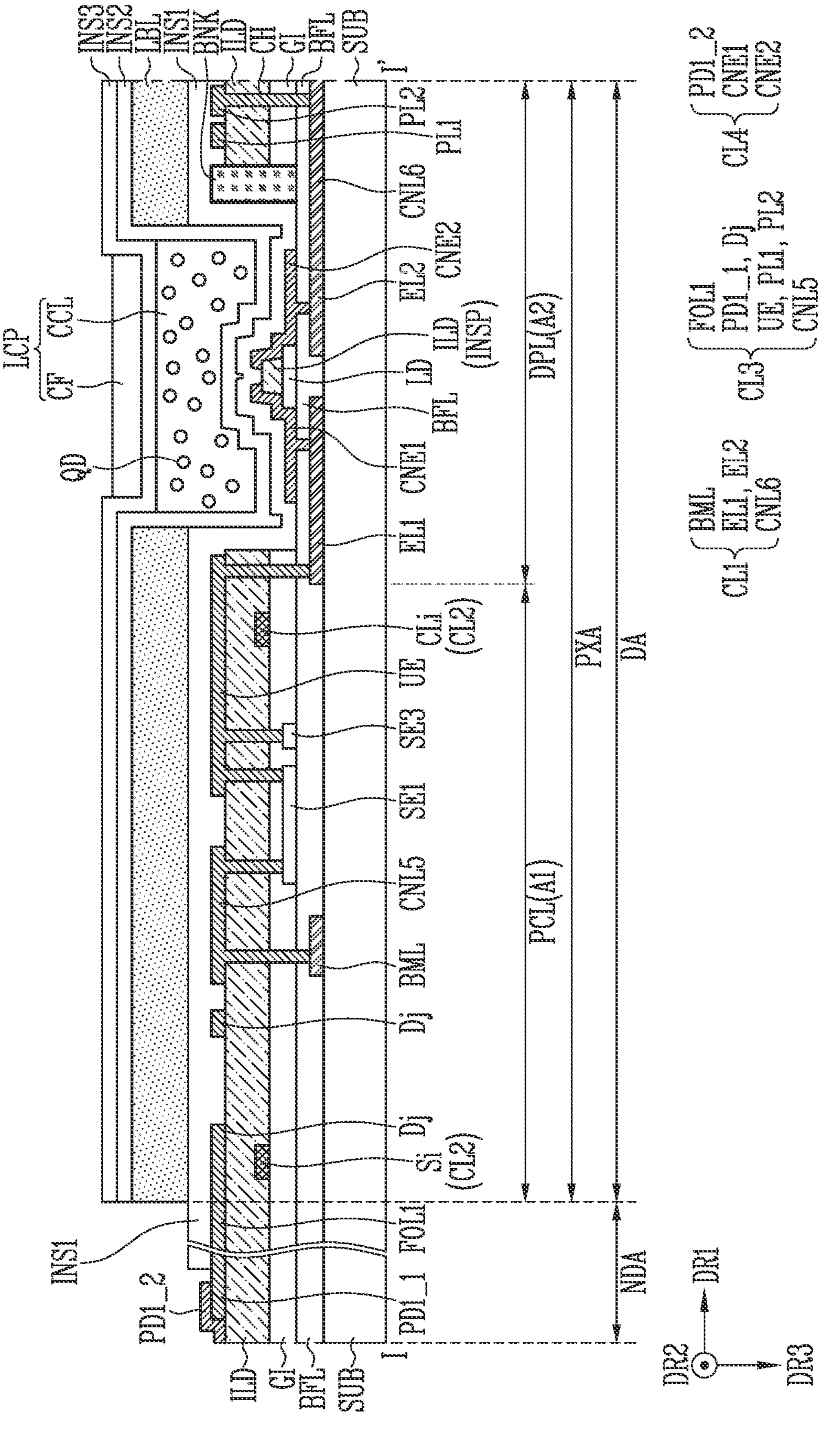
Figure 11L:
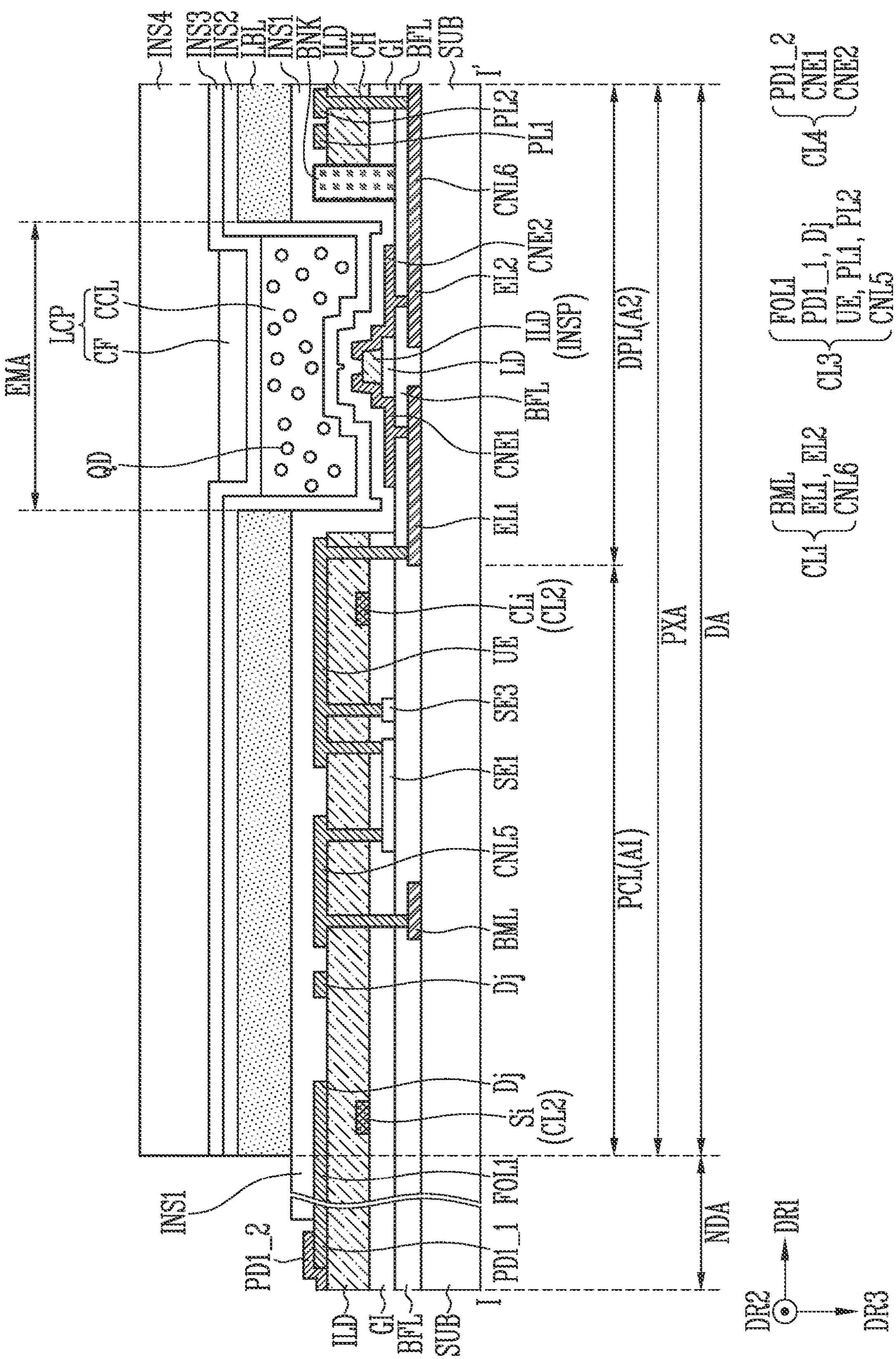

The first insulating layer INS1 may be provided only in the first and second areas A1 and A2 of the pixel area PXA, and may not be provided in the non-display area NDA. However, as shown in FIG. 11I, in one or more embodiments, the first insulating layer INS1 may be provided in the non-display area NDA.

The light blocking layer LBL may be provided on the first insulating layer INS1 of the first area A1 of the pixel area PXA. In addition, the light blocking layer LBL may be provided on the first insulating layer INS1 of the non-emission area (refer to "NEMA" in FIG. 9) in the second area A2 of the pixel area PXA.

Referring to FIG. 1 to FIG. 5, FIG. 7, FIG. 8, and FIG. 11A to FIG. 11J, the second insulating layer INS2 is formed on the light blocking layer LBL and the first insulating layer INS1.

Next, the color converting layer CCL including the color converting particles QD is formed on the second insulating layer INS2. The color converting layer CCL may be provided on the second insulating layer INS2 of the second area A2 to correspond to the emission area EMA of the pixel area PXA.

The third insulating layer INS3 is formed on the second insulating layer INS2 including the color converting layer CCL.

Referring to FIG. 1 to FIG. 5, FIG. 7, FIG. 8, and FIG. 11A to FIG. 11K, the color filter CF is formed on the third insulating layer INS3 on the color converting layer CCL. The color filter CF may be provided on one area of the third insulating layer INS3 to correspond to the color converting layer CCL.

Referring to FIG. 1 to FIG. 5, FIG. 7, FIG. 8, and FIG. 11A to FIG. 11L, the fourth insulating layer INS4 is formed on the third insulating layer INS3. The fourth insulating layer INS4 may be provided only in the pixel area PXA.

While the present disclosure has been shown and described with reference to certain embodiments thereof, it will be understood by those skilled in the art that various changes in forms and details may be made therein without departing from the spirit and scope of the present disclosure as defined by the appended claims and their equivalents.

Therefore, the technical scope of the present disclosure may be determined by on the technical scope of the accompanying claims and their equivalents.

The invention claimed is:

1. A display device comprising:

a substrate including a pixel area including a first area and a second area; and a pixel in each of the pixel area, wherein the pixel comprises:

a pixel circuit part in the first area, the pixel circuit part comprising a bottom metal layer on the substrate, at least one transistor on the bottom metal layer, and an interlayer insulating layer on the transistor; and a display element part in the second area, the display element part comprising a plurality of light emitting elements to emit light, an insulating pattern on the plurality of light emitting elements, and a bank adjacent to the plurality of light emitting elements, wherein the interlayer insulating layer and the insulating pattern comprise a same material, wherein the bank is entirely spaced from the plurality of light emitting elements and the pixel circuit part in a direction perpendicular to a thickness direction of the substrate; and wherein the plurality of light emitting elements and the bank are located on a same layer and are coplanar;

wherein each of the pixel circuit part and the display element part comprises a multilayer structure comprising at least one conductive layer and at least one insulating layer, and at least one layer of the pixel circuit part and at least one layer of the display element part are at a same layer and comprise a same material;

wherein:

the insulating layer in the pixel circuit part comprises a buffer layer, a gate insulating layer, the interlayer insulating layer, and a first insulating layer that are sequentially arranged on the substrate;

the insulating layer in the display element part comprises the buffer layer on the substrate, the insulating pattern on the buffer layer, and the first insulating layer on the insulating pattern;

the conductive layer in the pixel circuit part comprises the bottom metal layer between the substrate and the buffer layer, a first conductive layer between the gate insulating layer and the interlayer insulating layer, and a second conductive layer between the interlayer insulating layer and the first insulating layer; and the conductive layer in the display element part comprises a first electrode and a second electrode that are between the substrate and the buffer layer and are spaced from each other, and a first contact electrode and a second contact electrode spaced from each other on the insulating pattern.

2. The display device of claim 1, wherein the plurality of light emitting elements is on the buffer layer between the first electrode and the second electrode.

3. The display device of claim 1, wherein the bottom metal layer and the first and second electrodes are at a same layer, and comprise a same material.

4. The display device of claim 1, wherein:

the second area comprises an emission area from which the light is emitted; and the bank does not overlap the emission area, is the bank being between the buffer layer and the first insulating layer.

5. The display device of claim 4, wherein
when viewed in a plan view, the bank is around the plurality of light emitting elements.

6. The display device of claim 4, wherein
the buffer layer of the display element part exposes a portion of each of the first and second electrodes.

7. The display device of claim 6, wherein:
the first contact electrode is on the buffer layer and connected to the first electrode and each of the plurality of light emitting elements;
the second contact electrode is on the buffer layer and connected to the second electrode and each of the plurality of light emitting elements; and
the first insulating layer is on the first and second contact electrodes to cover the first and second contact electrodes.

8. The display device of claim 7, wherein:
the substrate includes a display area in which the pixel area is located and a non-display area at least one side of the display area; and
the non-display area comprises the buffer layer, the gate insulating layer, the interlayer insulating layer, a wire part on the interlayer insulating layer, and a pad part connected to the wire part,
wherein the pad part comprises:
a first pad electrode on the interlayer insulating layer; and
a second pad electrode on the first pad electrode and in contact with the first pad electrode.

9. The display device of claim 8, wherein
the second pad electrode comprises a same material as the first and second contact electrodes.

10. The display device of claim 9, further comprising
a light blocking layer on the first insulating layer in each of the first and second areas.

11. The display device of claim 10, wherein
the light blocking layer comprises a black matrix, and is not located in the emission area of the second area.

12. The display device of claim 10, further comprising:
a second insulating layer on the first insulating layer on the first and second contact electrodes and on the light blocking layer; and
a light converting pattern layer in the emission area of the second area and on the second insulating layer.

13. The display device of claim 12, further comprising
a planarization layer on the light converting pattern layer.

14. The display device of claim 12, wherein:
the transistor comprises:
an active pattern on the buffer layer on the bottom metal layer;
a gate electrode on the gate insulating layer on the active pattern and overlapping the active pattern; and
a first terminal and a second terminal contacting respective ends of the active pattern
wherein the first conductive layer comprises the gate electrode.

* * * * *